United States Patent [19]

Oshida et al.

[11] Patent Number: 6,094,268
[45] Date of Patent: Jul. 25, 2000

[54] PROJECTION EXPOSURE APPARATUS AND PROJECTION EXPOSURE METHOD

[75] Inventors: Yoshitada Oshida, Fujisawa; Tetsuzo Tanimoto; Minoru Tanaka, both of Yokohama, all of Japan

[73] Assignee: Hitachi, Ltd., Tokyo, Japan

[21] Appl. No.: 08/315,841

[22] Filed: Sep. 30, 1994

Related U.S. Application Data

[62] Continuation of application No. 08/039,578, Mar. 25, 1993, abandoned, which is a division of application No. 07/623,438, filed as application No. PCT/JP90/00520, Apr. 20, 1990, Pat. No. 5,227,862.

[30] Foreign Application Priority Data

| Apr. 21, 1989 | [JP] | Japan | 1-100025 |
|---|---|---|---|
| Apr. 21, 1989 | [JP] | Japan | 1-100026 |
| Sep. 27, 1989 | [JP] | Japan | 1-249123 |
| Oct. 3, 1989 | [JP] | Japan | 1-257033 |
| Feb. 28, 1990 | [JP] | Japan | 2-45387 |
| Mar. 16, 1990 | [JP] | Japan | 2-64155 |

[51] Int. Cl.$^7$ .................................................. G01B 11/14
[52] U.S. Cl. ..................... 356/375; 356/400; 356/363; 250/559.3; 250/548
[58] Field of Search ............................ 356/345, 349, 356/351, 358, 363, 372, 364–369, 373, 375, 399, 400, 445, 1, 152, 141; 250/201.6, 201.3, 201.4, 548, 559, 560, 561, 306, 311

[56] References Cited

U.S. PATENT DOCUMENTS

| 2,911,880 | 11/1959 | Rantsch . | |
|---|---|---|---|
| 3,601,490 | 8/1971 | Erickson . | |
| 4,013,366 | 3/1977 | Philbert . | |
| 4,207,467 | 6/1980 | Doyle | 356/445 |
| 4,356,392 | 10/1982 | Wittekoek et al. | 250/561 |
| 4,558,949 | 12/1985 | Uehara et al. | 356/400 |
| 4,626,103 | 12/1986 | Feldman et al. . | |
| 4,704,020 | 11/1987 | Nurakami et al. | 353/122 |
| 4,704,033 | 11/1987 | Fay et al. . | |
| 4,744,659 | 5/1988 | Kitabayashi . | |
| 4,866,262 | 9/1989 | Van der Werg et al. | 356/4 |
| 4,902,900 | 2/1990 | Kamiya et al. | 356/400 |
| 5,118,957 | 6/1992 | Kawashima et al. | 356/394 |
| 5,124,562 | 6/1992 | Kawashima et al. | 356/375 |
| 5,162,642 | 11/1992 | Akamatsu et al. | 356/376 |
| 5,216,235 | 6/1993 | Lin | 356/375 |
| 5,218,415 | 6/1993 | Kawashima | 356/375 |

FOREIGN PATENT DOCUMENTS

| 2 445 512 | 7/1980 | France . |
|---|---|---|
| 60-136311 | 7/1985 | Japan . |
| 61-74338 | 4/1986 | Japan . |
| 63-299329 | 12/1988 | Japan . |
| 2 052 090 | 1/1981 | United Kingdom . |

OTHER PUBLICATIONS

IBM Technical Disclosure Bulletin, vol. 24, No. 1B, Jun. 1981, pp. 541–542, "Evaluation of sinusoidally varying light signals".

Soviet Patent Abstracts, Mar. 29, 1989, p. 11, AN=89–052538107, Derwent Pub., London, GB; and SU–A–1413 547 (Voron Poly (NYVO)) Jul. 30, 1988.

*Primary Examiner*—Hoa Q. Pham
*Attorney, Agent, or Firm*—Antonelli, Terry, Stout & Kraus, LLP

[57] ABSTRACT

A projection exposure apparatus (1) comprises an incident light optical system for causing the light emitted from a light source 1 to enter an object of exposure (4) in diagonal direction, a detection apparatus (3) for causing an interference between the light reflected from the object of exposure (4) and a reference light and detecting the resultant interference fringe, a processing circuit for determining the inclination and height of the surface of the object of exposure (4) from the optical information on the interference fringe, and a stage (7) for supporting the object of exposure (4). The object of exposure (4) is subjected to projection exposure by driving the stage (7) according to the calculated inclination and height of the object of exposure (4).

23 Claims, 47 Drawing Sheets

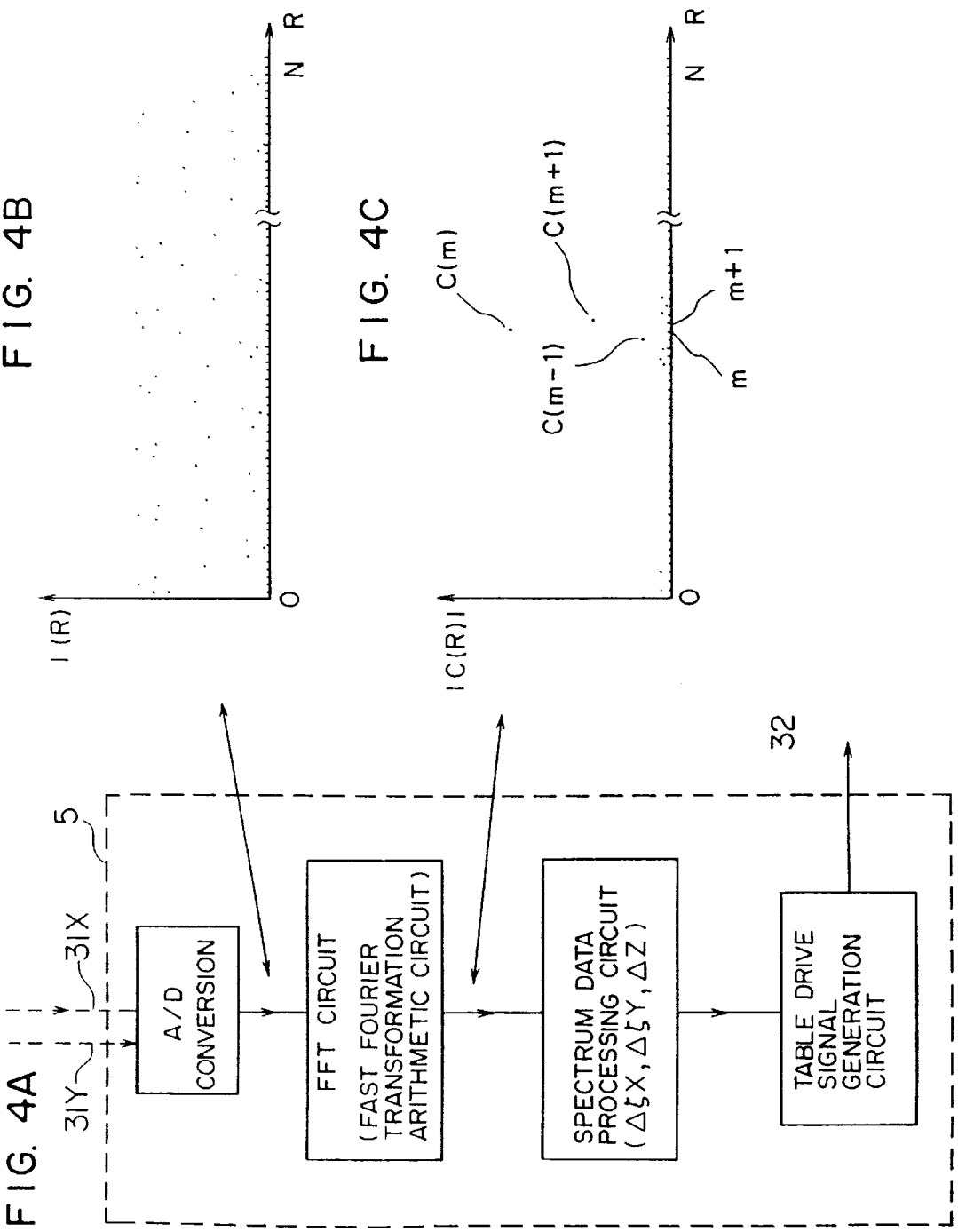

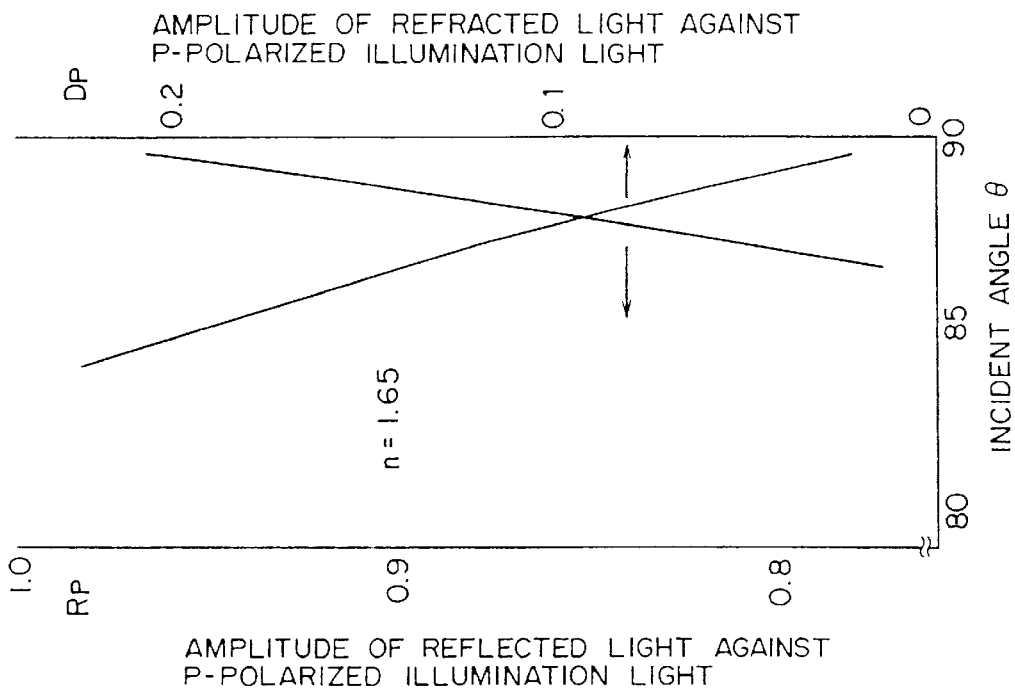
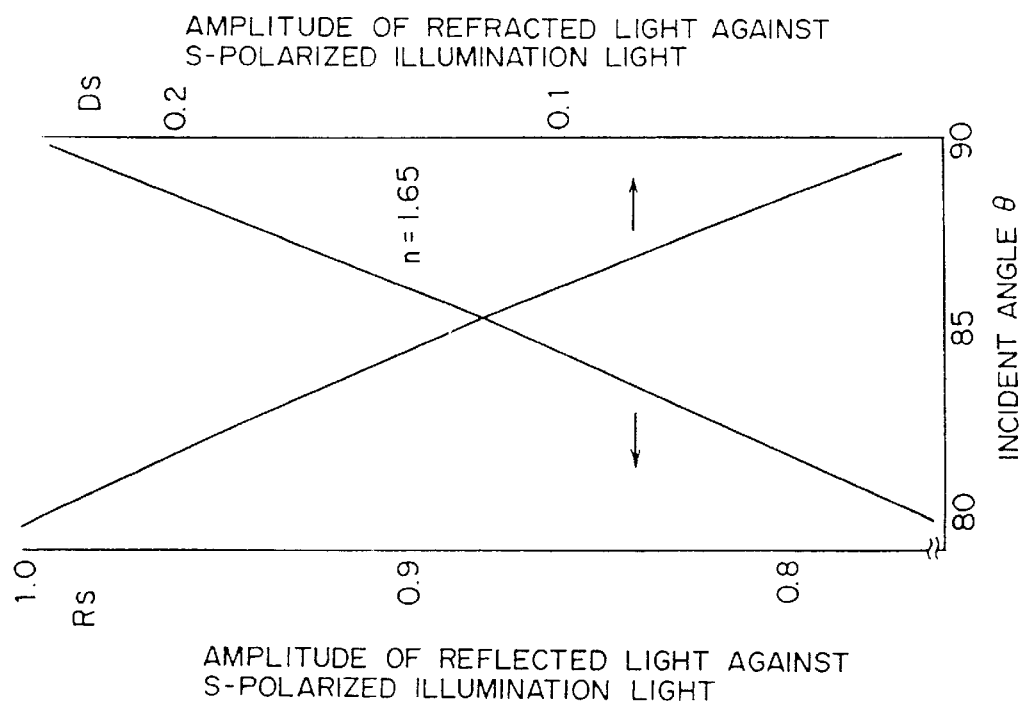

F I G. 17
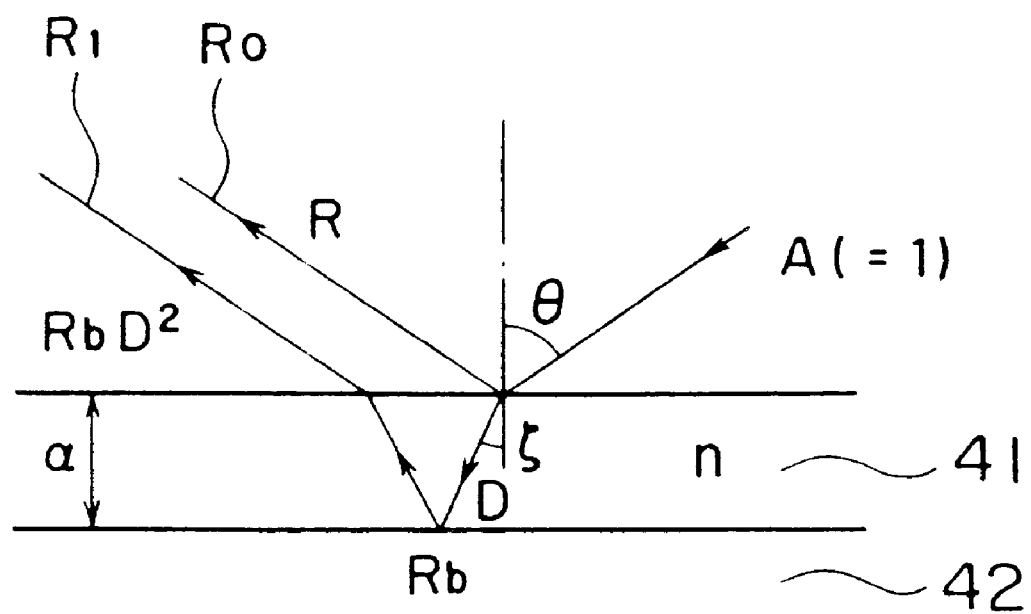

F I G. 25
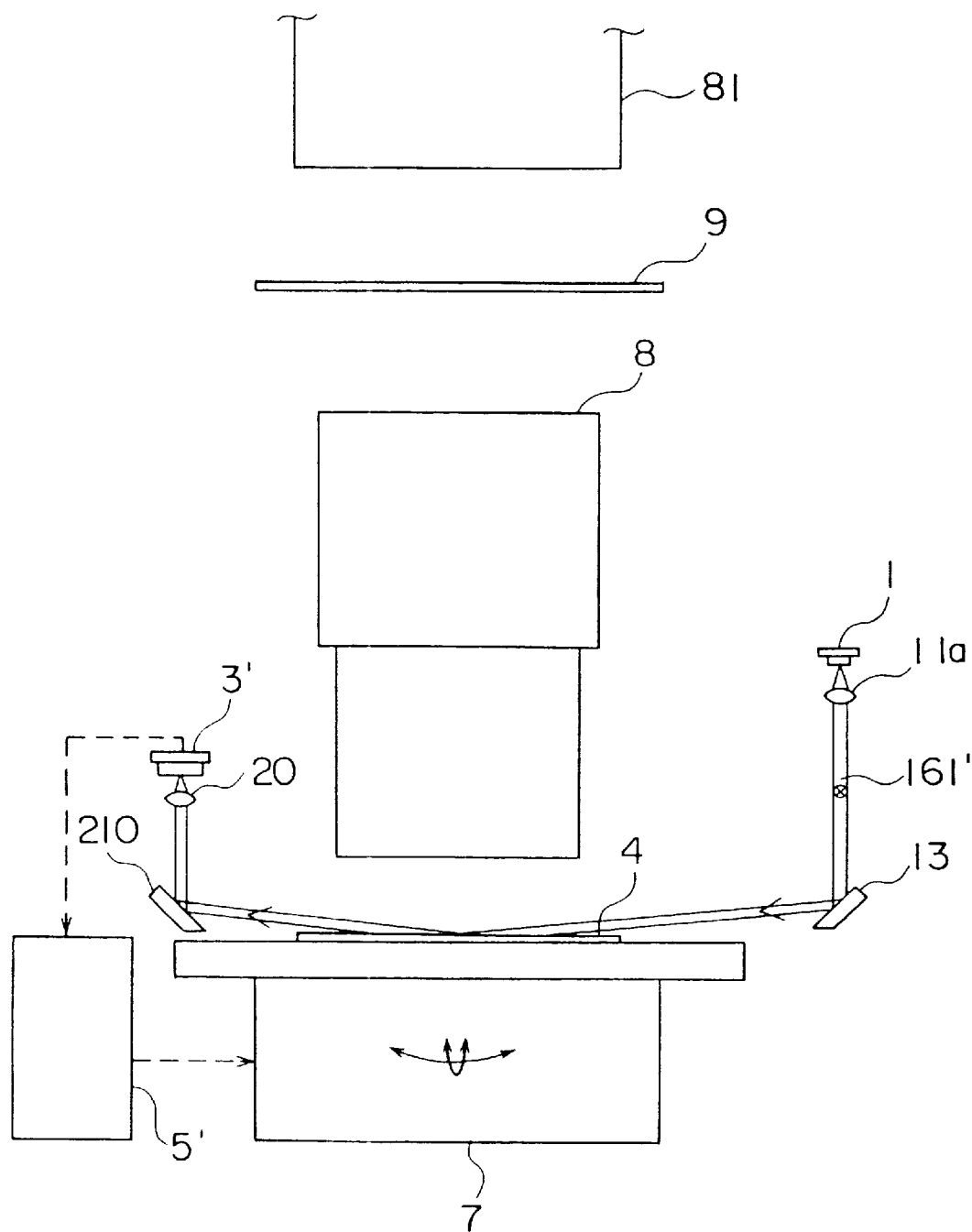

F I G. 36
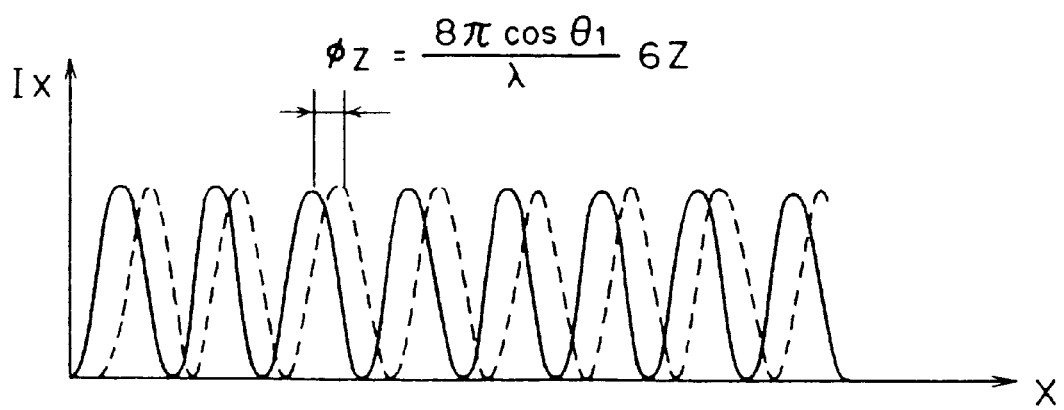

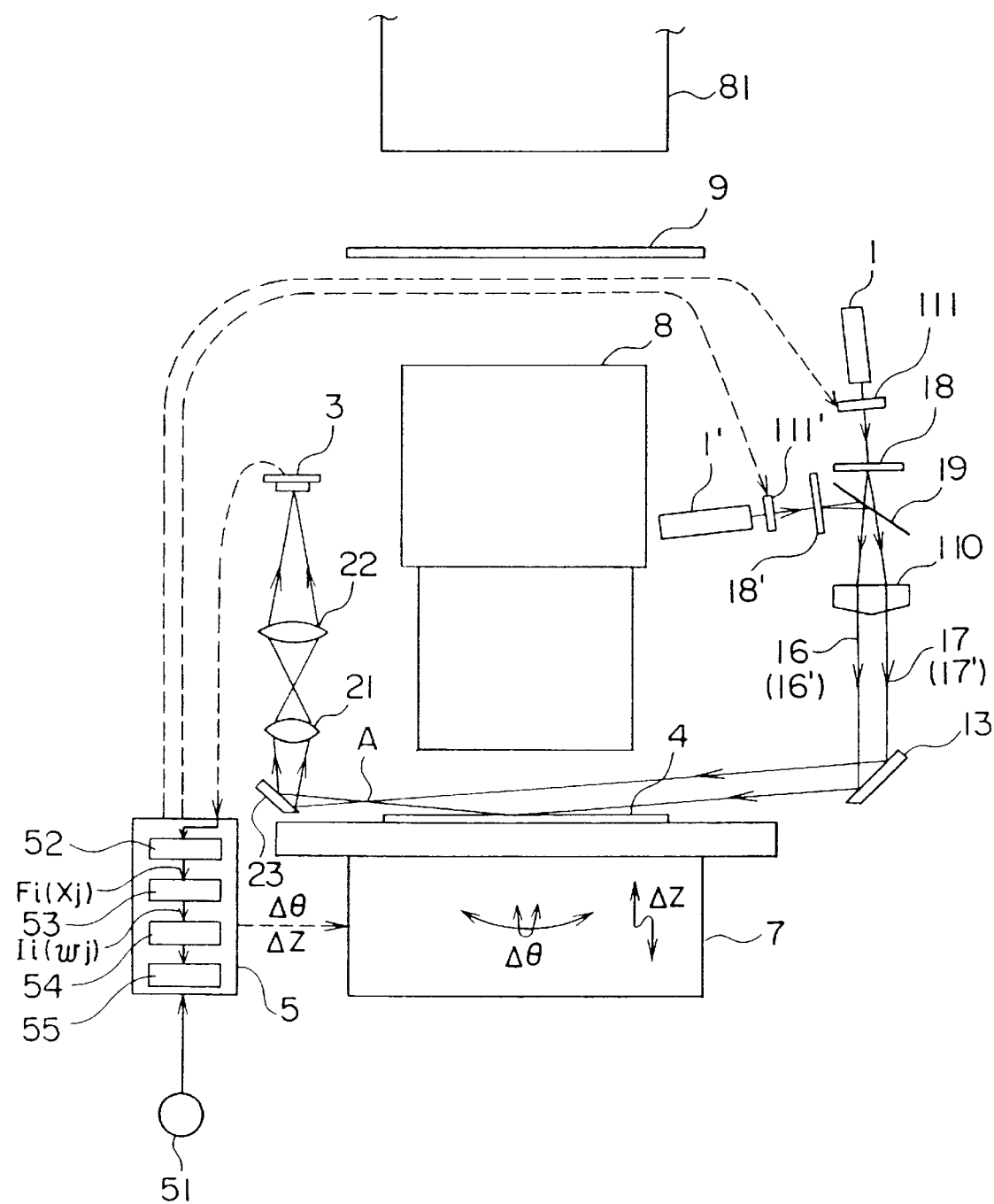
F I G. 37

INCIDENT ANGLE AND HEIGHT CHANGE
BY INTERFERENCE PITCH
(LASER WAVELENGTH 0.6328 μm)

FIG. 44A RESIST THICKNESS CHANGE AND DETECTION AGAINST Aℓ BASE
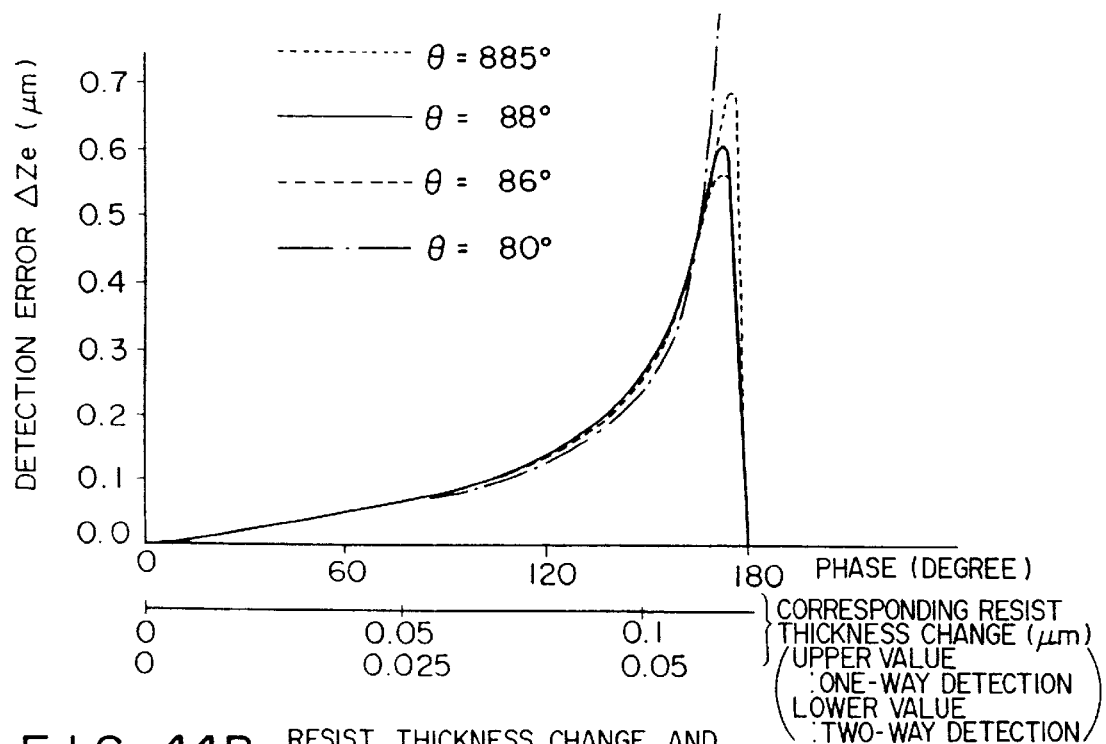
CORRESPONDING RESIST THICKNESS CHANGE (μm)
(UPPER VALUE : ONE-WAY DETECTION
LOWER VALUE : TWO-WAY DETECTION)
FIG. 44B RESIST THICKNESS CHANGE AND PHASE OF REFLECTED LIGHT AGAINST Aℓ BASE
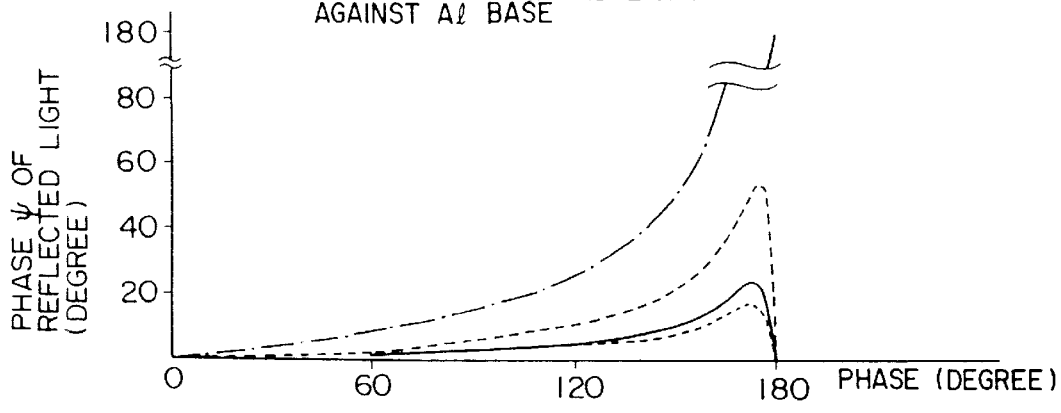
FIG. 44C RESIST THICKNESS CHANGE AND AMPLITUDE OF REFLECTED LIGHT AGAINST Aℓ BASE
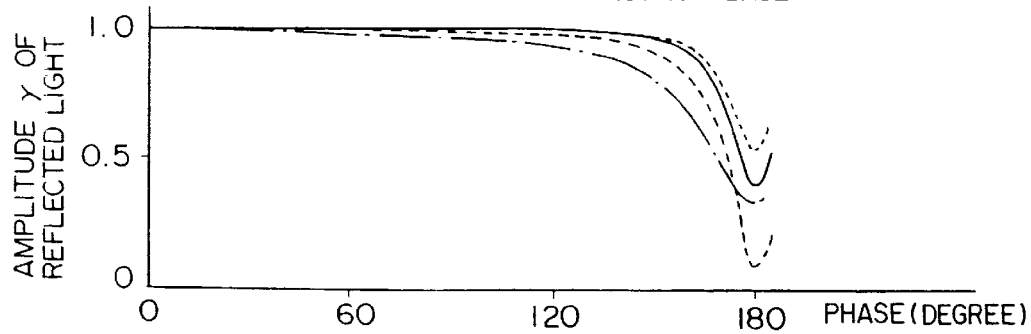

FIG. 47A
- DETECT BY $\lambda_i$ ($i=1,2$) AND A/D — 1060
- FFT OF DISCRETE DATA ON INTERFERENCE FRINGE $F_1(X_j), F_2(X_j)$ — 1061
- CALCULATE MAX INTERPOLATION OF FRINGE SPECTRUM $I_1(w'_1), I_2(w''_2)$ — 1062
- SET TO $i_0$ THE GREATER OF $I_1(w'_1)/I_1(w_0)$ AND $I_2(w''_2)/I_2(w_0)$ — 1063
- DETERMINE PHASE $\phi$ FOR $w'_{i_0}$ AGAINST $i = i_0$ — 1064
- (D)
- DETERMINE HEIGHT $\Delta Z$ AND INCLINATION $\Delta\theta$ FROM $w'_{i_0}$ AND $\phi$ — 1065
FIG. 47B
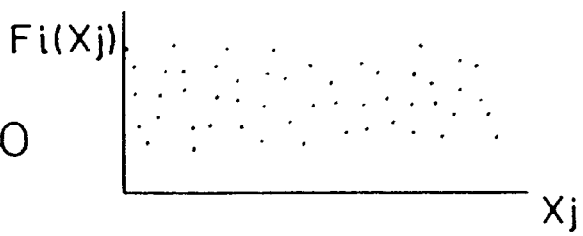
FIG. 47C
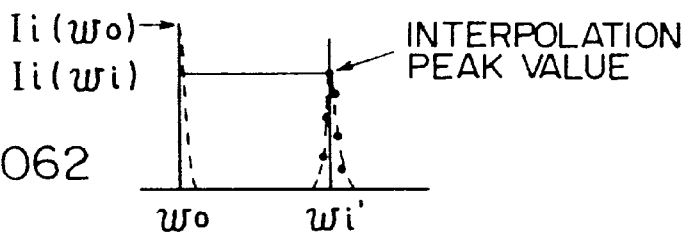
INTERPOLATION PEAK VALUE F I G. 48
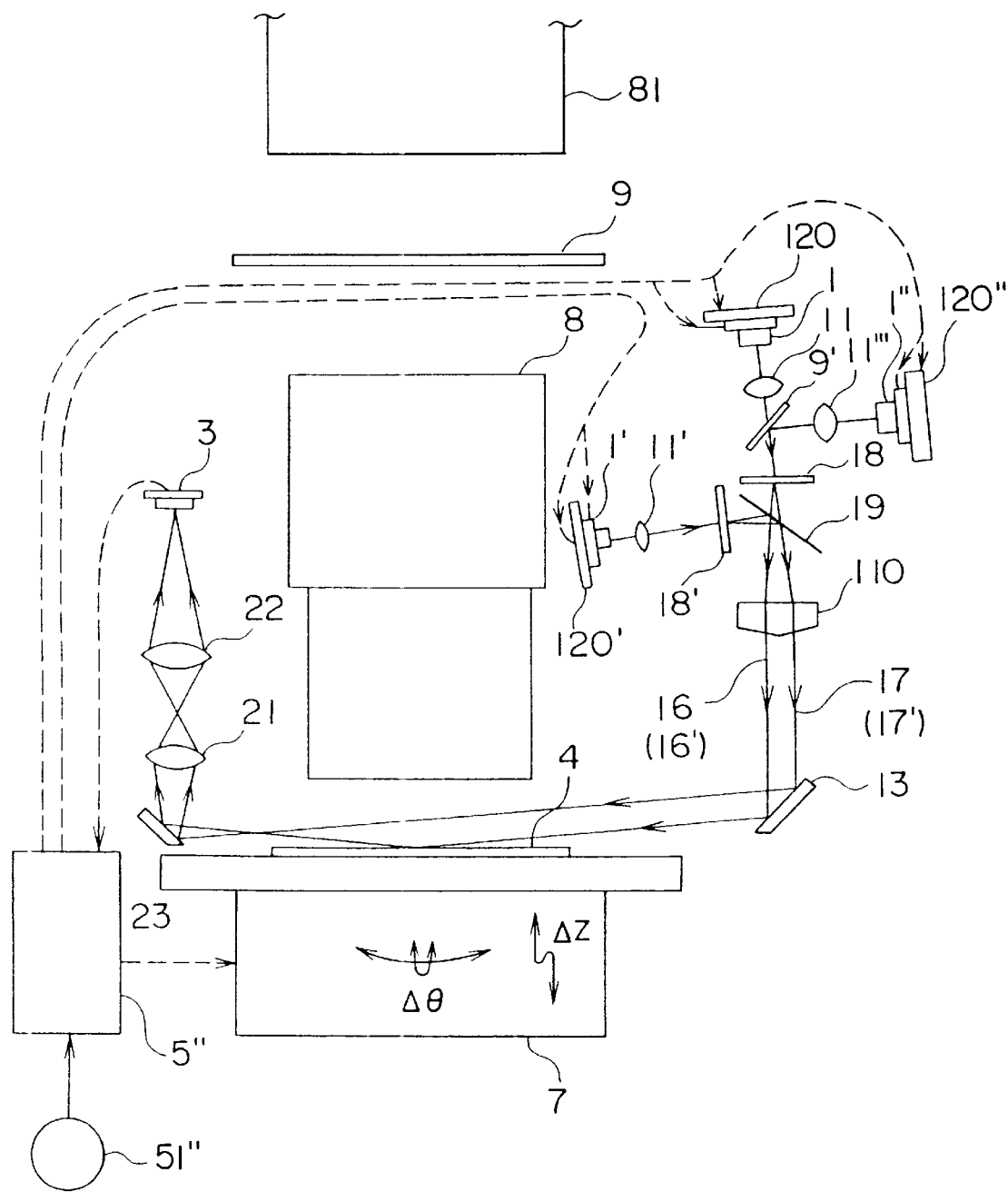

F I G. 50
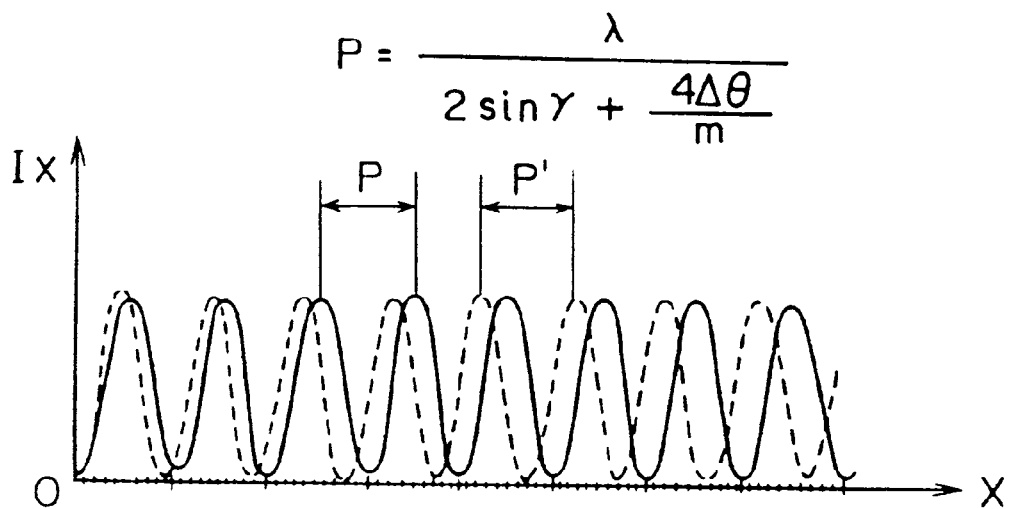
F I G. 51
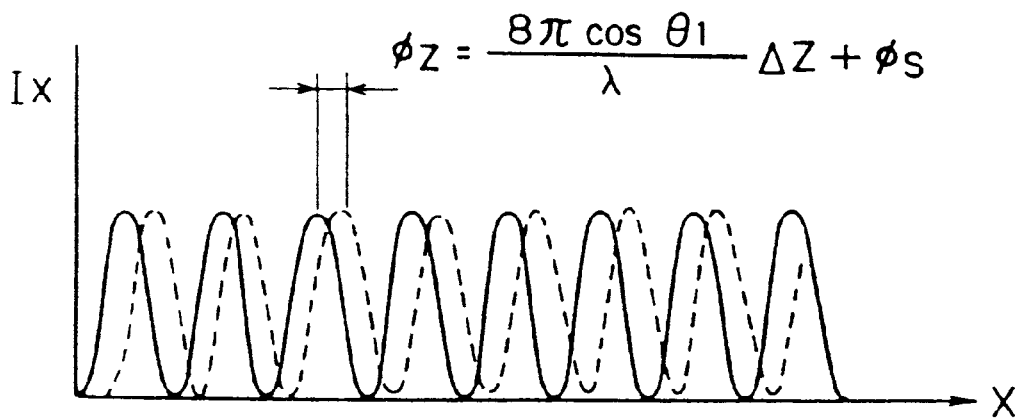

F I G. 57
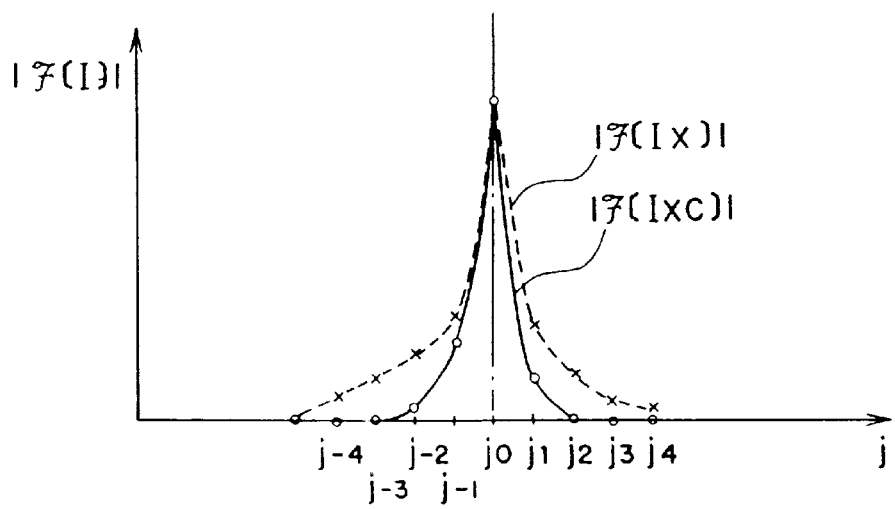
F I G. 58
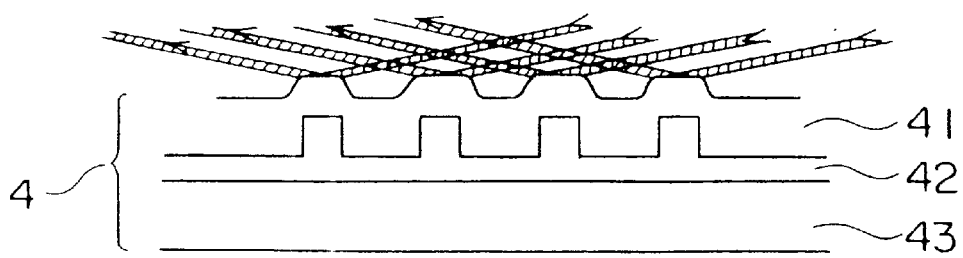
F I G. 59
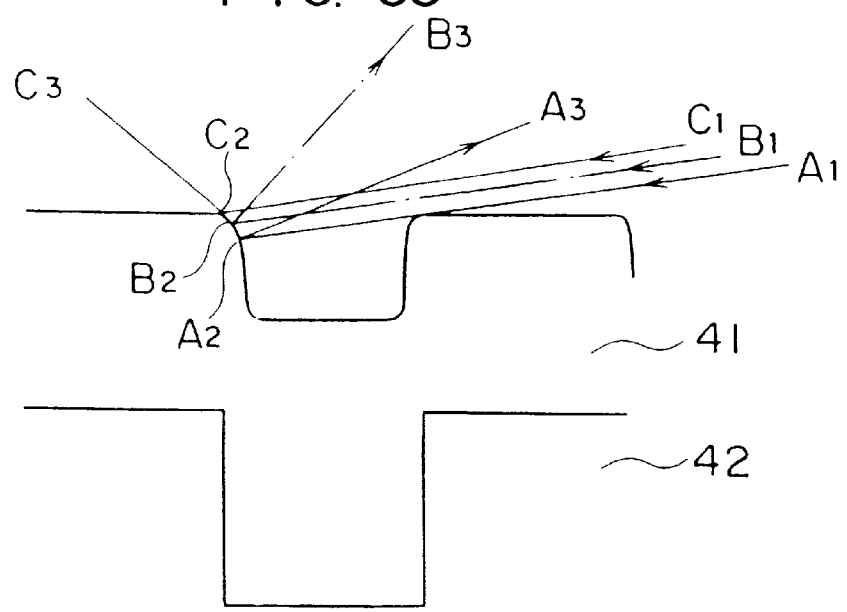

F I G. 60
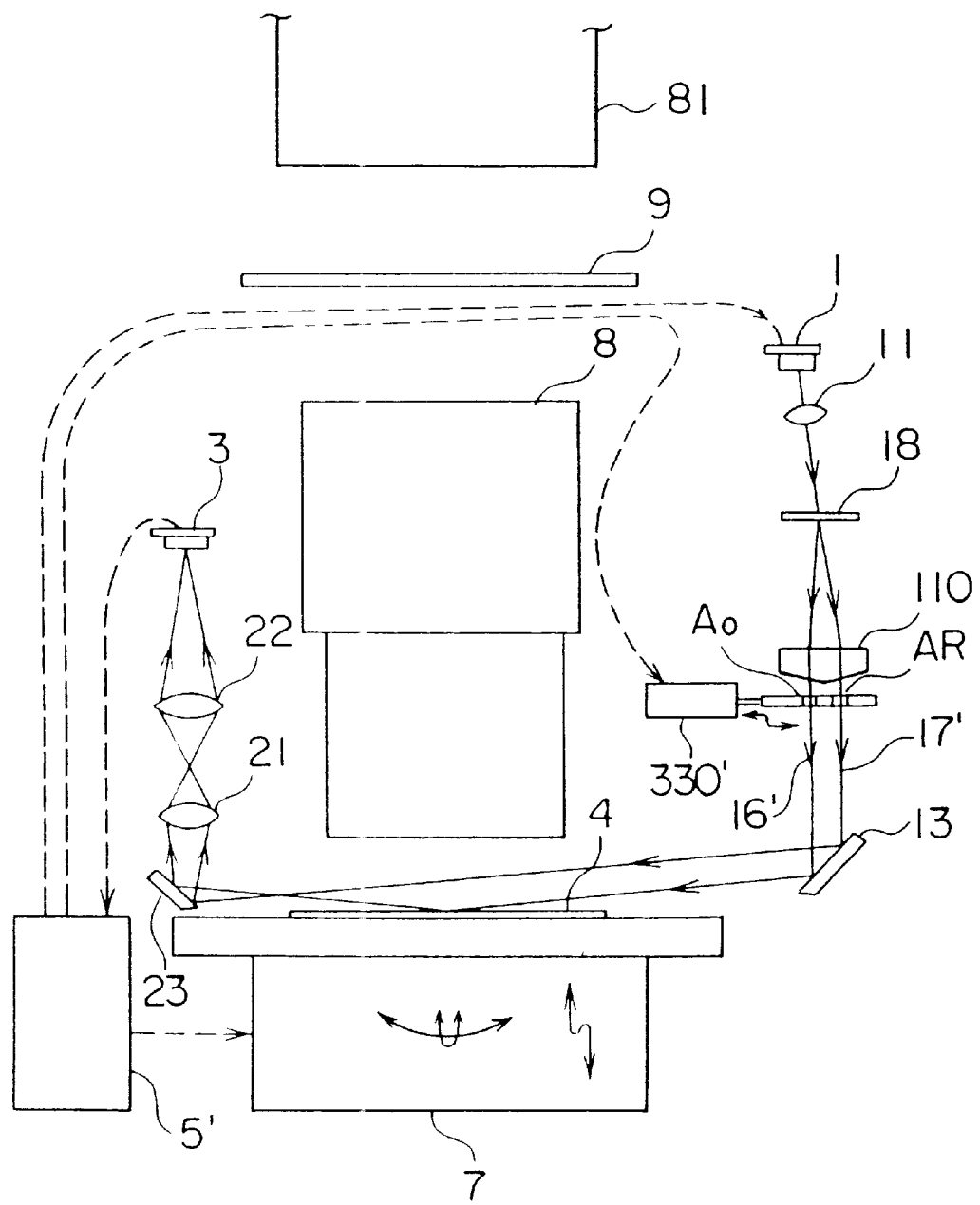

F I G. 66
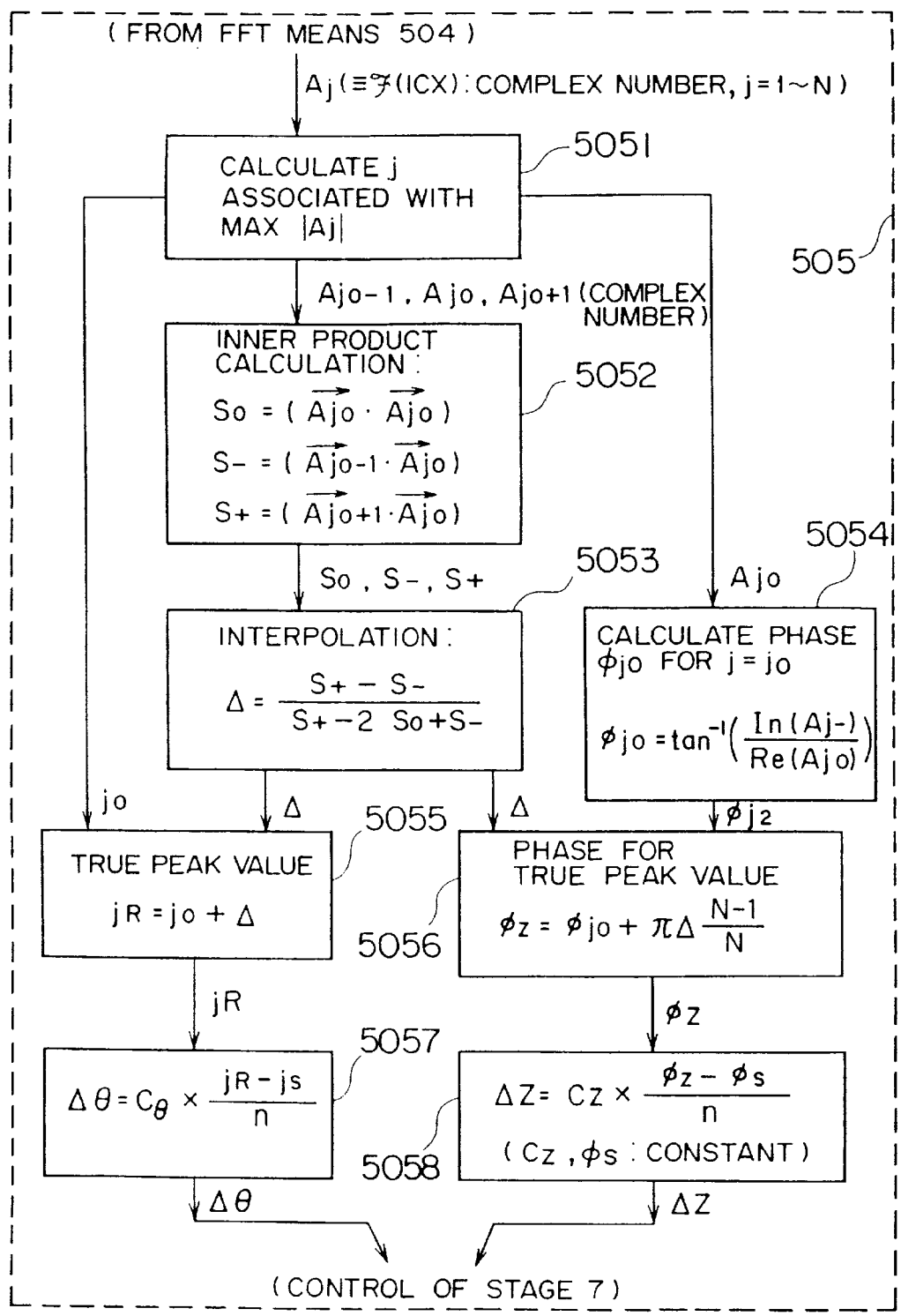

PROJECTION EXPOSURE APPARATUS AND PROJECTION EXPOSURE METHOD

This application is a continuation of application Ser. No. 08/039,578 filed on Mar. 25, 1993, now abandoned which is a division of application Ser. No. 07/623,438 filed on Dec. 14, 1990, now U.S. Pat. No. 5,227,862, which is based on International Application No. PCT/JP90/00520 filed on Apr. 20, 1990.

TECHNICAL FIELD

The present invention relates to a projection exposure apparatus and method used for a fine pattern such as a semiconductor circuit pattern or a liquid crystal display device pattern, or more in particular to a projection exposure apparatus capable of exposing the whole surface of an exposure area with high resolution by detecting the inclination and height of an object to be exposed to light.

BACKGROUND ART

In the exposure of a fine pattern of a semiconductor integrated circuit or the exposure of a drive circuit pattern in a large vision field of a display device as represented by a TFT (Thin Film Transistor) liquid crystal television or the like, it is necessary to expose a pattern faithfully to the original image with a small line width variation over the whole surface in the exposure area. Especially in the field of the semiconductor integrated circuit, a pattern with a line width of 0.5 μm or less will be required to be exposed over the whole surface of a region of approximately 15 mm in the future. With the increase in the fineness of the pattern, however, the range of forming an image (depth of focus) will become ±1 μm or less. For this reason, it is essential that the photoresist surface on a wafer accurately coincides with the surface where a pattern image is to be formed. In order to realize this, it is necessary to detect the inclination and height of the wafer surface (photoresist surface) in the exposure area accurately.

In a first well-known example disclosed in JP-A-63-7626, a laser diode beam is converged from a diagonal direction on the wafer surface and the height is detected by detecting the position of convergence. Also, according to this well-known example, the multiple reflection accompanying a multilayered structure of a wafer is handled by use of a three-wavelength semiconductor laser with the convergence point changed along the direction perpendicular to the diagonal incident direction thereby to determine heights of different places on the wafer. This well-known example, which is primarily intended to detect the height, is capable of detecting an inclination by taking measurements at positions changed along the direction perpendicular to the diagonal incident direction. An accurate value of an inclination is difficult to obtain, however, even if two positions are measured in a narrow area of about 20 mm in diameter. If the height detection of high accuracy is to be realized in this well-known example, it is necessary to attain sufficient convergence on the wafer, that is to say, to reduce the diameter of convergence as far as possible. The reduction in the diameter of convergence, however, requires an increased convergence angle of the convergence beam (the angle formed by the outermost beam of the convergence light fluxes to the main light beam), with the result that the incident angle of the principal ray would be unavoidably reduced. This reduction in angle (which reduces the angle from a line perpendicular to the wafer surface) increases the effect of the multiple interference due to the multilayered structure of the wafer for the reason mentioned below. This well-known example uses three wavelengths to cope with the problem. Since each wavelength is affected by the interference, however, the problem has yet to be basically solved.

According to a second well-known example disclosed in JP-A-63-199420 as a conventional method of inclination detection, on the other hand, a light beam for inclination detection having a different wavelength from the exposure wavelength is irradiated through a projection lens, the reflected light beam is converged and the inclination is detected from the convergence position. Since the light beam is applied to the wafer in a substantially perpendicular direction or at a small incident angle, however, the effect of interference with the light beam reflected from the base is not negligible, thereby making accurate detection difficult for the reason mentioned below.

Further, in a third well-known example disclosed in JP-A-63-247741 as a conventional method of detecting the height for a multilayered structure, the light beams reflected from the base film are separated. Such a method, however, is difficult to put into practice on a thin film used for the process of producing a semiconductor circuit.

The above-mentioned prior art fails to take into consideration that the information on the inclination and height in an exposure area is to be accurately obtained for a multilayered structure such as a wafer having a semiconductor circuit pattern, and therefore poses a problem in controlling the inclination and height with high accuracy as would be required for the future circuit pattern exposure of 0.5 μm or less.

Also, conventional apparatuses for detecting the inclination of an optical multilayered structure such as a semiconductor wafer are such that, as described in JP-A-61-170605 providing the first well-known example, for instance, the light beam emitted from a laser diode 2002 in FIG. 28 is converted into a directive beam by a lens 2014 and is irradiated on a wafer 2004 from above, and the position of the reflected light is detected by a two-dimensional position detector 2020.

Also, an instrument for measuring the distance (height) and inclination of a general object of measurement including but not limited to an optical multilayered structure is disclosed in JP-A-62-218802 of FIG. 29 providing the second well-known example. In this well-known example, the inclination is determined by a second photo-detector for the light beam entering in perpendicular direction as in the first well-known example, and the distance (in the direction perpendicular to the surface of the object 2106 to be measured) is determined from the position where an image of a light spot irradiated at an incident angle of about 60 degree from a first light path 2109 is formed on a first detector. In FIG. 29, 2101 designates a light source, 2106 an object of measurement, 2108 a first photo-detector, 2118 a second photo-detector, and 2119 a second light path.

Also, a conventional apparatus for detecting the inclination of an optical multilayered structure such as a semiconductor wafer detects the inclination and focal point in a manner as described in FIG. 2 showing JP-A-63-146013 providing the first well-known example. In this well-known example, for detection of a focal point, a converged light is irradiated on a wafer, and the position of the light reflected therefrom is formed as an image on a position sensor by an image-forming lens, so that the height (focal point) is detected from that particular position. As to the inclination, on the other hand, it is detected from the position of detecting parallel light rays irradiated on a wafer and converging the reflected light on a position sensor by a convergence lens. In both methods of detection, it is difficult to take an incident angle of 85 degree or more to the wafer, and the resultant great amount of refracted light entering the film coated with resist makes it difficult to detect the true resist surface. For this reason, the position of detection deviates considerably from the position of the true resist surface depending on the reflectance of the base or the resist thickness. It is thus necessary to set an offset value by a trial exposure for each process of wafer exposure.

Also, in a later stage of LSI exposure process, such as the process of exposure of a wiring pattern, for example, the roughness of the wafer surface becomes so great that the photoresist coated thereon becomes rough considerably if not as much as the original wafer surface. If the above-mentioned conventional method is applied to this structure, it would be unknown which portion of the rough photoresist is measured in inclination or height, resulting in a deteriorated accuracy.

The aforementioned prior art fails to take into consideration the fact that the information on the inclination and height in an exposure area is to be accurately obtained with respect to a multilayered structure such as a wafer having a semiconductor circuit pattern, and thus poses a problem in controlling the inclination and height with high accuracy as demanded for the future exposure of a circuit pattern of 0.5 µm or less.

DISCLOSURE OF THE INVENTION

An object of the present invention is to provide a projection exposure apparatus which solves the above-mentioned problems of the prior art, and in which the inclination and height of the photoresist surface in an exposure area are accurately detected for a wafer in any process of semiconductor production, and the image-forming plane is caused to register with the resist surface or a nearly optimum position thereby to expose a high-resolution pattern having only a small line width variation.

In order to achieve the above-mentioned object, according to the present invention, the light emitted from a coherent light source is converted into parallel illumination light rays, which are irradiated diagonally at an incident angle θ in an exposure area of a projection optical system on the photoresist surface on the wafer. The reflected light and a reference light produced by separating the light emitted from the light source are applied at a desired angle to each other on a pattern detector, and the resulting interference fringe is detected. This interference fringe and a phase change may be used to determine a change in the inclination and height of the photoresist surface on the wafer. Also, the incident angle is capable of being increased to 85 degree or higher according to the present invention using parallel light fluxes. Because of a large incident angle, most of the reflection occurs on the photoresist surface, and therefore the effect of the interference caused with the reflection on each layer or the base stricture becomes substantially negligible. Also, if the light incident to the photoresist is an S polarization light, the reflection on the surface is further increased for an improved accuracy.

Further, the wafer inclination and height may be detected with a sensitivity twice higher, thereby making the detection of an even higher accuracy possible, if the light reflected on the photoresist surface is applied in the perpendicular direction on a plane mirror, the light thus reflected is applied again on the photoresist surface and the information on the interference pattern is obtained with this reflected light as an object light.

Furthermore, it the system is configured in such a manner that the reference light proceeds in substantially the same direction effectively through the same area as the illumination light of the photoresist and the object light (reflected light), then it is possible to detect the inclination and height substantially free of the effect of the change in ambient conditions as each light path is subjected to a similar disturbance such as the swinging of the air.

In addition, if the information on the interference fringe thus obtained is subjected to fast Fourier transformation, and the inclination $\Delta\theta$ and the height $\Delta h$ are determined from the information in the neighbourhood of the spectrum of the fringe resulting therefrom, both $\Delta\theta$ and $\Delta h$ are obtainable at such a high speed as if in real time. Also, in the process, if the irradiated position of the photoresist is in an optically conjugate (image-forming) relationship with the light-receiving surface of an array sensor making up pattern detection means, it is possible to pick up the information only on the desired area on the wafer and thereby to determine the inclination and height of that particular part.

In executing the above-mentioned interference measurement with the light of a single wavelength, the height is determined from the phase of the interference fringe obtained. Even when the phase changes from $\alpha$ to $2n\pi+\alpha$(n: Integer), it is impossible to identify the value n. It is, however, possible to obtain the height information accurately over a wide range of height changes if a second coherent light having a different wavelength is introduced to the same optical system (light path) as the light of the first wavelength so that the two wavelengths are separated to determine the height by use of the two interference fringe information at the time of detection. Also, if other wafer height detection means such as air micrometer is used at the same time, it is possible to remove the indefinite factors along the height due to a single wavelength detection and thereby to obtain an accurate information on height over a wide range of height changes.

The information on the interference fringe obtained by the above-mentioned pattern detector contains the information on pitch and phase, and therefore the information on inclination and height are obtained at the same time. In addition, if the incident angle is set to 85 degree or more, the inclination and height of the photoresist surface are determined accurately at the same time in the manner explained below. Explanation will be made about the fact that the effect of the present invention becomes more conspicuous by setting the incident angle to 85 degree or larger.

In an application to a pattern formed of a thin film structure on the wafer surface such as a semiconductor wafer or to a photoresist coated in the thickness of one to several µm thereon, the illumination light is not only reflected on the surface of an object of measurement but also is refracted and enters the internal parts of the layer structure, so that the light reflected on the base layer is passed through the surface again and is superposed on the light reflected on the uppermost surface mentioned above. In the process, the light rays reflected on the uppermost surface and the base surface interfere with each other, with the result that the interference intensity undergoes a great change with a very small change in the incident angle of the illumination light and the film thickness. When the light is irradiated diagonally as in the system for detecting the distance shown in FIGS. 28 and 29, the distribution of the light reflected from the object of measurement is different from that at the time of incidence (such as Gauss distribution) as shown in FIG. 4. In addition, the layer structure of the object of measurement and the optical constants of the materials making up the structure differentiate the distribution. As a consequence, the measurement data is accompanied by offsets for each different object of measurement, thereby making accurate measurement in absolute value difficult. Also, apart from the perpendicular irradiation used in the inclination detection of FIG. 29, an attempt to apply the inclination or height detection to a semiconductor exposure apparatus or a semiconductor pattern inspection apparatus would cause an exposure optical system or a detection optical system to be superposed on an illumination optical system, thus making the configuration of an optical system difficult.

The occurrence of a measurement error by the interference of an optical multiplayered object mentioned above poses a conspicuous problem at the time of measurement of the inclination or height of the surface of an object of measurement by an interference method in particular. In the case of the interference method, the inclination and the phase of the wave front of the reflected light are determined from the interference fringe caused by a reference light and the light reflected on the surface of the object of measurement, which indicates the inclination and height of the object of measurement. In the case of a multilayered structure, however, if the light enters the object of measurement at a normal incident angle of about 0 to 85 degree as shown in FIG. 27, the light rays reflected on the surface or between internal layers of the multilayered structure interfere with each other, so that the amplitude and phase of the light immediately following the reflection on the object of measurement undergo a great change in accordance with the thickness of each layer or the change in the location thereof. As a result, the interference fringe obtained by superposition of the reference light fails to produce an exactly sinusoidal waveform, thereby leading to a great error.

Also, an object of the present invention is to provide means easily packageable on an exposure apparatus or an inspection apparatus for exposing or detecting a pattern with a high resolution.

In order to achieve the above-mentioned object, according to the present invention, the light of a considerably high directivity is irradiated diagonally on the surface of an object of measurement having a multilayered structure such as a wafer in such a manner that the main light ray thereof forms an incident angle of 85 degree or more. When the incident angle exceeds 85 degree, however, the ratio of the amplitude of the reflected light to the amplitude of the incident light is reduced as shown in FIGS. 5 and 6, so that substantially all the light is reflected on the surface with only a small portion thereof entering the object. Further, if the amplitude of the irradiated light is in the form of S polarization, the reflection on the surface is promoted even more.

The direction of regular reflection of the irradiated light entering the object of measurement is represented by 2α as against the inclination α of the object of measurement. This regular reflected light, if reflected in substantially perpendicular direction and returned to the original light path followed by entering the object of measurement again, is represented by 4α as shown in FIG. 3. In other words, the regular reflected light is inclined at an angle four times larger than the object of measurement.

Further, in the case where the interference is used as a method of detecting the inclination or height according to the present invention, the use of the above-mentioned interference method makes it possible that the amplitude and the phase of the regular reflected light substantially represents the information on the surface if the reflection on the surface is increased to solve the problem of the conventional interference method mentioned above, thus eliminating the effect of the thickness of the internal layers and the pattern misalignments.

Explanation will be made about the detection accuracy and the polarization of the incident light as well as the incident angle below.

Assume that the amplitude of the light entering the object of measurement is As and Ap for the S and P polarizations respectively. The amplitudes Rs, Rp and Ds, Dp of the light reflected and refracted on the surface of an object having the refractive index of n are expressed by the equations below where θ is an incident angle and ψ a refractive angle ($\sin\psi = \sin\theta/n$).

$$Rs = \frac{\sin(\theta - \varphi)}{\sin(\theta + \varphi)} As \tag{1}$$

$$Ds = \frac{2 \sin\varphi \cos\theta}{\sin(\theta + \varphi)} As \tag{2}$$

$$Rp = \frac{\tan(\theta - \varphi)}{\tan(\theta + \varphi)} As \tag{3}$$

$$Dp = \frac{2 \sin\varphi \cos\theta}{\sin(\theta + \varphi)\cos(\theta + \varphi)} Ap \tag{4}$$

The amplitude of the surface reflected light is less than one half of that of the incident light and the most part of the light is transmitted through in the range of incident angle from 0 to about 60 degree for S polarization and in the range from 0 to about 75 degree for P polarization. Therefore, a great interference of amplitude occurs with the surface reflected light by the light reflected from the boundary of the multilayered base structure. In the case of the incident angle in the range from the above-mentioned value to about 85 degree, on the other hand, the amplitude of the surface reflected light is more than one half that of the incident light, although this is not a sufficient condition for realizing an accurate measurement. The reason for this will be explained below. As shown in FIG. 17, the light having an amplitude of A entering at the incident angle of θ is assumed to be refracted at the refractive angle of ψ with the amplitude of D and reflected at an amplitude reflectance Rb on the base. The amplitude of this reflected light is given as DRb. If the amplitude of the incident light A is given as unity, D represents an amplitude transmittance factor. If the light reflected on the base is transmitted through the surface, therefore, the amplitude thereof becomes $RdD^2$. The light entering with the amplitude A (=1), on the other hand, is reflected on the surface assuming the amplitude of R. If R, D are indicated as Rs, Ds or Rp, Dp depending on whether the polarization of the incident light is of S or P type, the equations (1) to (4) described above hold true. The light $R_0$ reflected on the surface and the light $R_1$ reflected on the base are superposed when the thickness d of the layer is small, resulting in the light having a complex amplitude AR shown by the equation below.

$$A_R = R + RbD^2 \exp i \frac{4\pi dn}{\lambda} \sqrt{1 - \frac{\sin^2\Theta}{n^2}} \tag{5}$$

where λ is the wavelength of the light used for measurement. It will be seen that the phase of $A_R$ changes from equation (5) even against a very small change (in a wavelength smaller by one digit) of the film thickness d shown in FIG. 3. The relationship between the incident angle θ and R, D is as shown in FIGS. 5 and 6 for the S and P polarizations respectively. If the amplitude ratio $RbD^2/R$ in the second term of equation (5) as against the first term thereof is determined in order to facilitate the understanding from the graphs, it is possible to evaluate the degree of error affecting the measurement. As the worst case, assume that Rb=1 and the ratio $D^2/R$ for the incident angle θ is determined for the two types of polarization as shown in FIG. 7. The ratio $D^2/R$ makes up a noise (error) component in various methods of detection, and therefore the incident angle of at least 85 degree is required if the ratio is to be maintained at 5% or less. Also, it is seen from FIG. 7 that the noise is reduced further if the light enters under the S polarization state.

In a method of reflecting the light twice on the surface of an object of measurement, as compared with the case where the light is reflected only once, as shown in FIG. 3, the light is inclined by 4α against the surface inclination α with the sensitivity of detection of the inclination and height improved twice, thus making possible a highly accurate detection.

Also, although the light reflected from the base surface is superposed on the interference pattern and disturbs the pitch and phase of the interference fringe, the light entering at an angle of 85 degree or more and the use of S polarization is capable of eliminating substantially all the effects mentioned above, thereby permitting a detection with high accuracy. Further, if the light path of the reference light used for the interference measurement is made to coincide substantially with that for the measurement light, a highly accurate and stable measurement is realized substantially free of the effect of measurement environment such as the swinging of air.

Furthermore, if the interference fringe information obtained is detected as a spectrum by the fast Fourier transformation (FFT) program, the fact that the spectrum information corresponding to the frequency of the fringe represents the pitch and phase permits the inclination and the height to be determined at the same time. Also, since the FFT is a matrix operation, a parallel operation is possible. The use of this parallel operation circuit facilitates the detection of the inclination and height and the control in real time by the operation in less than 1 ms.

In addition, in the case of interference detection, a change, if any, of a pitch of the interference fringe, would lead to the detection of an exactly identical interference fringe, with the result that a displacement of an integral pitch appropriately adjusted would remain as an indefinite detection value. According to the present invention, an interference is used for detection in similar fashion to the first wavelength with the second wavelength as a detection light, and an accurate height detection over a wide range is made possible by the phase relationship between the first and second wavelengths, thereby permitting the inclination and height to be controlled with high accuracy over a wide range. Moreover, other wafer height detection means such as air micrometer is used to detect an indefinite range at the time of detecting a single wavelength, thus making an accurate detection possible over a wide range.

The present invention, which is configured as explained above, has the following-described effects:

(1) It is possible to determine the inclination and height at the same time by interference measurement.

(2) By configuring the system in such a manner that a reference light passes substantially the same position as a detection light, a stable inclination and height detection is made possible without being affected by an external disturbance factor such as air swinging.

(3) If the incident angle to the object of exposure is increased beyond 85 degree or if the incident wave is polarized in S type, the inclination and height of the photoresist surface is detected accurately without being affected by the base film structure.

(4) If the reflected light diagonally irradiated on the object of exposure is returned in perpendicular direction and is irradiated again on the object of exposure, the accuracy of detecting the inclination and height can be doubled.

(5) If the imaging surface of the pattern detection means is made conjugate with the beam irradiation position on the surface of the object of exposure to detect the inclination and height only from the information associated with the part corresponding to the desired points on the object, it is possible to set a focal point at a place requiring an especially accurate focusing.

As explained above, according to the present invention, the inclination and height of an optical multilayered material such as a wafer comprising various multilayered structures in the process of fabrication of a semiconductor circuit is capable of being accurately measured without being affected by the multilayered structure. Execution of an accurate control is also made possible for focusing by the semiconductor exposure apparatus and the registry of the wafer surface with an image-forming surface. Thus the present invention proves conspicuously advantageous against a reduced exposure focus margin accompanying a shallow depth of focus expected to occur in an excimer laser compression exposure apparatus or a high NA i-line reduction projection exposure system used for exposure of a circuit pattern of a line width of less than about 0.8 μm or, especially, less than 0.5 μm.

It was explained above that the effect of the present invention becomes conspicuous by increasing the incident angle to the wafer to 85 degree or more. Now, explanation will be made about a further improvement of the projection exposure technique practiced for an incident angle of 85 degree or more.

The technical problem required to be solved for increasing the wafer incident angle to 85 degree or more is that a sufficient detection sensitivity cannot be obtained for focus detection unless some margin of convergence angle of the converged light is secured to lessen the beam diameter at the convergence point. Also in the case of inclination detection, it is impossible to irradiate only inside the exposure area to be detected unless the beam diameter of the parallel light is reduced. In this case, if the beam diameter is excessively small, however, the diameter of the beam spot reduced on a sensor by a convergence lens would be increased and a sufficient detection sensitivity could not be obtained. For securing a detection sensitivity, the incident angle has so far been set to about 80 degree. In the case of the incident angle of about 80 degree, however, a considerable portion of the incident light enters the resist by refraction and the light reflected from the wafer pattern under the resist contributes as a detection light. Thus the focal point (height) or the inclination detected changes greatly with the resist thickness or the reflectance of the base pattern. This necessitates a trial exposure for each wafer exposure process to determine the detection error from the resist surface as an offset value and thus to make an appropriate correction. Another problem is that a change in resist thickness for the same process wafer causes a variation in the offset value, thus hampering the high-accuracy detection.

Another object of the present invention is to provide an inclination or height detection apparatus of interference type and an exposure apparatus of reduction (compression) projection type and a method thereof, which, by solving the above-mentioned technical problem, is capable of accurately detecting the height and inclination of the uppermost surface of a resist or the like coated on a wafer (substrate) always regardless of the process which the wafer (substrate) may be in.

In order to achive this object, according to the present invention, as in the above-mentioned invention, a coherent parallel beam such as a laser is irradiated at a large incident angle on an object of measurement like an optical multilayered material, and an interference fringe is generated between the light reflected therefrom and a reference light separated from the parallel beam thereby to detect the focal point (height) from the phase of the interference fringe and the inclination from the pitch thereof. In the process, if the incident angle is increased, especially to 85 degree or more, as mentioned above, the component reflected on the resist surface is increased, thereby making possible a detection with high accuracy. In this case, if the base is made of such a material as aluminum having a very large reflectance, however, the detection error would be considerable. According to the present invention, there is provided means for accurately detecting the height and inclination of the resist surface in a manner completely free of the effect of the base material or the resist thickness by further improving the accuracy of the above-mentioned invention. For this purpose, according to the present invention, the monochromatic light having two or more different wavelengths is used and a plurality of these wavelengths are selectively applied. Specifically, according to the present invention, as explained later in detail, taking into consideration the fact that the error generated by the component reflected from the base and transmitted through the resist surface periodically changes with the resist thickness, the refractive index of the base and the wavelength, a monochromatic light having a plurality of wavelengths is prepared so that a wavelength for measurment is selected in accordance with the above-mentioned conditions of the object. The method of selecting a wavelength uses a data on resist thickness if available in advance, or the wavelength to be used is determined on the basis of a theoretical equation described later. Even in the absence of a data on the resist, the quantity of light entering the wafer at a large angle and reflected, that is, the reflectance may be measured over a plurality of wavelengths to select a wavelength to be employed for which the generated error is negligible.

The principle of the present invention will be explained. FIG. 38 is a diagram showing the conditions of reflection and refraction in the boundary of the light irradiated at an incident angle θ on an optical multilayered material. A medium 1 is an ordinary air having the refractive index $n_1$ of 1.0. A medium 2, on the other hand, is a photoresist in the case of a semiconductor wafer and usually has a refractive index $n_2$ of about 1.65. A medium 3 is a base pattern different for each process. This medium 3 may be of a multilayered structure, and is assumed to have a refractive index of nb as viewed from the boundary with the medium 2. When considering the reflection and refraction at a boundary point 0 of the linearly polarized light having an amplitude Ap (P polarization) and As (S polarization) entering the resist surface as shown in FIG. 38, it is seen that the light has four components. Specifically, they include reflected light rays Rp, Rs, refracted light rays $D_2p$, $D_2s$ and light rays $D_1p$, $D_1s$ arriving out of the resist at point 0. As is widely known, the P-polarized light, as compared with the S-polarized light, has a large refraction component and therefore is not very suitable for the purpose of detecting the surface in the present invention. Assuming that the S-polarized light is used as incident light, therefore, the amplitude of the reflected light is expressed as shown below according to the conditions about the continuity of the electric field and the magnetic field at point 0 on the boundary in FIG. 38.

$$Rs = \frac{\sin(\theta - \varphi) + \alpha_s \sin(\theta + \varphi)}{\sin(\theta + \varphi) + \alpha_s \sin(\theta - \varphi)} As \qquad (6)$$

$$\frac{\sin\theta}{\sin\varphi} = \frac{n_2}{n_1} \qquad (7)$$

where θ is the incident angle, ψ the refractive angle and As the amplitude of the incident light. In this equation, $\alpha_s$ is given by the equation below using the reflection coefficient γd (generally, a complex number), the phase φ changing during a reciprocation in the photoresist and the absorbancy index β.

$$\alpha_s = \gamma_b \exp\left\{i2\pi\frac{2nd}{\lambda}\sqrt{1 - \frac{\sin^2\theta}{n_2^2}} - \frac{2\beta\alpha}{\sqrt{1 - \frac{\sin^2\theta}{n_2^2}}}\right\} \qquad (8)$$

The first term in { } of equation (8) represents the phase difference due to the difference of the length of the paths of the light reflected from the base and the light reflected at point 0, and the second term the attenuation caused by the absorption. When the base is made of aluminum, the value $\gamma_b$ becomes maximum and is about 0.878 for the detection wavelength in visible region. In the case where the base is aluminum with the second term in { } zero, that is to say, in the case where the resist fails to absorb the detection light, the effect of the base is maximum and the error is greatest. When the aluminum is the base material, a standing wave may be generated at the time of exposing a pattern. An absorbent therefore may be inserted. This absorbent, however, is adapted to absorb the g ray (436 nm), i ray (365 nm) and KrF excimer laser (248 nm), but not necessarily the laser used for detection of the inclination and height. If an accurate detection is assured even in the event that the effect of reflection from the base is maximum and the base is made of aluminum as the worst case of an increased error with the absorbancy index β at zero, therefore, the detection of even higher accuracy is possible, the other cases posing no problem.

The function of the present invention will continue to be explained with reference to the worst case assumed above. If equation (8) is substituted into equation (7) with β as zero, $R_s$ is a complex number and is expressed as $$R_s = \gamma e^{i\psi} A_s \qquad (9)$$

Assuming that the reflection on the base is zero, that is, αs=0, Rs is given as shown below from equation (6).

$$R_s = \frac{\sin(\theta - \varphi)}{\sin(\theta + \varphi)} A_s$$

As compared with equation (9), ψ=0. This equation represents the reflection in a boundary having the refractive indexes of $n_1$ and $n_2$. Since β is zero in equation (8), as is expressed by $$\alpha s = \gamma_b e^{i\phi} \qquad (10)$$

-continued $$\phi = 2\pi \frac{2nd}{\lambda} 1 - \sqrt{\frac{\sin^2\theta}{n_2^2}} \quad (11)$$

From equations (6), (9) and (10), Rs and in equation (9) are given as shown below (where $\gamma_b$ is a real number for the time being).

$$Rs = \frac{\sin(\theta-\varphi) + \gamma_b\cos\phi\sin(\theta+\varphi) + i\gamma_b\sin\phi\sin(\theta+\varphi)}{\sin(\theta+\varphi) + \gamma_b\cos\phi\sin(\theta-\varphi) + i\gamma_b\sin\phi\sin(\theta-\varphi)} As \quad (12)$$

$$\tan\psi = \frac{\gamma_b\sin\phi\{\sin^2(\theta+\varphi) - \sin^2(\theta-\varphi)\}}{\sin(\theta+\varphi)\sin(\theta-\varphi)(1+\gamma_b^2) +} \quad (13)$$
$$\gamma_b\cos\phi\{\sin^2(\theta+\varphi) + \sin^2(\theta-\varphi)\}$$

The amplitude As of the incident light is defined as 1 to determine Rs from equation (12). The value φ changing with the thickness d determined from equation (11), the reflectance $\gamma_b$=0.878 of the aluminum base, the incident angle θ, and the value ψ determined from θ, the refractive index $n_2$ (=1) of the resist and equation (7) are substituted into equation (13). The value Rs is capable of being illustrated on the complex plane against θ of 88, 86 and 80 degrees to determine FIGS. 39 to 41. The values indicated on the circumferences of the graphs are φ determined from equation (11) changing with the resist thickness. These graphs will be explained. The length of a line portion connecting a point on the curve and the coordiante origin is |Rs|, which represents the amplitude reflectance including the effect of the base. The angle which this line portion forms with the real coordinate (abscissa) indicates a phase change of the reflected light. This phase change provides a phase shift due to the effect of the base, that is, an error of height detection under the effect of the base, in view of the fact that φ=0 as described above in the absence of the effect of the base with reflection occurring only on the surface. Let us study the degree of this error in the interference detection method. As will be explained in detail later, the relationship held between the wafer height ΔZ, the inclination Δθ and the interference fringe obtained in the optical detection system shown in FIGS. 37 and 45 is given by $$I(X) = a + b\cos\left\{2\pi\frac{\cos\theta_0 + \cos(\theta + 2m\Delta\theta)}{\lambda_1}x + \frac{4n\pi\cos\theta}{\lambda_1}\Delta Z + \varphi_0\right\} \quad (14)$$

(a and b are constants in the relation |a|>|b|) where X is the coordinate along the direction of fringe pitch at a position of interference with the two light rays superposed on each other, $\theta_0$, θ the angles of the reference light and the measurement light to the normal, Δθ the inclination of the chip involved on the wafer from the horizontal plane, ΔZ the change in height along the focusing direction, and $\psi_0$ a phase constant determined by the conditions for initialization of an optical measurement system. When the object of measurement is irradiated once as shown in FIG. 37, m in equation (14) assumes unity, and when irradiated twice as shown in FIG. 45, it takes the value of 2. The vertical displacement ΔZp of the wafer required for a pitch of change of the interference fringe based on equation (14) is given by $$\Delta Zp = \frac{\lambda_1}{2m\cos\theta} \quad (15)$$

A solution obtained for θ=80 to 89 degree with $\lambda_1$=0.6328 μm in the case of m=1 or 2 respectively is shown in FIG. 42.

In determining the height ΔZ from the intensity given by equation (14) based on the interference measurement, on the assumption that a phase shift of ψ given by equation (13) is caused in the measurement light under the effect of reflection from the base, the error ΔZe of the measurement result is expressed from equation (15) as $$Ze = \frac{\Psi}{360}\Delta Zp \quad (16)$$

The value of ΔZe obtained for the aluminum base in the case of θ=88.5, 88, 86 and 80 degree is shown in FIG. 44A. The value of ψ, on the other hand, is shown in FIG. 44B. As obvious from FIGS. 39 and 40 plotting Rs on a complex plane with the incident angle of 88 and 86 degrees, the maximum angle ψ max as viewed from the origin toward the circumference provides a maximum detection error by substituting this value into ψ in equation (16). As a result, when θ≦85° where the circumference enters the second and third sectors, ψ changes between 0 and 36 degree. Therefore, the maximum value of detection error becomes equal to ΔZy, thereby making the measurement impossible. It is, therefore, essential that the incident angle be at least 85 degree for a aluminum base. FIG. 43 shows the maximum value ΔZemax (one of maximum values in the graph) of the detection error ΔZe shown in FIG. 44A, as determined for the base reflectance $\gamma_b$ with various incident angles as a parameter. The names assigned by arrows in the graph of FIG. 43 indicate materials making up the base of a semiconductor wafer. It is seen from this graph that in the case of an aluminum base, the maximum detection error reaches about 0.6 μm for a specific resist thickness (specific φ) even when the incident angle is increased beyond 85 degree, although this poses no problem for materials other than aluminum. The graphs of FIGS. 44A to 44C representing the phase φ and the detection error ΔZe plot only up to 180 degree. The result for the angles 180 to 360 degree, however, may be obtained by rotating the curves on the graph for 0 to 180 degree by 180 degree around the point (180°, 0 μm). This graph shows that a detection error of not more than about 0.1 μm for the value φ between 0 and 120 degree or between 240 and 360 degree. In other words, a high detection accuracy is attained if the system is used within these ranges. A method of meeting this requirement will be explained on the basis of the equation (11) representing the relationship between the value φ, resist thickness d, and the wavelength λ and the incident angle θ of the measurement light. Assume that two laser beams having wavelengths $\lambda_1$ (=0.6328 μm) and $\lambda_2$ (=0.6119 μm) respectively are applied on an object of measurement at the same angle to conduct a measurement by the interference method. The phase value φ associated with the measurement error (FIG. 44A) of at least 0.1 μm is in the area of 120 to 240 degree. Similar areas appear in predetermined cycles of resist thickness as seen from equation (11). FIG. 46 shows a line portion representing an area where the error with two wavelengths is large. As obvious from this diagram, the error is sufficiently small making accurate measurement possible if one of the two laser beams is used in the range or resist thickness from 1.2 to 2.4 μm.

According to the present invention, even when the base of an optical multilayered material is made of a material such as aluminum very high in reflectance, as mentioned above, the height and inclination of the surface are capable of being detected with a high accuracy of less than 0.1 μm. It is, therefore, possible to control the image-forming surface and the resist surface in such a manner as to completely register with each other at the time of exposure of a fine pattern exposure of a 0.5 μm L&S in a semiconductor exposure apparatus, thus permitting a pattern to be formed substantially free of line width variations. As a result, the yield of pattern exposure is remarkably improved for a great economic effect.

According to the present invention, the light emitted from a coherent light source is converted into parallel light rays, which are irradiated at an incident angle of θ diagonally on an exposure area of a projection optical system on the photo resist surface of a wafer, so that an interference fringe is detected which is obtained by applying the reflected light ray and a reference light ray at a desired angle on a pattern detector, the reference light ray being produced by separating the light emitted from the light source. A change in the phase and interference fringe pitch is used to determine the inclination and height of the photoresist surface on the wafer. Also, the incident angle may be increased to larger than 85 degree according to the present invention using parallel light fluxes. Since the incident angle is large, the light is reflected for the most part on the photoresist surface, thus making it possible to ignore substantially all the effects of the interference occurred with the reflection in each layer of the base layer structure. Further, if the light incident to the photoresist is S-polarized, the reflection on the resist surface is further increased for an improved accuracy.

Furthermore, assume that the light reflected on the photoresist surface is applied in the direction perpendicular to a plane mirror, the reflected light is applied again onto the photoresist surface, and the same reflected light is used as an object light to produce the information on the interference pattern. Then, the detection of the inclination and height of the wafer is capable of being performed with a double sensitivity for a detection of even higher accuracy.

In addition, if the system is configured in such a manner that the reference light proceeds in substantially the same direction effectively to pass through substantially the same area as the light irradiated on the photoresist and the object light (reflected light), each light path receives the effect of an external disturbance such as the air swinging in similar fashion, so that it is possible to detect the inclination and height without being hardly affected by the change in the ambient conditions.

What is more, to the extent that the information on the interference fringe is subjected to fast Fourier transformation and the resultant information in the neighbourhood of a fringe spectrum is used to determine the inclination Δθ and the height ΔZ, then the values Δθ and ΔZ are obtained at such a high speed as if in real time. Also, if the irradiated position of the photoresist is in a conjugate (image-forming) relationship with the light-receiving surface of the array sensor providing pattern detection means, it is possible to pick up the information only on the desired region on the wafer and to determine the inclination and height of the particular part.

According to the present invention, the angle at which light is irradiated on a comparatively rough photoresist surface occurring in a later stage of the exposure process is increased, so that the light is irradiated on the protruded portions of the resist, while the recessed portions of the resist are left in shadow, thus reducing the contribution thereof to the detection of an interference fringe. As a consequence, according to the present invention, by detecting the uppermost surfaces of the protrusions, the detection surface which has so far remained indefinite is clarified. This makes possible right detection of the resist surface. In an object of measurement having such a rough surface as mentioned above, the area of the uppermost surfaces of the protrusions has an effect on the intensity of the reflected light. As a result, the amount of reflected light is increased macroscopically at a place to be measured on the surface where the area of the uppermost surfaces of the protrusions has a large proportion. The distribution of the interference fringe caused with the reference light on the light-receiving surface of the array sensor thus becomes uneven. Specifically, as described above, the portions of the surface to be measured where the ratio of the area of the uppermost surfaces of protrusions is large have a large amplitude of the interference fringe when the object of measurement and the array sensor are in substantially conjugate positional relation with each other, while the amplitude is small when the ratio of the area mentioned above is small. As a result, if an interference fringe having different amplitudes at different places is subjected to Fourier transformation and the inclination and height are determined from the spectrum information corresponding to the line pitch, then the accuracy is reduced. According to the present invention, such an object is handled in such a way that the intensity distribution of a pattern of only the light reflected from the object which is not superposed on a reference light is detected by the above-mentioned array sensor, and the information thus obtained is used to correct the pattern information of the above-mentioned interference fringe for subsequent Fourier transformation. By doing so, the interference fringe pattern has the same amplitude at about every place, thereby permitting the inclination and height to be determined accurately from the spectrum information.

Since the interference fringe information produced from the pattern detector contains the information on both the pitch and phase, the information on inclination and height are obtained at the same time. Further, if the incident angle is increased beyond 85 degree, the reflection on the photoresist surface is increased, thus enabling the inclination and height of the photoresist surface to be determined accurately at the same time.

Further, if only the light reflected from an object is detected for a wafer having a very rough photoresist in a later stage of the exposure process is described above, and the data on the detected intensity distribution is used as a correction value, then the height and inclination of the uppermost surfaces of the protrusions in the resist surface are mainly determined. This function will be explained more in detail. Suppose the sectional structure of the wafer 4 is comprised of an Si substrate 43 on which an uneven layer 42 is superposed with a comparatively large misalignment. The photoresist 41 coated on this assembly retains a misalignment, though small as compared with that of the rough layer 42. If parallel laser beams are irradiated on the surface of the rough photoresist at an incident angle more than 85 degree (say, 88 degree) to the normal, only the hatched portions in FIG. 58 are reflected regularly, while the other portions of the beams are scattered as they are reflected in a direction different from the regularly-reflected beams as shown by beams $A_1$, $B_1$, $C_1$ in FIG. 59 enlarged from FIG. 58. As a result, no light reaches the detection system for taking out only the regularly reflected light as described later, other than those reflected on the uppermost parts of the protrusions as shown by the beams $A_1$, $B_1$, $C_1$. In this way, in the case of a sectional structure comprised of rough portions, the light of an intensity substantially proportional to the area of the uppermost surface reaches the detector.

In addition, in view of the fact that the wafer surface is substantially conjugate with the light-receiving surface of the array sensor, even if the sectional structure is substantially flat or has some roughnesses, the intensity of those portions corresponding to a large area of the uppermost surface of the protrusions is large, and vice versa. As a result, the intensity distribution Ox on the array sensor of the light reflected from the object of measurement has different levels at different points as shown, for example, in FIG. 53. In this way, if the light having this distribution interferes with the reference light Rx having a predetermined level as shown in FIG. 54, the amplitude of the fringe of the intensity Ix of the interference fringe undergoes variations as shown in FIG. 55. The phenomenon described above will be explained more theoretically and quantitatively. Let Ox be the intensity of the light reflected from an object of measurement which light is applied from an array sensor, $\alpha_1$ the incident angle of the same light, Rx the intensity of a reference light and $-\alpha_1$ the incident angle of the same reference light (the minus sign indicates that the light involved is inclined in a direction opposite to the light reflected from the object of measurement with respect to the normal on the surface of the array sensor). If these two light rays are inclined in X direction, a fringe changing in X direction is detected. The intensity of the interference fringe thus obtained is given as $$Ix(X) = \left| \sqrt{O_x}\, e^{i\left\{\frac{2\pi\sin\left(\alpha_1 + \frac{2\pi}{m}\Delta\theta\right)}{\lambda}X + \theta(Z)\right\}} + \sqrt{R_x}\, e^{-i\frac{2\pi\sin\alpha}{\lambda}X} \right|^2 \quad (17)$$

where $\lambda$ is the wavelength of the detection light, $\Delta\theta$ the inclination of the object of measurement, n the number of times of reflection on the object of measurement as described later, m the image-forming manification in the detection optical system, and $\phi(Z)$ a phase change with the height. Equation (17) is expressed as shown below when n=1 from the relationship $\Delta\theta<<\alpha_1<<1$.

$$Ix(X) = O_x + R_x + 2\sqrt{O_x R_c}\cos\left[\frac{2\pi}{\lambda}\left\{2\sin\alpha_1 + \frac{2\Delta\theta}{m}\cos\alpha_1\right\}X + \phi(Z)\right] \quad (18)$$

If $O_x$ and $R_x$ take a fixed value regardless of X, it is possible to determine the values of $\Delta\theta$ and $\phi(Z)$ by using the spectral peak position corresponding to the fringe period of a Fourier spectrum obtained by Fourier transformation of the detection signal given by equation (18) and the adjoining data. since the values $O_x$ and $R_x$ are not generally fixed, given the rough conditions of the resist surface of the wafer varying from one point to another as described above, however, the value $O_x$ changes as shown in FIG. 53. Even if the distribution $R_x$ of the reference light assumes a fixed value $R_c$ as shown in FIG. 54 with respect to $O_x$, the intensity and hence the amplitude of the interference fringe given by equation (18) varies from one point to another as shown in FIG. 55. Due to this amplitude change, the Fourier transformation of Ix has an expansion around the peak value as shown by |F[Ix]| in FIG. 57, so that the infroamtion on the original fringe period (inclination) and phase (height) is hidden for a reduced accuracy.

In order to cope with this problem, prior to detecting an interference fringe, a reference light is masked to detect only the light reflected from an object of measurement by the same detection system. This value is naturally $O_x$. In the case where $R_x$ is not equal to $R_c$ as in the example of FIG. 54, such as when $R_x$ assumes a curve shown in FIG. 62, on the other hand, the intensity distribution $R_x$ of only the reference light is measured. When these two measurements ($O_x$, $R_x$) or $R_x=R_c$, the corrective operation shown below is effected with one measurement ($O_x$) as a correction value to produce a correction signal Icx.

$$Icx = \frac{I_x - O_x - R_x}{2\sqrt{O_x R_x}} \quad (19)$$

The abscissa k of the spectrum S(k) does not provide frequency information but Ix is given by equation (1), and therefore Icx is determined as $$Icx = \cos\left[\frac{2\pi}{\lambda}\left\{2\sin\alpha_1 + \frac{\Delta\theta}{m}\cos\alpha_1\right\}X + \phi(Z)\right]$$

If this correction signal Icx is subjected to Fourier transormation, the expansion around the peak value is eliminated as indicated by |F[Icx]|. A sharp spectrum based on a pure trigonometric function is obtained, thereby making it possible to determine an accurate inclination and height.

According to the present invention, it is possible to accurately detect the inclination and height of the surface of an object such as a semiconductor wafer made of an optical multilayered material having a rough surface. As a consequence, even in the case where a compression exposure apparatus having a comparatively shallow depth of focus is used for further size reduction of the LSI in the future, an LSI pattern will be capable of being exposed to light with a high yield in all the processes accompanied by different wafer surface conditions.

Also, according to the present invention not limited to the above-mentioned case, the inclination and height of a surface of a wide variety of objects of measurement may be determined with high accuracy regardless of the surface layer structure or the pattern conditions thereof.

Further, the present invention makes it possible to detect very accurately the period or pitch and the initial phase of a signal generally having a periodic waveform, thus permitting the aforementioned high-accuracy measurement over a wide range of applications.

Now, a method of signal processing in a projection exposure apparatus will be explained.

In a projection exposure apparatus, the inclination and height of an object surface are determined through the detection of the period and phase of a sinusoidal wave.

In a projection exposure apparatus, a method of determining the period or phase of a periodic wave like a sinusoidal wave is by using the discrete Fourier transformation. The discrete Fourier transformation is for determining a frequency information F(k) according to the equation shown below after digitizing by sampling a periodic wave in time series.

$$F(k) = \sum_{j=0}^{N-1} A(j)\cdot\exp(-i2\pi jk/N) \quad (20)$$

$$= \sum_{j=0}^{N-1} A(j)\left(\cos 2\pi\frac{jk}{N} + i\sin 2\pi\frac{jk}{N}\right)$$

where j or k=0, 1, 2, . . . , N-1, and N=2m (m: Integer)

A(j) is a digital value of the periodic wave sampled, and N the total number of samplings. F(k) is determined by the operation of a complex number as indicated by equation (1), and therefore may be expressed as a complex number as shown below.

$$F(k)=Fr(k)+iFi(k) \quad (21)$$

Specifically, F(k) as a result of Fourier transformation is a vector having a real number Fr(k) and an imaginary number Fi(k). The height S(k) of the spectrum representing the intensity of the frequency component of F(k) is determined as shown below by calculating the length (absolute value) of the vector.

$$S(k) = |F(k)| = \sqrt{Fr(k)^2 + Fi(k)^2} \qquad (22)$$

FIG. 69 shows an example of the spectrum S(k) after discrete Fourier transformation of a periodic wave. The discrete Fourier transformation provides information on the number of samplings for each period of a periodic wave. More accurately, information on the number P of samplings per period may be determined by dividing the total number N of samplings by k as shown by the equation below.

$$P = N/k \qquad (23)$$

As a result, it follows that the spectrum S(k) for k=0 (P=∞) in the spectrum diagram as shown in FIG. 69 indicates a DC component, while the spectrum S(k) for a large position of k represents the information on a short period. In the example of FIG. 69, the spectrum S(k) at the position of k=$n_0$ for other than the DC component of k=0 is maximum, indicating that the periodic wave contains the period component of $P_0 = N_0/n_0$ in terms of the number of data samples most of all. Also, it is possible to determine the phase $\phi_0$ of the periodic component $P_0$ by the operation of the equation below.

$$\phi_0 = \tan^{-1}(Fi(n_0)/Fr(n_0)) \qquad (24)$$

The method of calculation mentioned above realizes a projection exposure apparatus according to the present invention for determining the inclination and height of an object to be exposed.

The method using the discrete Fourier transformation, however, generally encounters an unavoidable problem described below. Specifically, because of the discrete nature of the Fourier transformation, the problem of accuracy is posed in which the position (k) of the spectrum S(k) is also discrete so that it is impossible to decompose for more than N sampling points. This problem will be specifically explained with reference to a case in which the discrete Fourier transformation is applied to a sinusoidal wave A(j) having a period P and a phase φ as expressed by the equation below.

$$A(j) = a + b\cos\left(\frac{2\pi}{P}j + \phi\right) \qquad (25)$$
$$j = 0, 1, 2, \ldots, N-1$$

where a is a DC component and b a gain. First, from equation (23), if the result of dividing the number N of samplings by the period P is an integral number $n_0$ (=N/P), the spectrum S(k) after Fourier transformation appears only at the positions of k=0 and k=$n_0$ as shown in FIG. 70. In such case, the position K=$n_0$ where the spectrum S(k) is maximum at other than the position of k=0 or the spectrum position due to the DC component a in equation (25) is detected to determine the period $P_0$ (=N/$n_0$) from equation (23). Then, this information $P_0$ coincides with the period P of the sinusoidal wave A(j) in equation (25). The phase $\phi_0$ determined from equation (24) is also coincident with the phase φ in equation (25). Now, let us consider the case where the result of dividing the number N of samplings is divided by the period P. Specifically, if the equation below holds, $$N/P = n_0 + \Delta \qquad (26)$$

($n_0$: Integer, |Δ|<0.5)
then, the spectrum S(k) after discrete Fourier transformation is given as in FIG. 71. In such a case as this, a virtual maximum spectrum indicated by the dashed line should appear at the position indicated by k=$n_0$+Δ other than k=0. Since the spectrum position k cannot be decomposed for other than the number N of samplings (k=1, 2, ..., N−1), however, a maximum spectrum appears at the position k=$n_0$ in the same manner as in FIG. 70. When the sinusoidal waves shown in FIGS. 70 and 71 are subjected to discrete Fourier transformation, the difference between the resulting two spectrum patterns lies in that the spectrum S(k) is also distributed around k=$n_0$ by the effect of a fraction Δ in FIG. 71. Specifically, as shown in equation (26), even if the fraction Δ occurs at the position of a virtual maximum spectrum, the position of maximum spectrum is identical to that in the absence of Δ. Therefore, the period P($N_0$/$n_0$) determined by equation (23) from the position k=$n_0$ of the maximum spectrum is not accurate. In the case where the period P of a sinusoidal wave is determined in this way by using only the position k=$n_0$ of the maximum spectrum by a conventional simple method, the error is expressed by the equation below.

$$\varepsilon = \frac{N}{n_0 + \Delta} - \frac{N}{n_0} = \frac{\Delta N}{n_0(n_0 + \Delta)} \qquad (27)$$

If N=512 and P=10, for instance, $n_0$=51 and Δ=0.2. Therefore, the error ε of 0.039 occurs in the conventional method of detection. Also, if N=128 and P=10, then ε=−0.154. It is obvious that the other phase $\phi_0$ can neither be obtained accurately by the operation of equation (24) as far as there is a fraction Δ. As indicated in the foregoing two examples, the error ε may be decreased by increasing the number N of samplings. To the extent that the Fourier transformation is discrete, however, the error due to equation (27) is unavoidable. If the number N of samplings is increased, on the other hand, the disadvantage is that the processing time of the Fourier transformation is lengthened.

As a method of solving such a problem point of the general use of discrete Fourier transformation, a MEM theory has been proposed. This MEM theory assumes an indefinite function by the repetitive development from a definite wave form observed. A crucial systematization problem, however, is that the computations are so complex that the processing operation consumes a long time. A system for measuring the period and phase of a sinusoidal wave is a shape measuring instrument utilizing the optical interference fringe, for instance. JP-A-61-213704 is cited as a related patent publication disclosing a system of this type.

More specifically, no consideration is given to the fact that a crucial problem of accuracy, that is, resolution or the processing time is posed because the spectrum position determined generally by the discrete Fourier transformation is discrete. A problem is thus encountered that an error is caused if an attempt is made to determine the period or phase of a sinusoidal wave by handling only the position of a maximum spectrum.

Still another object of the present invention is to provide a method and an apparatus for solving the problems of the discrete Fourier transformation and to lead to the period and phase of a sinusoidal wave with high accuracy from a spectrum distribution, and an apparatus for measuring the inclination and height of a surface of an object by use of such method and apparatus.

In order to achieve the above-mentioned object, there is provided according to the present invention a method and an apparatus for detecting the period and phase of a sinusoidal wave and an apparatus for measuring the inclination and height of a surface, in which taking into consideration the fact that the maximum spectrum after discrete Fourier transformation and the height of the adjacent spectra change with the period of a sinusoidal wave, the position of a virtual maximum spectrum is obtained from the positions of the maximum spectrum and adjacent spectra. The vectors of the position of this virtual maximum spectrum and the above-mentioned three spectra are used to determine the period and phase of a sinusoidal wave with high accuracy. This method is also applied to the measurement of the inclination and height of the surface of an object utilizing an optical interference fringe. In this way, the inclination and height of a surface are measured by arithmetic means from the period and phase of an iterference fringe.

The method and apparatus for detecting the period and phase of a sinusoidal wave and the apparatus for measuring the inclination and height of a surface described above are capable of determining the position of a virtual maximum spectrum by a formula from the vectors of the maximum spectrum and adjacent spectra as a variable by developing the discrete Fourier transformation. It is actually possible to estimate the position of a virtual maximum spectrum by the arithmetic operation of substituting the vectors of the above-mentioned spectra into the formula, whereby the period and phase of a sinusoidal wave are accurately determined by operation. There is another method of determining the position of a virtual maximum spectrum. FIG. 72 shows another example of detecting the position of a virtual maximum spectrum from the spectrum S(k). This method is such that the spectrum distribution around a maximum spectrum is approximated by minimum square with the most analogous function as shown in FIG. 72, and the maximum value of the approximate function is used to estimate the position of a virtual maximum spectrum. This in turn presents a problem, however, in that a highly accurate estimation is difficult due to the difficulty encountered in setting an approximate function. Now, explanation will be made specifically about a method of operation for determining the period and phase of a sinusoidal wave from the above-mentioned method of detecting the position of a virtual maximum spectrum.

First, the sinusoidal wave A(j) given by equation (25) may be further rewritten as the equation below by Euler's formula.

$$A(j) = a + \frac{b}{2}\exp\left\{\left(i\left(\frac{2\pi j}{P} + \phi\right)\right) + \exp\left(-i\left(\frac{2\pi j}{P} + \phi\right)\right)\right\}$$

where if the sinusoidal wave A(j) is developed by being substituted into the equation (1) of Fourier transformation, the Fourier transformation value F(k) shown below is obtained.

$$F(k) = a\sum_{j=0}^{N-1}\exp(-i2\pi jk/N) +$$

$$\frac{b}{2}\sum_{j=0}^{N-1}\left(i\left\{2\pi\left(-\frac{k}{N} + \frac{1}{P}\right)j + \phi\right\}\right) +$$

$$\frac{b}{2}\sum_{j=0}^{N-1}\exp\left(i\left\{2\pi\left(-\frac{k}{N} + \frac{1}{P}\right)j + \phi\right\}\right)$$

In this equation, the first term represents the Fourier transformation of the DC component a and hence a delta function, although it has a definite value because of a definite number of Fourier transformation. The second and third terms are given as shown below by abbreviating the coefficient b/2 if a geometrical series is used.

$$\text{Second term} = \exp(i\phi)\sum_{j=0}^{N-1}\exp\left(i2\pi\left(\frac{k}{N} + \frac{1}{P}\right)j\right)$$

$$= \frac{\sin\pi(k - N/P)}{\sin\pi(k/N - 1/P)} \cdot$$

$$\exp\left(i\left\{\phi - \pi\left(\frac{k}{N} - \frac{1}{P}\right)(N-1)\right\}\right)$$

$$\text{Third term} = \exp(-i\phi)\sum_{j=0}^{N-1}\exp\left(i2\pi\left(\frac{k}{N} - \frac{1}{P}\right)j\right)$$

$$= \frac{\sin\pi(k + N/P)}{\sin\pi(k/N + 1/P)} \cdot$$

$$\exp\left(i\left\{\phi - \pi\left(\frac{k}{N} + \frac{1}{P}\right)(N-1)\right\}\right)$$

By omitting the first term of the DC component a to simplify the equation, the Fourier transformation value F(k) is given by the euqation below.

$$F(k) = \frac{\sin\pi(k - N/P)}{\sin\pi(k/N - 1/P)} \cdot \exp\left(i\left\{\phi - \pi\left(\frac{k}{N} - \frac{1}{P}\right)(N-1)\right\}\right) + \quad (28)$$

$$\frac{\sin\pi(k + N/P)}{\sin\pi(k/N + 1/P)} \cdot \exp\left(-i\left\{\phi + \pi\left(\frac{k}{N} + \frac{1}{P}\right)(N-1)\right\}\right)$$

Next, the magnitude of the maximum spectrum and adjacent spectra will be determined from the development formula of the Fourier transformation equation (28). The position $k_0$ of the virtual maximum spectrum is calculated as below from the equation (26).

$$K_0 = N/P = n_0 + \Delta \quad (29)$$

($n_0$: Integer, $|\Delta| < 0.5$)

where $n_0$ represents the position of the maximum spectrum determined by Fourier transformation, and $\Delta$ a fraction below the decimal point of the position of the virtual maximum spectrum. In equation (28), k is set to $n_0$ and the equation (29) is substituted thereinto. The maximum spectrum $F(n_0)$ for the position $n_0$ is thus determined in the manner shown by the equation below.

$$F(n_0) = \frac{\sin\pi(-\Delta\pi)}{\sin\pi(-\Delta\pi/N)} \cdot \exp\left(i\left\{\phi + \frac{\Delta\pi}{N}(N-1)\right\}\right) +$$

$$\frac{\sin\pi(2n_0 + \Delta)}{\sin\{\pi(2n_0 + \Delta)/N\}} \cdot$$

$$\exp\left(-i\left\{\phi + \frac{\pi(2n_0 + \Delta)}{N}(N-1)\right\}\right)$$

$$= \frac{\sin\Delta\pi}{\sin\pi(\Delta\pi/N)} \cdot \exp\left(i\left\{\phi + \Delta\pi - \frac{\Delta\pi}{N}\right\}\right) +$$

-continued $$\frac{\sin\Delta\pi}{\sin\pi\{(2n_0+\Delta)/N\}} \cdot$$
$$\exp\left(-i\left(\phi+\Delta\pi-\frac{2n_0\pi}{N}-\frac{\Delta\pi}{N}\right)\right)\}$$

where an approximation is made as shown below.

$$\sin\frac{\Delta\pi}{N} \approx \frac{\Delta\pi}{N}$$

$$\sin\frac{\pi(2n_0+\Delta)}{N} = \sin\left(\frac{2n_0\pi}{N}+\frac{\Delta\pi}{N}\right) \approx \sin\left(\frac{2n_0\pi}{N}\right)$$

Then $$F(n_0) = \frac{N\sin\Delta\pi}{\Delta\pi} \cdot \exp(i(\phi+\Delta\pi)) +$$
$$\frac{N\sin\Delta\pi}{2n_0\pi} \cdot \exp\left(-i\left(\phi+\Delta\pi-\frac{2n_0\pi}{N}\right)\right)]$$
$$= \frac{N\sin\Delta\pi}{\pi}\left\{\frac{1}{\Delta}\exp(i(\phi+\Delta\pi)) + \frac{1}{2n_0}\exp\left(-i\left(\phi+\Delta\pi-\frac{2n_0\pi}{N}\right)\right)\right\}$$

If the coefficient $N\sin\Delta\pi/\pi$ is omitted to determine the real number section R and the imaginary number section I of the vector of the maximum spectrum $F(n_0)$, the equation shown below is obtained.

$$R = \frac{1}{2n_0}\cos\left(\phi+\Delta\pi-\frac{2n_0\pi}{N}\right) + \frac{1}{\Delta}\cos(\phi+\Delta\pi)$$
$$I = \frac{1}{2n_0}\sin\left(\phi+\Delta\pi-\frac{2n_0\pi}{N}\right) + \frac{1}{\Delta}\sin(\phi+\Delta\pi)$$

This equation is further developed by considering $\phi+\Delta\pi$ as $\phi$. Then the real number section R and the imaginary number section I of the vector of the maximum spectrum $F(n_0)$ is rewritten as below.

$$R = \frac{1}{2n_0}\left\{\cos\Phi\cos 2n_0\frac{\pi}{N} + \sin\Phi\sin 2n_0\frac{\pi}{N}\right\} + \frac{1}{\Delta}\cos\Phi$$
$$\approx \frac{1}{2n_0}\cos\Phi\cos 2n_0\frac{\pi}{N} + \frac{\pi}{N}\sin\Phi + \frac{1}{\Delta}\cos\Phi$$
$$= \left(\frac{1}{2n_0}\cos 2n_0\frac{\pi}{N} + \frac{1}{\Delta}\right)\cos\Phi + \frac{\pi}{N}\sin\Phi$$

In similar fashion, $$I = -\left(\frac{1}{2n_0}\cos\frac{2n_0\pi}{N} - \frac{1}{\Delta}\right)\sin\Phi + \frac{\pi}{N}\cos\Phi$$

Now, in the same manner, it is possible to obtain the real number section and the imaginary number section of these vectors from the spectra $F(n_0-1)$, $F(n_0+1)$ adjacent to the maximum spectrum $F(n_0)$. These results are summarized below.

real number section of $F(n_0-1)$:

$$R'' = \left(\frac{1}{2n_0}\cos\frac{2n_0\pi}{N} + \frac{1}{\Delta+1}\right)\cos\Phi + \frac{\pi}{N}\sin\Phi$$

Imaginary number section of $F(n_0-1)$:

$$I'' = -\left(\frac{1}{2n_0}\cos\frac{2n_0\pi}{N} - \frac{1}{\Delta+1}\right)\sin\Phi + \frac{\pi}{N}\cos\Phi$$

Real number section of $F(n_0)$:

$$R = \left(\frac{1}{2n_0}\cos\frac{2n_0\pi}{N} + \frac{1}{\Delta}\right)\cos\Phi + \frac{\pi}{N}\sin\Phi$$

Imaginary number section of $F(n_0)$:

$$I = -\left(\frac{1}{2n_0}\cos\frac{2n_0\pi}{N} - \frac{1}{\Delta}\right)\sin\Phi + \frac{\pi}{N}\cos\Phi$$

Real number section of $F(n_0+1)$:

$$R' = \left(\frac{1}{2n_0}\cos\frac{2n_0\pi}{N} + \frac{1}{\Delta-1}\right)\cos\Phi + \frac{\pi}{N}\sin\Phi$$

Imaginary number section of $F(n_0+1)$:

$$I' = -\left(\frac{1}{2n_0}\cos\frac{2n_0\pi}{N} - \frac{1}{\Delta-1}\right)\sin\Phi + \frac{\pi}{N}\cos\Phi$$

where $\Phi=\phi+\Delta\pi$.

In this way, once the vectors (real and imaginary number sections) of the maximum spectrum $F(n_0)$ and the adjacent spectra $F(n_0-1)$, $F(n_0+1)$ are defined, the deviation (fraction) $\Delta$ of the position of the virtual maximum spectrum from $n_0$ is capable of being estimated from the operation shown below. Using the real number section from equation (30).

$$R - R' = \left(\frac{1}{\Delta} - \frac{1}{\Delta-1}\right)\cos\Phi$$
$$R - R'' = \left(\frac{1}{\Delta} - \frac{1}{\Delta+1}\right)\cos\Phi$$

Erasing $\cos\phi$, $$\frac{R-R'}{R-R''} = -\frac{\Delta+1}{\Delta-1}$$

From this, the fraction $\Delta$ is determined as $$\Delta = \frac{R'-R''}{R'-2R+R''} \qquad (31)$$

The fraction $\Delta$ may also be determined in similar fashion by using the imaginary number section of equation (30).

$$\Delta = \frac{I'-I''}{I'-2I+I''} \qquad (32)$$

The variables on the right side of the equations (31) and (32) represent the real and imaginary number sections of the spectrum determined by Fourier transformation, and therefore it is possible to estimate the fraction $\Delta$ for the position of the virtual maximum spectrum by the operation of equation (31) or (32). As a result, once the fraction $\Delta$ is determined by these operations, the period P of the sinusoidal wave subjected to Fourier transformation is calculated from the following equation by using equation (29).

$$P = \frac{N}{n_0 + \Delta} \tag{30}$$

Also, as long as the fraction $\Delta$ is determined by the operation of equation (31) or (32), the phase $\phi$ of the sinusoidal wave subjected to Fourier transformation may be calculated by the calculations below. From equation (30), $$R - R' = \left(\frac{1}{\Delta} - \frac{1}{\Delta - 1}\right)\cos\Phi$$

$$I - I' = \left(\frac{1}{\Delta} - \frac{1}{\Delta - 1}\right)\sin\Phi$$

By dividing the two sides of the equations by each other respectively, $$\tan\Phi = \tan(\phi + \Delta\pi) = \frac{I - I'}{R - R'}$$

Thus, the phase $\phi$ is determined from the equation below.

$$\phi = \tan^{-1}\left(\frac{I - I'}{R - R'}\right) - \Delta\pi \tag{35}$$

According to the present invention, the basic disadvantage of inaccuracy of the discrete Fourier transformation is obviated. For any period of a sinusoidal wave, therefore, the position of a virtual maximum spectrum is determined by a theoretical formula from a discrete spectrum based on the discrete Fourier transformation, whereby it is possible to detect the period and phase of a sinusoidal wave very accurately. Also, this fact may be effectively used to detect the period and phase of an optical interference fringe thereby to realize a very accurate measurement of the inclination and height of a surface of an object.

BRIEF DESCRIPTION OF THE DRAWINGS

FIGS. 4A–4C are diagrams for explaining an embodiment of a processing circuit.

FIG. 5, FIG. 6 and FIG. 7 are diagrams showing the relationship between incident angle, (and) reflection and the refraction complex amplitude, and the characteristics of a noise composition.

FIG. 17 is a diagram for explaining the amplitude component of the irradiation detection light.

FIG. 25 and FIG. 26 are diagrams showing a configuration of the apparatus according to an embodiment of the present invention respectively.

FIG. 35 and FIG. 36 are diagrams for explaining the embodiment shown in FIG. 33.

FIG. 37 is a diagram showing an embodiment of the present invention.

FIG. 44A, FIG. 44B and FIG. 44C are diagrams showing the relationship between the detection error, the phase of reflected light and the amplitude of the reflected light due to the phase change with the change in resist thickness.

FIG. 47A, FIG. 47B and FIG. 47C are diagrams showing a method of processing the detected interference fringe information and selecting a wavelength according to an embodiment of the present invention.

FIG. 48 is a diagram showing an embodiment of the present invention.

FIG. 50 and FIG. 51 are diagrams for explaining the principle of the present invention.

FIG. 53, FIG. 54, FIG. 55, FIG. 56 and FIG. 57 are diagrams showing the effect of the present invention respectively.

FIG. 58 is a diagram showing the light irradiated at a large angle to an uneven rough pattern and reflected.

FIG. 59 is a partially enlarged view of FIG. 58.

FIG. 60 is a diagram showing a configuration according to another embodiment of the present invention different from FIG. 49.

FIG. 66 is a diagram showing a flow of operation of the arithmetic means 2, 2' shown in FIG. 52 and FIG. 65.

BEST MODE FOR CARRYING OUT THE INVENTION

Figure 1:
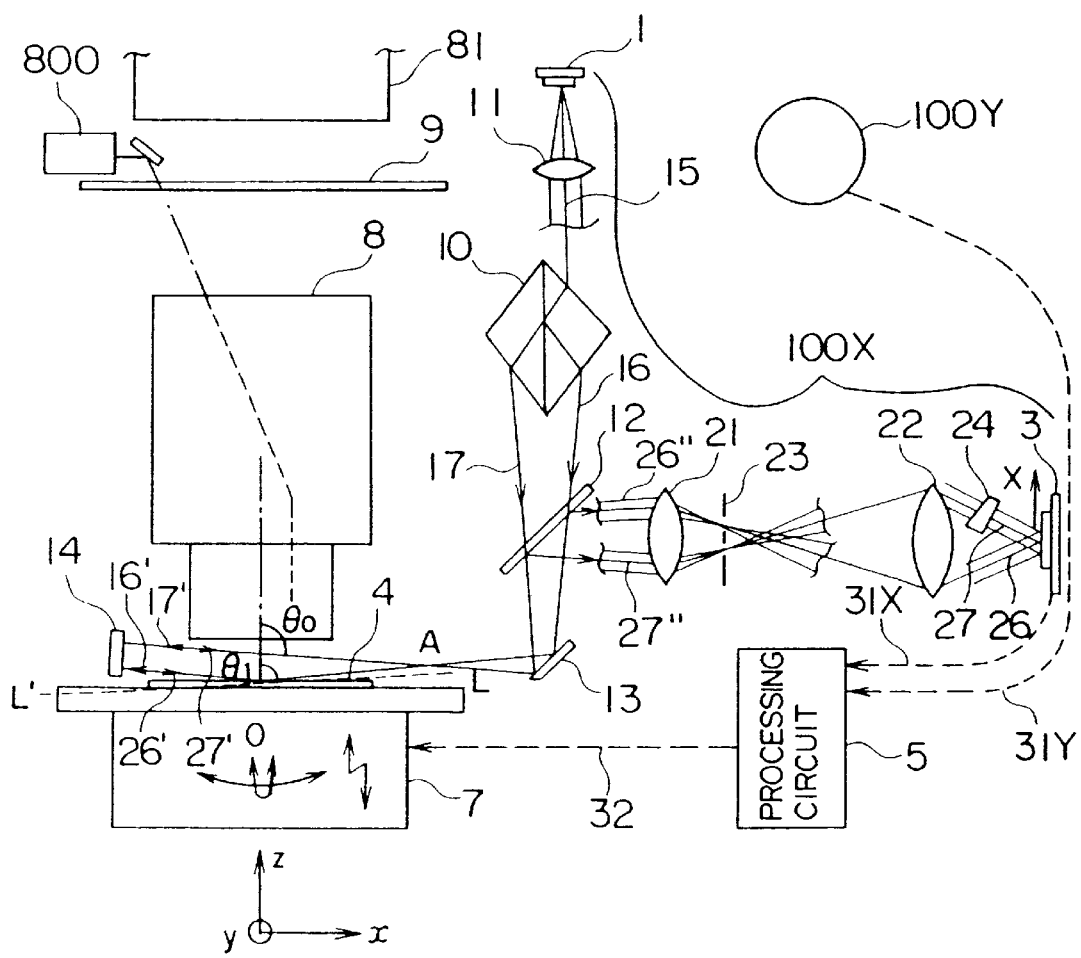
FIG. 1 is a diagram showing a configuration including a return detection optical system according to an embodiment of the present invention.

An embodiment of the present invention will be explained below with reference to FIG. 1. An exposure light ray emitted from an exposure light illumination system 81 illuminates a reticle 9, and the light transmitted therethrough is projected as a compressed image of a pattern of the reticle on the surface of a wafer 4 on a stage 7 through a reduction (compression) projection lens 8. Relative positions of the reticle 9 and the wafer 4 are detected by an alignment system 800, and a superposed exposure of a pattern is effected by fine control of the reticle 9 or the wafer 4. 100x designates a system for detecting the inclination and height in X direction. A similar optical system is also provided, though not shown, for the inclination in Y direction. The detection system will be explained below.

Figure 2:
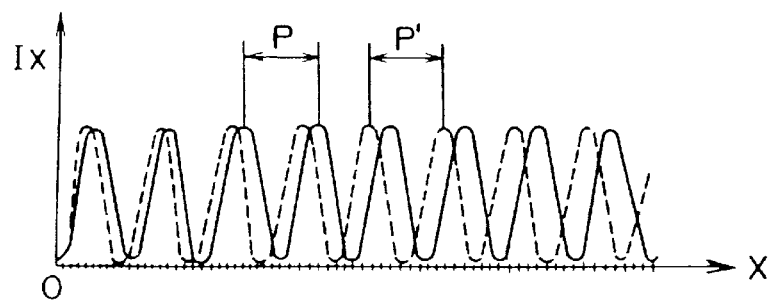
FIG. 2 is a diagram showing a detection pattern signal waveform.

The light emitted from a coherent light source 1 such as a semiconductor laser is converted into parallel beams 15 by a lens 11. The parallel beams 15 are separated into parallel beams 16 and 17 by a beam splitter prism 10. The parallel beams 16 are irradiated at an incident angle $\theta_1$ (88 degree) on a photoresist on the uppermost surface of the wafer 4 providing an object to be exposed on the stage 7 having mounted thereon a vertical two-axis gate mechanism through a beam splitter 2 and a mirror 13 making up illumination means. As described above, almost all the light is reflected on the surface of the photoresist and the reflected objective light 16' enters the plane mirror 14 providing a return detection optical system from the perpendicular direction, and proceeding along the original light path in the opposite direction, is reflected on the object of exposure 4, and further through a mirror 13, a beam splitter 12, a lens 21, a fine open plate 23 and a lens 22, reaches pattern detection means 3 as an objective light 26". A reference light 17 separated by the beam splitter 10, on the other hand, proceeds in the same direction along substantially the same light path as the irradiated light 16 (strictly, along the direction at an angle of 92 degree to the wafer normal), is reflected in perpendicular direction on the plane mirror 14, proceeds as a reference light 27" along substantially the same route as the objective light 26", and reaches the pattern detection means 3 through a wedge glass 24. The path of the reference light is different from the objective light path in that the former light is not reflected on the object of exposure 4 but passes through the wedge glass 24. The lenses 21 and 22 have the incident parallel beams emitted therefrom in the form of parallel beams, and cause an image to be formed substantially on a pattern detector of the position of irradiation of the irraidated light, that is, an exposure area 0 on a wafer. Now, assume that there is no wedge glass provided, and the intersection A of the objective light and the reference light returned by reflection on the wafer has an image thereof formed rearward of the light-receiving surface of the pattern detection means. This indicates that the two light beams are displaced on the light receiving surface. To cope with this, a wedge glass is inserted in the reference light (or objective light) to enable the two beams to cross on the light-receiving surface and form an image of the exposure area 0. The fine open plate 23 arranged in the return detection optical system is located at the convergence point of the objective light and the reference light which are parallel beams entering the lens 21, with a very small opening at the convergence point. This fine open plate eliminates the back reflected light generated in the lens or pattern detection means which is the problem in using a laser beam of high coherency, and thus prevents a noise beam from being superposed on the light-receiving surface of the pattern detection means. The interference fringe detected at the pattern detection means 3 has an intensity distribution Ix shown in FIG. 2. The pattern detection means 3 is a one-dimensional array sensor, and the intensity value is determined by the position marked on the X axis in FIG. 2. This data is transmitted to the processing circuit 5. If the surface of the exposure area of the wafer coincides with the image-forming surface of the reticle 9 in an exposure image-forming system in horizontal plane (4 in FIG. 3), the interference fringe of a pitch P shown by solid line in FIG. 2 is produced. If the surface of the exposure area is inclined by a as shown by dotted line LL' in FIG. 3 or FIG. 1, on the other hand, as obvious from FIG. 3, the first reflected light is inclined by $2\alpha$ and the returned second reflected light by $4\alpha$. As a result, the interference fringe obtained by the pattern detection means provides a pitch P' indicated by a dotted line in FIG. 2. The interference signal produced in the detection means is applied to the processing circuit 5 shown in FIG. 4 by a transmission line 31. The input signal is first subjected to A/D conversion at a timing corresponding to each point marked along the abscissa in FIG. 2 and then applied to an FFT circuit. This FFT input signal is in the form as shown in FIG. 4B, and the result of FFT is obtained in the form of a complex number C(k) such that as shown in FIG. 4C, a spectrum peak is present at k=0 and k=m generally (the ordinate of this graph is |C(k)|, however). The value k=0 corresponds to the bias component of a sinusoidal wave and k=m the period thereof. The value m corresponds to the pitch P. Since the output is obtained only in discrete form, however, the true position of the spectrum peak is determined by interpolation from C(m) and the neighbouring data thereby to determine the inclination $\Delta X$. Also, the information $\Delta Z$ on the height (Z) is obtained from the phase $(\tan^{-1}(\text{Im}(C(m))/\text{Re}(C(m)))$ of the complex number C(m). The values $\Delta\psi_x$ and $\Delta Z$ obtained in this way and the value $\Delta\psi_y$ obtained in similar fashion at the processing circuit 5 from the interference fringe information along Y direction produced in the Y-direction direction system not shown in FIG. 1 are used as a basis for controlling the vertical two-axis gate mechanism on the stage 7, thereby registering the image-forming surface and the photoresist surface with each other in the desired positional relationship.

Figure 8:
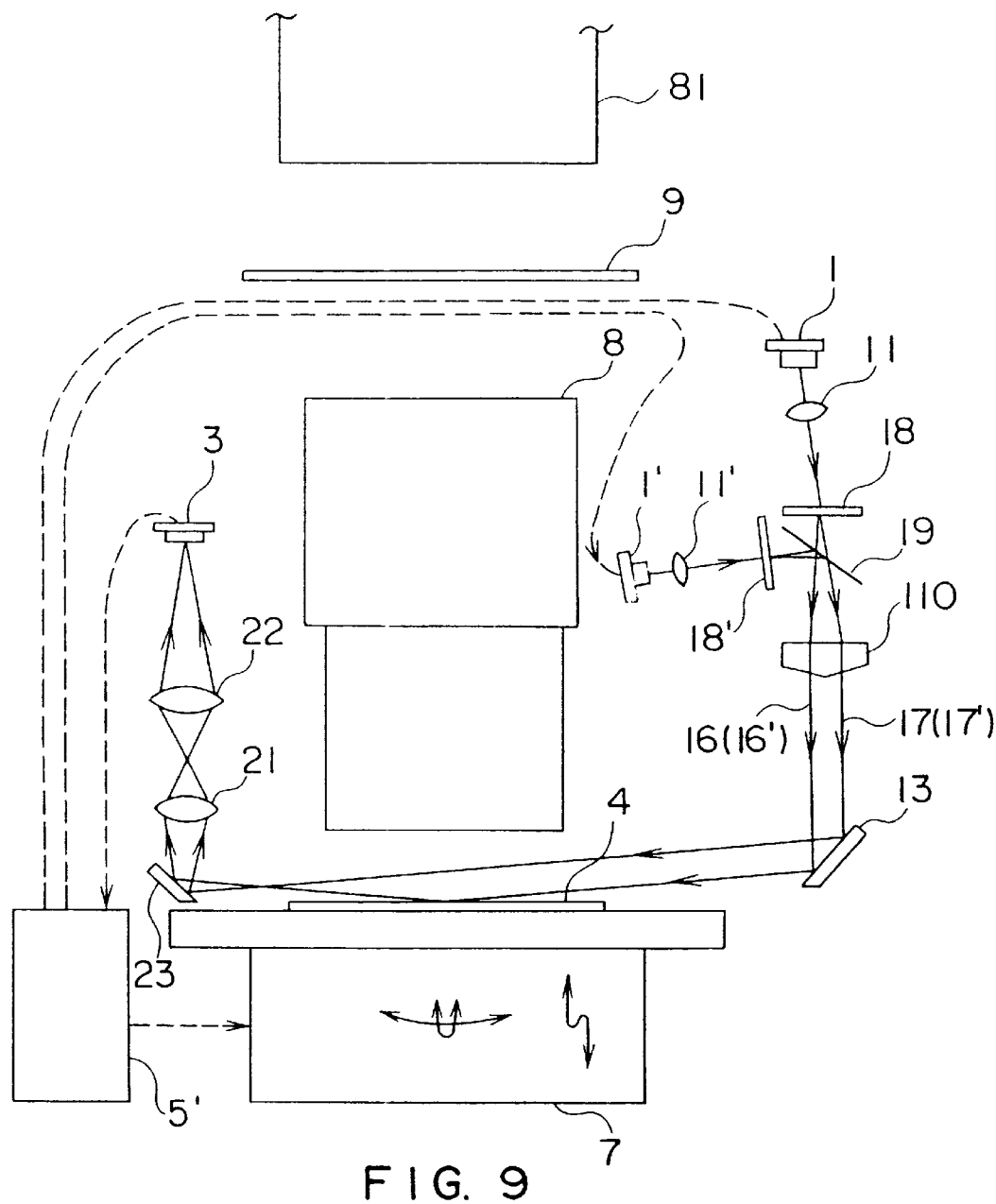
FIG. 8 is a diagram showing a configuration using two wavelengths according to an embodiment of the present invention.
Figure 9:
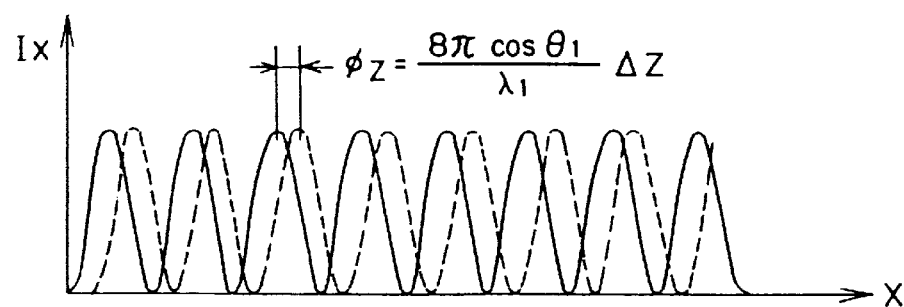
FIG. 9 is a diagram showing a change in the detection pattern signal with the change in height.

FIG. 8 shows an embodiment of the present invention. The component elements designated by the same reference numerals as those in FIG. 1 correspond to those elements designated by the same reference numerals respectively. Also, as in FIG. 1, the diagram of a system for detecting the Y-direction inclination is not shown. The semiconductor laser 1 has a wavelength of $\lambda_1$ and the semiconductor laser 1' a wavelength of $\lambda_2$. The wavelength $\lambda_1$ is 810 nm, and $\lambda_2$ 750 nm, for instance. The light beams emitted from the semiconductor lasers 1, 1' are converted into parallel light beams at 11 and 11' respectively, and are separated into zero-order and first-order parallel beams through diffractive gratings 18, 18'. The four parallel beams thus separated are applied through a wavelength separation mirror 19 in such a manner that the beam of $\lambda_1$ is transmitted and the beam of $\lambda_2$ reflected, so that the four beams become mutually parallel through a prims 110. The beams 16, 16' having wavelengths $\lambda_1$, $\lambda_2$ are passed through exactly the same light path, are reflected on a mirror 13, and enter a wafer at an angle of $\theta_1$. The reflected light becomes an objective light, which enters the pattern detection means 3 through a detection optical system including a mirror 23 and lenses 21, 22. The beams 17 and 17' having wavelengths $\lambda_1$ and $\lambda_2$, on the other hand, pass through exactly the same reference light path and enter the pattern detection means 3 at an angle to the objective light. The objective light path and the reference light path go through exactly the same optical parts except that one is reflected on the wafer surface. A processing circuit 5' causes the semiconductor lasers 1 and 1' to flicker alternately and receives the interference fringe information of the wavelengths $\lambda_1$ and $\lambda_2$ from the pattern detection means 3. FIG. 9 shows interference fringe information of the wavelength $\lambda_1$ received at the processing circuit. The solid line designates the one at the best height, and the dotted line at a height changed by $\Delta Z$. These two detection signals, unless changed in inclination, generate a phase difference $\Delta\phi_z$ of the value shown below.

$$\Delta\phi_z = \frac{4\pi\cos\theta_1}{\lambda_1}\Delta Z \quad (32)$$

Figure 10:
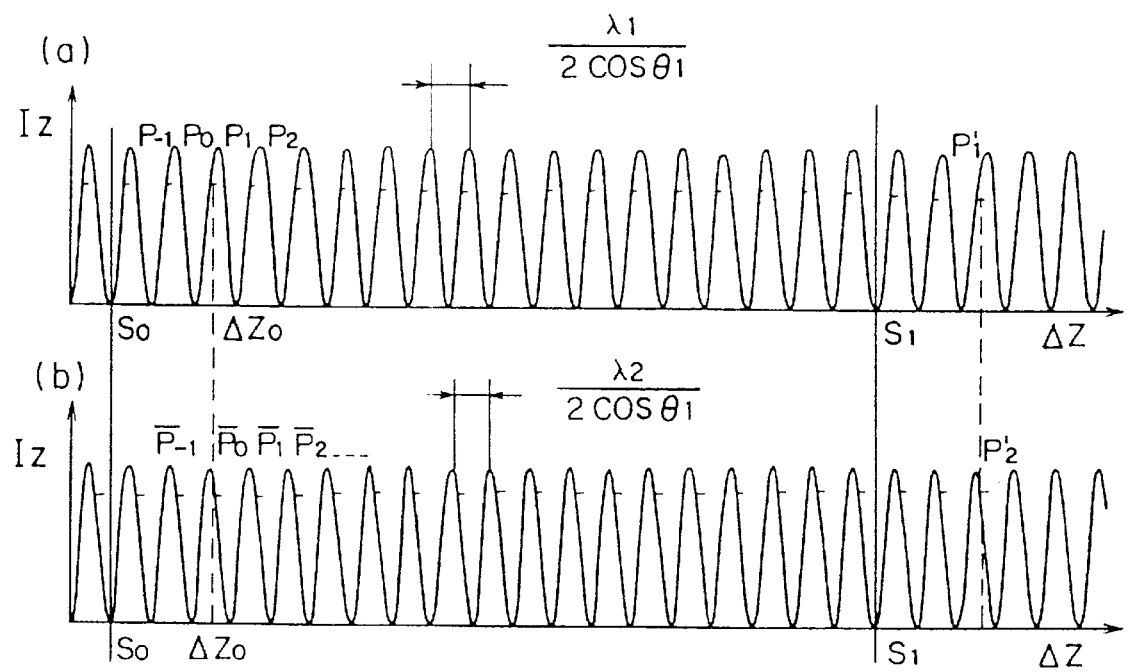
FIG. 10 show diagrams (a) and (b) indicating a change in a signal Iz at a set point with the height change $\Delta Z$ at the time of detection with two wavelengths $\lambda_1$, $\lambda_2$.

In the case of determining $\Delta Z$ from the phase difference $\Delta\phi_z$ thus detected, however, an indefinite nature described below is presented.

$$\Delta Z = \frac{\lambda_1}{2\cos\theta_1}\left(\frac{\Delta\phi_z}{2\pi}+n\right) \quad (33)$$

where n is an integer. Assuming that $\lambda_1$ is 0.81 $\mu$m and $\theta_1$ 88 degree, then the true value 11.6×n $\mu$m has an indefinite value. According to this embodiment, this problem is solved by the second wavelength $\lambda_2$. Diagram (a) in FIG. 10 shows the detection intensity $I_z$ against the height change of the wafer surface at a reference position (x=x$_0$) at the time of detection with the wavelength of $\lambda_1$, and diagram (b) in FIG. (10) shows a similar detection intensity at the time of detection with the wavelength of $\lambda_2$. The intensity of the pattern detected is given by $$I(X, \Delta Z; \lambda_1) = a + b\cos\left\{\frac{\cos\phi_0 + \cos(\theta_1 + 2\Delta\theta)}{\lambda_i}\frac{X}{M} + \frac{4\pi\cos\theta_1}{\lambda_i}\Delta Z\right\} \quad (34)$$

where X is the coordinate of the light-receiving surface of detection means, and M an image-forming magnification. As a result, $I_z = I(X_0, \Delta Z; \lambda_1)$. If it is assumed that the phase value detected with $\lambda_1$ is $\Delta\psi_1$, and the height corresponding thereto is associated with $P_{-2}, P_{-1}, P_1, P_2, P_3, \ldots$, then a point is unknown to which $\Delta Z$ taking a true value corresponds. If the phase value detected with $\lambda_2$ is $\Delta\psi_2$, a corresponding value of $\Delta Z$ is $P_{-1}, P_0, P_1, P_2, \ldots$ in FIG. 10. The interval $S_1S_0$ between $\Delta Z=S_0$ where a synchronization occurs and $\Delta Z=S_1$ where the next synchronization occurs is given by the equation below.

$$S_1S_0 = \frac{\lambda_1\lambda_2}{2\cos\theta_1(\lambda_1-\lambda_2)} \quad (35)$$

During this interval, the phase of $\lambda_1$ becomes $\Delta\psi_1$ and that of $\lambda_2$ takes the value $\Delta\psi_2$ only at a point of $\Delta Z_0$. The value of $\Delta Z$ satisfying this condition is provided by the height expressed by $$\Delta Z = \Delta Z_1 + mS_1S_0 \quad (36)$$

where m is an integral number.

When $\lambda_1=0.81$ $\mu$m, $\lambda_2=0.75$ $\mu$m and $\theta_1=88$ degree, then $S_1S_0$ assumes the value of 145 $\mu$m. The height of the wafer surface would not change over this wide range, and should wafers of different types of different thicknesses be used, the values are known in advance, therefore, no problem is posed. In the embodiment shown in FIG. 1, a return plane mirror is used to cause double reflections, and therefore the value corresponding to $S_1S_0$ is 72.5 $\mu$m, which is one half that for the embodiment of FIG. 8.

Figure 11:
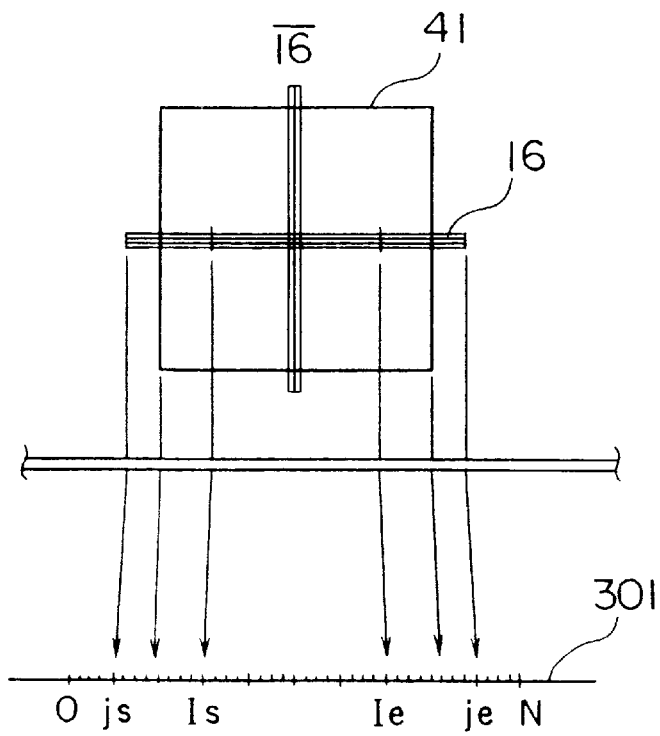
FIG. 11 and FIG. 12 are diagrams showing the light irradiated on an exposed area and an operational processing area.
Figure 12:
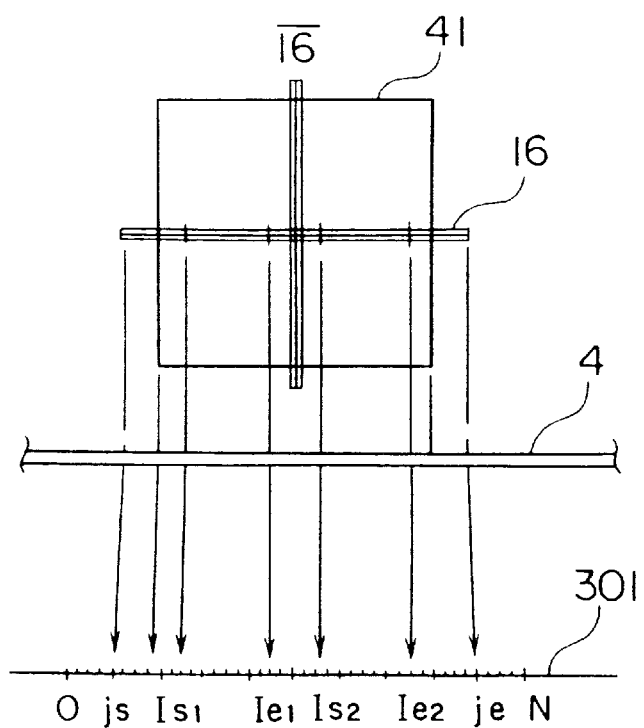

FIG. 11 shows illumination light rays 16, 16 in X and y directions for an area 41 exposed on the wafer by one exposure step. The location of the illumination light ray 16 on the wafer corresponds to the address of the array element of the light-receiving surface 301 of the pattern detection means 3. Among the addresses js to je corresponding to the whole illumination area, only the desired ones are taken out. For example, areas Is to Ie are taken out in FIG. 11, or areas $Is_1$ to $Ie_1$ and $Is_2$ to $Ie_2$ in FIG. 12, thus facilitating the execution of FFT using only these data. In this way, a given portion may be designated, and therefore if a portion containing a fine pattern is designated as a detection area while removing rough patterns, it is possible to determine the inclination and height of the fine pattern accurately and thereby to effect exposure at a point nearer to the focal point.

Figure 13:
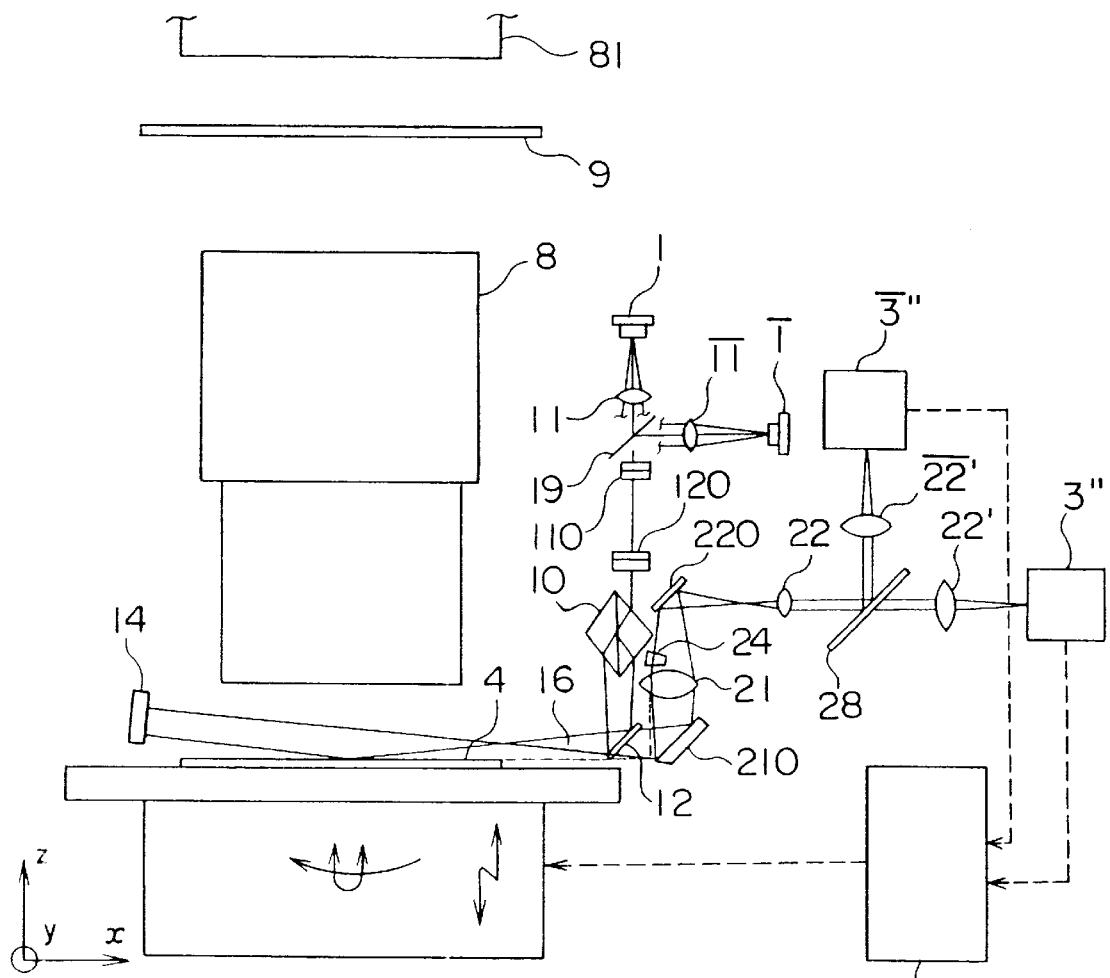
FIG. 13 is a diagram showing a configuration for two-dimensional detection with two wavelengths according to an embodiment of the present invention.
Figure 14:
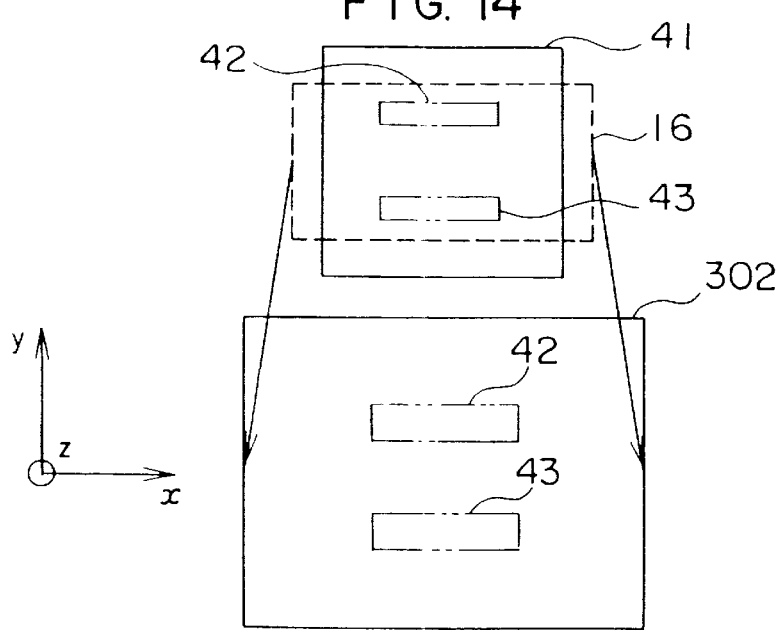
FIG. 14 is a diagram showing an operational processing area for an exposure area according to the embodiment showin in FIG. 13.

FIG. 13 shows an embodiment of the present invention. The reference numerals identical to those in FIGS. 1 and 8 designate corresponding component parts respectively. The light beams emitted from the semiconductor lasers 1 and $\overline{1}$ of wavelengths $\lambda_1$ and $\lambda_2$ become parallel light beams through collimating lenses 11 and $\overline{11}$ to proceed on the same light path by a wavelength separation mirror 19. Cylindrical lenses 110 and 120 are used for widening the beam size in y direction. FIG. 14 shows the irradiated light 16 (dotted line) thus widened, against the exposure area 41 on the wafer 4. The irradiated part has an image thereof formed on the light-receiving surface 302 of the pattern detection means 3" and $\overline{3}$" including a two-dimensional array element. Of the interference fringes at the irradiated parts obtained two-dimensionally, the information on only the desired areas 42, 43 shown in FIG. 14 are processed arithmetically. Once the inclination and height in x direction are determined at each of the areas 42 and 43, the inclination and height in x and y directions are determined for the whole surface of 41.

Figure 15:
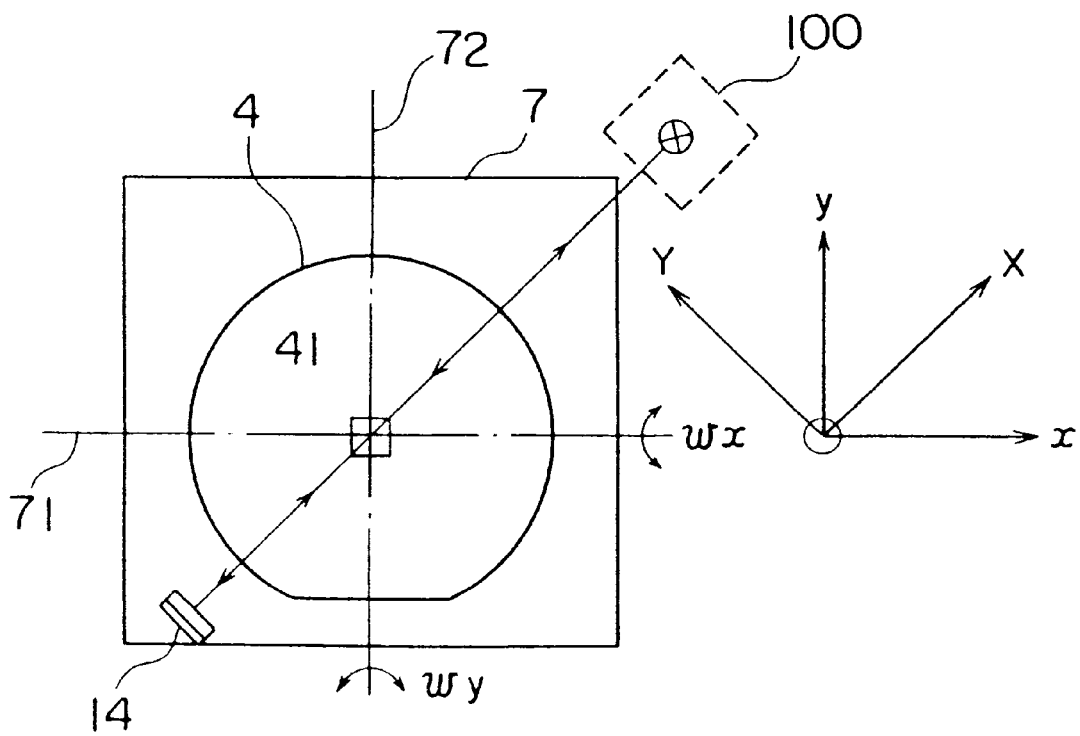
FIG. 15 is a diagram showing means for detecting the inclinations in two directions by a single detection system according to an embodiment of the present invention.
Figure 16:
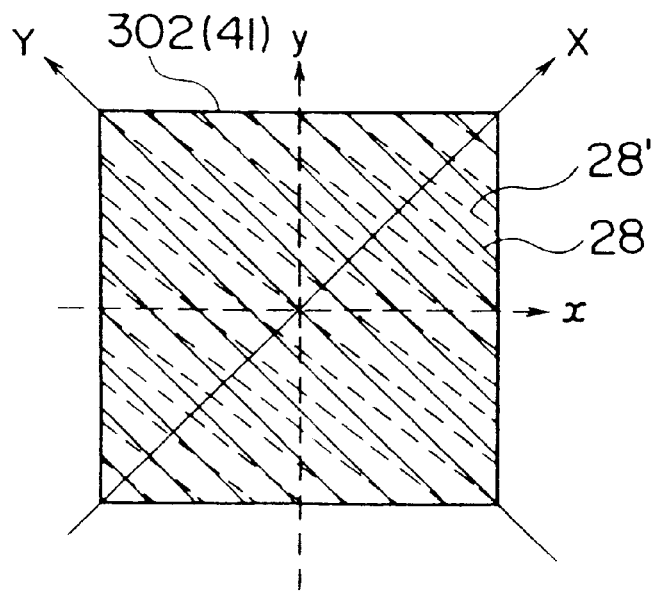
FIG. 16 is a diagram showing a detection pattern thereof.

FIG. 15 shows an embodiment of the present invention. This diagram is a plan view, in which the exposure optical system of a projection exposure apparatus is not shown. The stage is rotatable in fine manner by wx, wy around the rotational axis 71 along x direction and the rotational axis 72 along y direction of a stage drive mechanism. The irradiation light is irradiated for detection of inclination and height from a direction (x direction) at an angle of 45 degree to the exposure area 41 on the wafer 4, and the reflected light is returned in perpendicular direction to a plane mirror 14 for detection by the inclination and height detection optical system 100. According to the present embodiment, the detection light has an inclination of 45 degree against the two-axis drive mechanism, and an interference pattern as shown in FIG. 16 is generated on the two-dimensional imaging surface of the pattern detection means. The interference pattern is shown by solid line when the wafer surface is kept horizontal, and by dotted line when it is inclined along y direction. If the pitch and phase along x and y directions on the imaging surface are determined, therefore, it is possible to determine the inclination and height along x and y directions from a single detection optical axis system. Also, in the embodiment of FIG. 15, the light beam may be divided into two parts immediately before the pattern detection means to detect the inclination and height along x and y directions by different pattern detection means.

An embodiment has been described above with reference to a semiconductor exposure apparatus. The present invention, however, is similarly applicable very effectively to an exposure apparatus for a display device such as a liquid crystal display.

Figure 18:
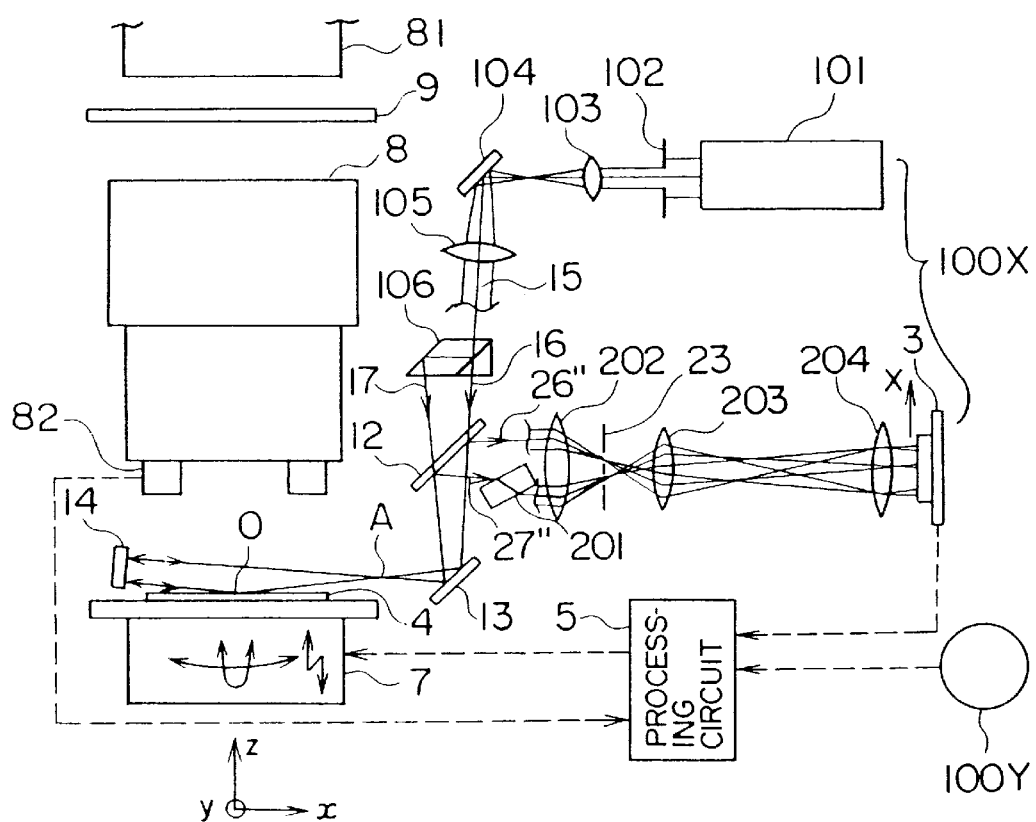
FIG. 18 is a diagram showing a configuration using the air micrometer for further improvement of the optical system according to an embodiment of the present invention.

FIG. 18 shows an embodiment of the present invention. The same reference numerals as in FIG. 1 designate corresponding component parts respectively. The difference from FIG. 1 lies in the following five points: (1) a tube-type laser 101 typically represented by an He-Ne laser or the like is used as a laser light source, and a pinhole plate 102 for selecting part of the laser beam (central part of Gauss distribution) is installed at a position conjugate with the return plane mirror 14; (2) The number of reflections of the beam 15 which passes through a beam splitter 12, returns from the mirror 14 and reaches the pattern detection means 3 is even or odd on both the reference light and objective light paths; (3) The pattern detection means 3 is in conjugate (image-forming) relations with the return plane mirror 14, and the parallel plane glass 201 for forming an iamge on the pattern detection means 3 is inserted into the reference light path 27" (or the objective light path 26") in such a manner that the intersection A of the objective light reflected and returned from the wafer surface and the reference light has an image thereof formed on the pattern detection means 3; (4) The correction lens 204 is inserted immediately before the pattern detection means 3 in such a manner that the objective light entering the pattern detection means 3 and the reference light form a plane wave; and (5) The air micrometer 82 is used to detect the height of the wafer 4.

The light which is emitted from the laser light source 101 enters a minute opening of the pinhole plate 102 at a position conjugate with the return plane mirror 14 and selects the central part of the Gauss distribution. Then, the light is rendered parallel beams 15 of the desired size, entering the beam splitter 106. The parallel light 15 is separated into parallel light beams 16 and 17 by the beam splitter 106. The parallel light beam 16 is transmitted through the beam splitter 106 (zero in the number of reflections), and the parallel beam 17 is reflected twice in the beam splitter 106. This is in order to enable the beam 15 to pass through the beam splitter 12, to be reflected on the mirror 14 and to reach the pattern detection means 3, while in the process being reflected an even or odd number of times either in the reference light path or the objective light path respectively. By thus setting the number of reflections, the fluctuations of the crossing angle of the reference light and the objective light are minimized in case of a change in the direction of the incident light 15 to the beam splitter 106, with the result that the change in the interference fringe pitch is substantially eliminated and a detection of high accuracy is made possible. Accoridng to the present embodiment, the reference light and the objective light beams are both reflected six times, that is, an even number of times, after being splitted in the beam splitter 106 before reaching the pattern detection means. The parallel beams that have left the beam splitter 106 are passed through the beam splitter 12 and the mirror 13, and are reflected in substantial entirety thereof on the photoresist surface on the upper-most plane of the wafer 4 making up an object to be exposed on the stage 7 carrying a vertical/two-axis drive mechanism, and thus enters at the right angle to the return plane mirror 14. The parallel light beam 16 reflected on the return plane mirror 14 returns along the original light path and reaches the pattern detection means 3 through the mirror 13, the beam splitter 12, the lens 202, the minute opening plate 23 and the lenses 203, 204 as an objective light beam 26". The parallel light 17 separated in the beam splitter 106, on the other hand, proceeds along substantially the same light path as the parallel light beam 16, and returns along the original light path after directly entering at the right angle to the return mirror 14 through the beam splitter 12 and the mirror 13. This light beam is thus passed as a reference light beam 27" through the mirror 13, the beam splitter 12, the parallel plane glass 201, the lens 202, the minute opening plate 23 and the lenses 203, 204 and reaches the pattern detection means 3. The reference light path is diferent from the objective light path in that the former light is not reflected on the object to be exposed 4 and passes through the parallel plane glass 201. The lenses 202, 203, 204 enables the plane perpendicular to the optical axis between the reflection surface of the return plane mirror 14 and the center of exposure 0 to be formed as an image on the pattern detection means 3. This is in view of the need to make clear the correspondence between the position in the interference fringe and the position on the wafer when the inclination and height are to be detected only from the information on the parts corresponding to the desired place on the object to be exposed. By employing the above-mentioned configuration, it is possible to form a wafer image in the light paths in both ways substantially equally on the pattern detection means 3, thus permitting a high-accuracy detection even in the case of partial detection. In the case where an image of a plane perpendicular to the optical axis between the reflection surface of the return plane mirror 14 and the exposure center 0 is formed on the pattern detection means 3, however, the failure of coincidence between the exposure area and the intersection A makes it impossible to superpose the reference light and the objective light on each other as they are on the pattern detection means 3. In order to obviate this inconvenience, a parallel plane glass 201 is inserted in the reference light path 27" (or the objective light path 26") so that the reference light may be moved in parallel direction to superpose the reference light and the objective light on each other on the pattern detection means 3. The lens 204 is for correcting the spherical waves of the reference light and the objective light caused by the lenses 202 and 203 into plane waves, and is arranged immediately before the pattern detection means 3. By thus making plane waves of the two waves, the fluctuations in the interference fringe pitch are eliminated to assure a high detection accuracy.

Figure 21:
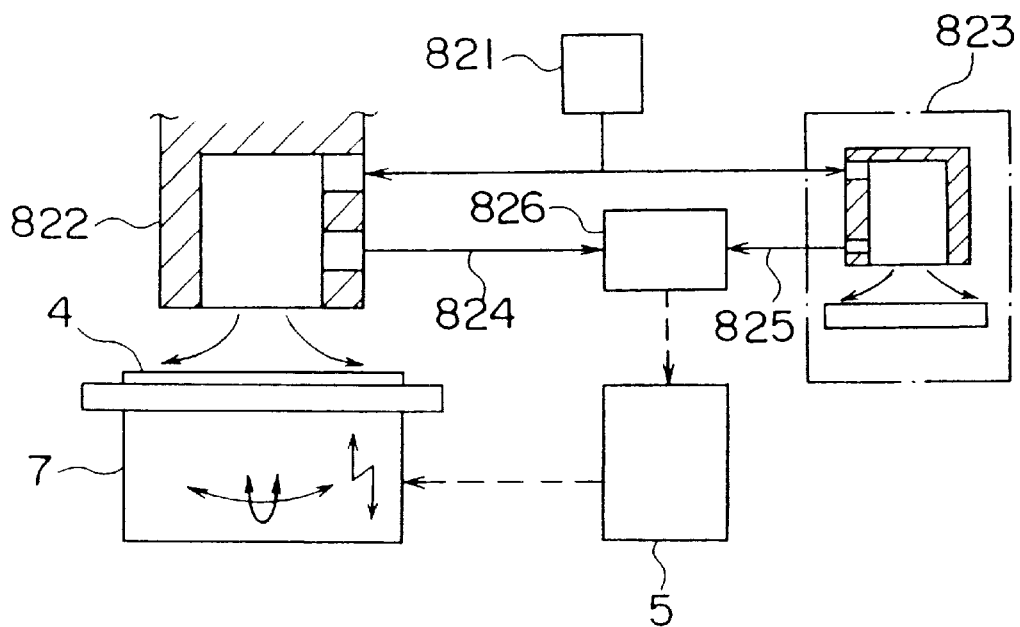
FIG. 21 is a diagram showing the principle of the air micrometer according to the present invention.

The present method of detection has posed the problem of indefiniteness of wafer height as indicated by equation (33) in the detection of single wavelength. Although a method of solution by double-wavelength illumination was described above, the problem may also be solved by using other wafer detection means at the same time. According to the present embodiment, the problem is obviated by employing the air micrometer 82 at the same time. Specifically, in a range before accurate height detection is made possibly by use of the present method of detection represented by equation (32), the wafer height is positioned by air micrometer, whereas the present detection method is used for $\Delta Z$ in the range with the phase of $\Delta \phi z$ changing from zero to $2\pi$ as indicated by equation (32). As another method, the wafer height may be detected by other detection means such as air micrometer, and the wafer inclination by the present method. FIG. 21 shows the principle of the air micrometer. The pressurized air is supplied from an air pressure source 821 to an air micronozzle 822 and a reference air micrometer 823. The pressure difference between the back pressure 824 in the air micronozzle dependent on the gap between the air micronozzle 822 and the wafer 4 and the back pressure 825 of the reference air micrometer 823 is converted into an electrical signal by a differential pressure converter 826 until the differential pressure becomes zero while the height of the stage 7 is controlled by a processing circuit 5.

Figure 19:
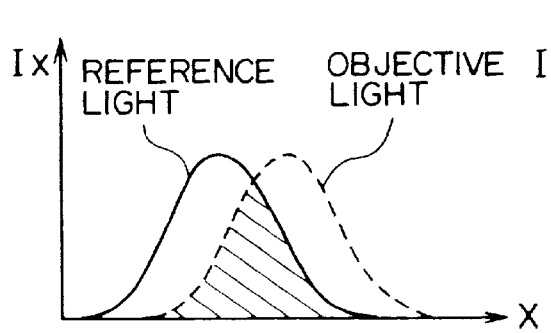
FIG. 19 and FIG. 20 are diagrams for explaining the effect of an illumination method according to the present invention respectively.
Figure 20:
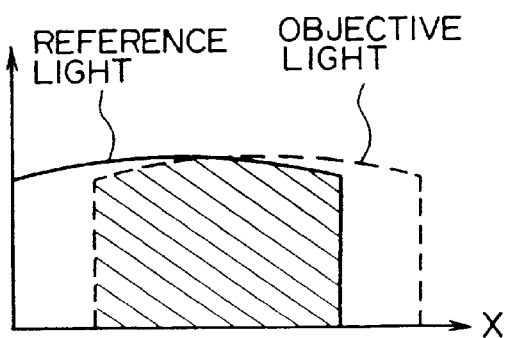

FIGS. 19 and 20 are diagrams for explaining the effect of a method of selecting and illuminating a part of the Gauss distribution according to the present embodiment. A case where no part of the Gauss distribution is selected is shown in FIG. 19, and the illumination distribution on the pattern detection means 3 of the reference light (solid line) and the objective light (dashed line) with a part of the Gauss distribution selected is shown in FIG. 20. The ordinate represents the illuminance Ix, and the abscissa the detection position X of the pattern detection means 3. With the inclination of the wafer, the objective light moves on the pattern detection means 3, so that the manner in which the reference light and the objective light are superposed on each other (hatched part) is changed. In the process, according to the embodiment shown in FIG. 19 where no part of the Gauss distribution is selected, the illuminance of the part where the reference light and the objective light are superposed one on the other undergoes a great change, thereby changing the interference intensity considerably. In the case of illumination shown in FIG. 20 where the Gauss distribution is partially selected, in contrast, the illuminance is changed to lesser degree with smaller fluctuations in interference intensity where the reference light and the objective light are superposed one on the other. The smaller the fluctuations in interference intensity, the smaller the error in the signal processing with the detection accuracy increased. The signal processing according to the embodiment under consideration was described above and will not be explained again.

Figure 22:
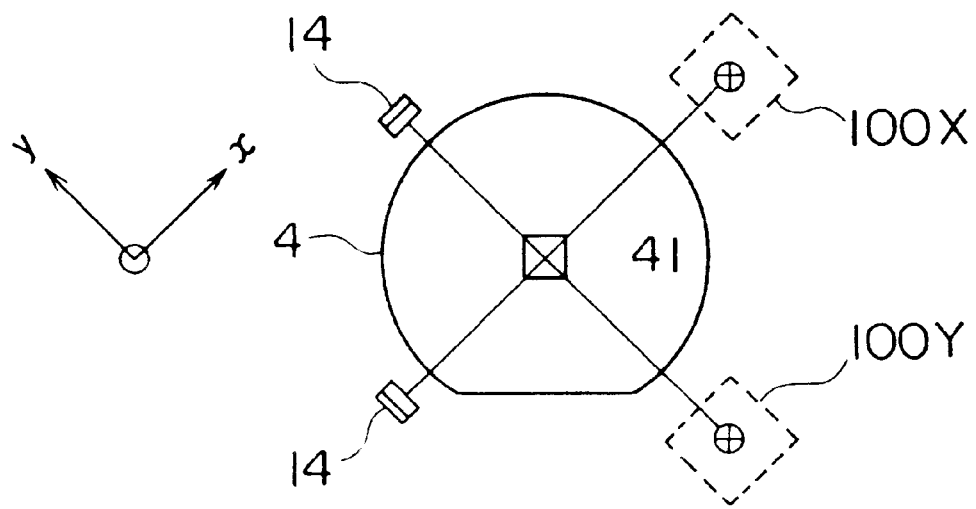
FIG. 22, FIG. 23 and FIG. 24 are diagrams for explaining a case in which a laser beam is irradiated along a diagonal direction of an exposure area according to the present invention respectively.
Figure 23:
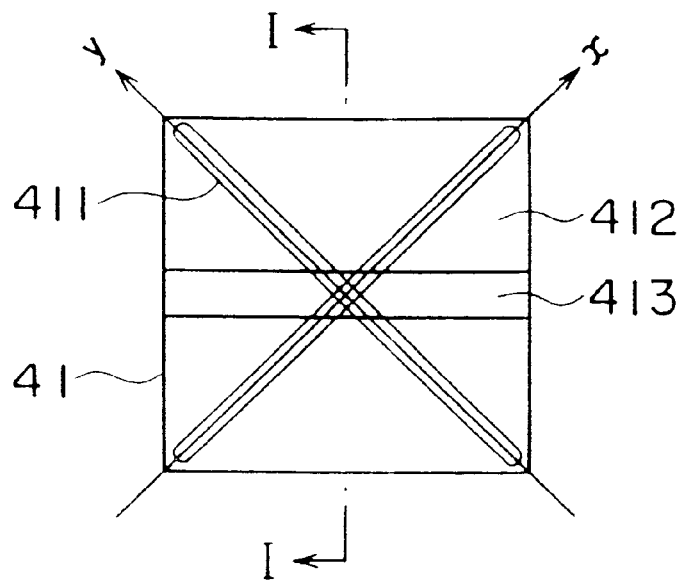
Figure 24:
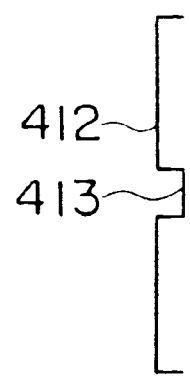

FIG. 22 shows an embodiment of the present invention. According to the present invention, a laser beam is irradiated in the diagonal direction of the exposure area 41 of the wafer 4. Numeral 100X designates a system for detecting the inclination and height along x direction, and numeral 100Y a system for detecting the inclination and height along y direction. Numeral 14 designates a return plane mirror. FIG. 23 is an enlarged view of the exposure area 41, and shows an example having two circuit sections (memory and the like) in a single exposure area. In FIG. 23, numeral 412 designates the circuit section, and numeral 413 a boundary. The laser beam 411 is irradiated along a diagonal direction of the exposure area. FIG. 24 shows a section taken along the line I—I in FIG. 23. Generally, the height is different in the circuit section 412 and the boundary 413. As a result, in the case where the laser light is irradiated in the direction parallel or perpendicular to a side of the exposure area, the inclination and height of the boundary instead of the circuit section may undesirably be detected. If the laser beam is applied in a diagonal direction of the exposure area as shown in FIG. 23 and a given detection range is selected as required, in contrast, the inclination and height of the circuit section are capable of being determined accurately. In the case where a laser beam is irradiated along the diagonal direction of the exposure area, on the other hand, the longest irradiation range is secured thereby to permit high-accuracy detection of the inclination and height of the exposure area.

Still another embodiment of the present invention is shown in FIG. 25. This diagram shows a means for detecting the inclination of a wafer exposure area by a semiconductor exposure apparatus which is in exposure mode. Numeral 81 designates an exposure illumination system, numeral 9 a reticle, and numeral 8 a compression exposure lens. The pattern of the reticle 9 is exposed on the wafer 4. In the process, the surface of the photoresist coated on the wafer is not necessarily flat due to the undulation or uneven thickness of the wafer or the lack of flatness of the wafer chuck. The laser beam emitted from the semiconductor laser source designated by 1 is, therefore, converted into thin parallel beams by a collimating lens 11$a$ and applied at an incident angle of 85 degree or more on the resist surface of the wafer, and the exposure area thereof at that, through the mirror 13. The reflected light is converged on the light position detector 3' through the mirror 210 and the convergence lens 20, so that the point of convergence thereof is detected. with the inclination of the exposure area by a, the regularly reflected light is inclined by $2\alpha$. If the focal length is assumed to be f, therefore, the convergence spot of the light position detector is displaced by $2\alpha f$. As a result, the detected signal is sent to the processing circuit 5' to drive the tilt mechanism carrying the wafer chuck, and is thus controlled so that the photoresist surface on the wafer coincides with the plane of the reticle pattern image. In the process, if the semiconductor laser is arranged in such a manner that the light 161' emitted from the semiconductor laser source enters the wafer surface in S polarized state, the inclination is capable of being detected with higher accuracy as explained above. In the embodiment shown in FIG. 25, the light position detector 3' is of such a type as to detect both the x and y directions and thus able to detect inclinations in two directions with a single detection system.

In FIG. 25, a second detection system may be provided in the direction perpendicular to the page to detect inclinations separately in x and y directions. Also, the light source is not necessarily a semiconductor laser to the extent that the wafer may be irradiated with a light comparatively high in directly.

Figure 26:
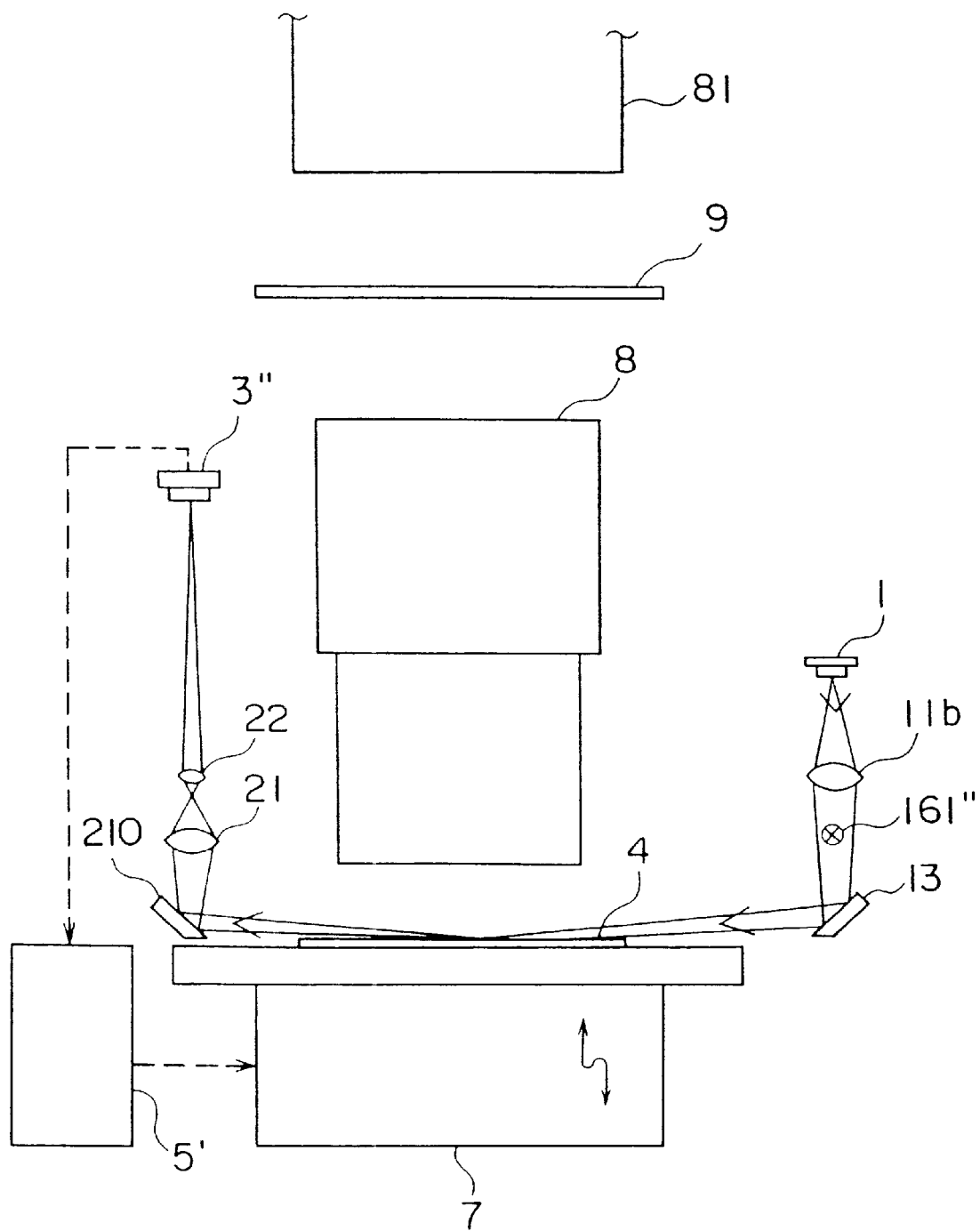
Figure 27:
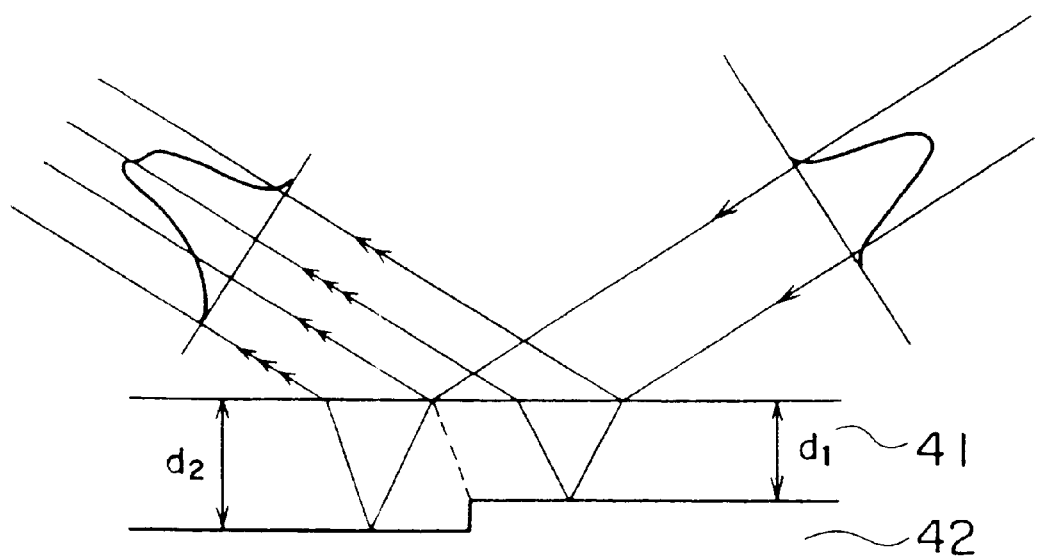
FIG. 27 is a diagram for explaining a problem of the prior art.
Figure 28:
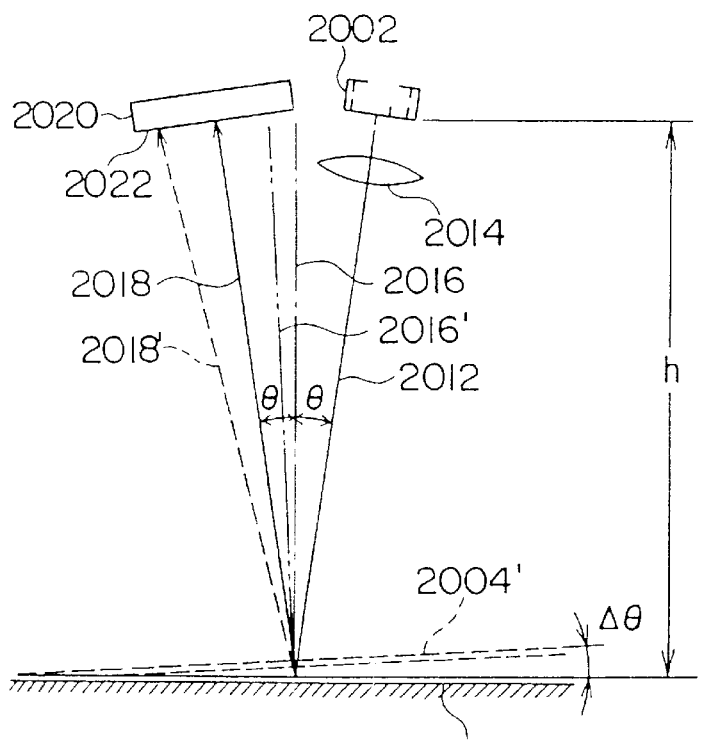
FIG. 28 and FIG. 29 are diagrams for explaining the prior art.
Figure 29:
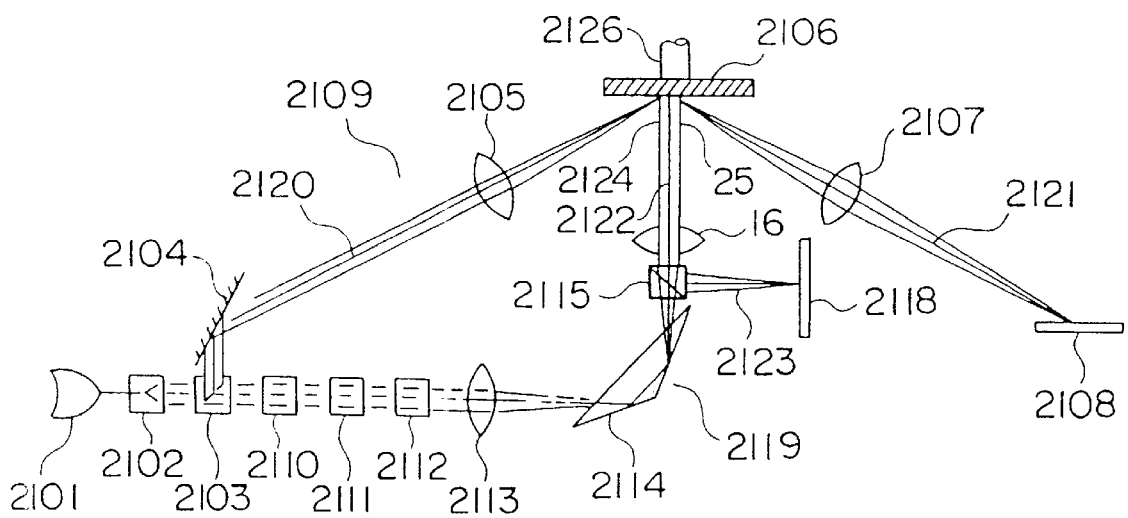

FIG. 26 shows an embodiment of the present invention in which the same reference numerals as those in FIG. 25 designate corresponding component elements respectively in FIG. 25. The light emitted from the semiconductor laser source 1 enters the wafer at an angle 85 degree or more and has an image of the light source formed within the exposure area on the wafer. The reflected light is converged on the light position detector 3" by the mirror 210 and lenses 21, 22. If the wafer surface is located at the image-forming position of the resist pattern of the exposure light optical system, the light is applied to the center of the light position detector 3", while if the wafer surface is displaced vertically, the light is displaced laterally from the center of the light position detector 3". By sending the detection signal from the light position detector 3" to the processing circuit 5' and controlling the driving of the vertical table of the wafer, therefore, it is possible to focus the light always correctly. If the laser light is applied in S polarization mode on the wafer surface, on the other hand, the height of the wafer surface is capable of being determined more accurately.

Figure 3:
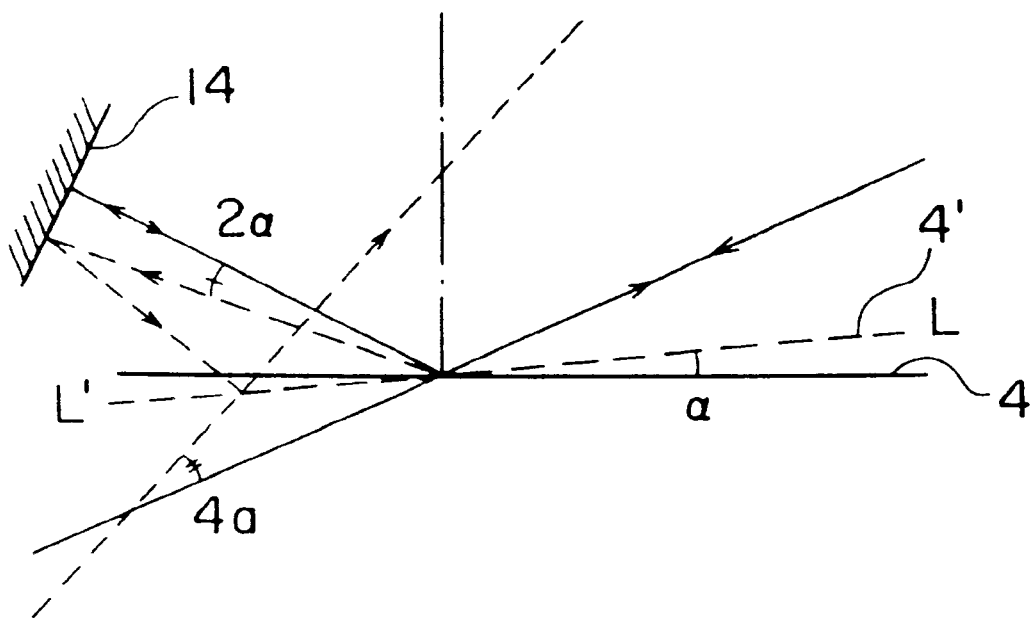
FIG. 3 is a diagram for explaining the effect of a return detection optical system.
Figure 7:
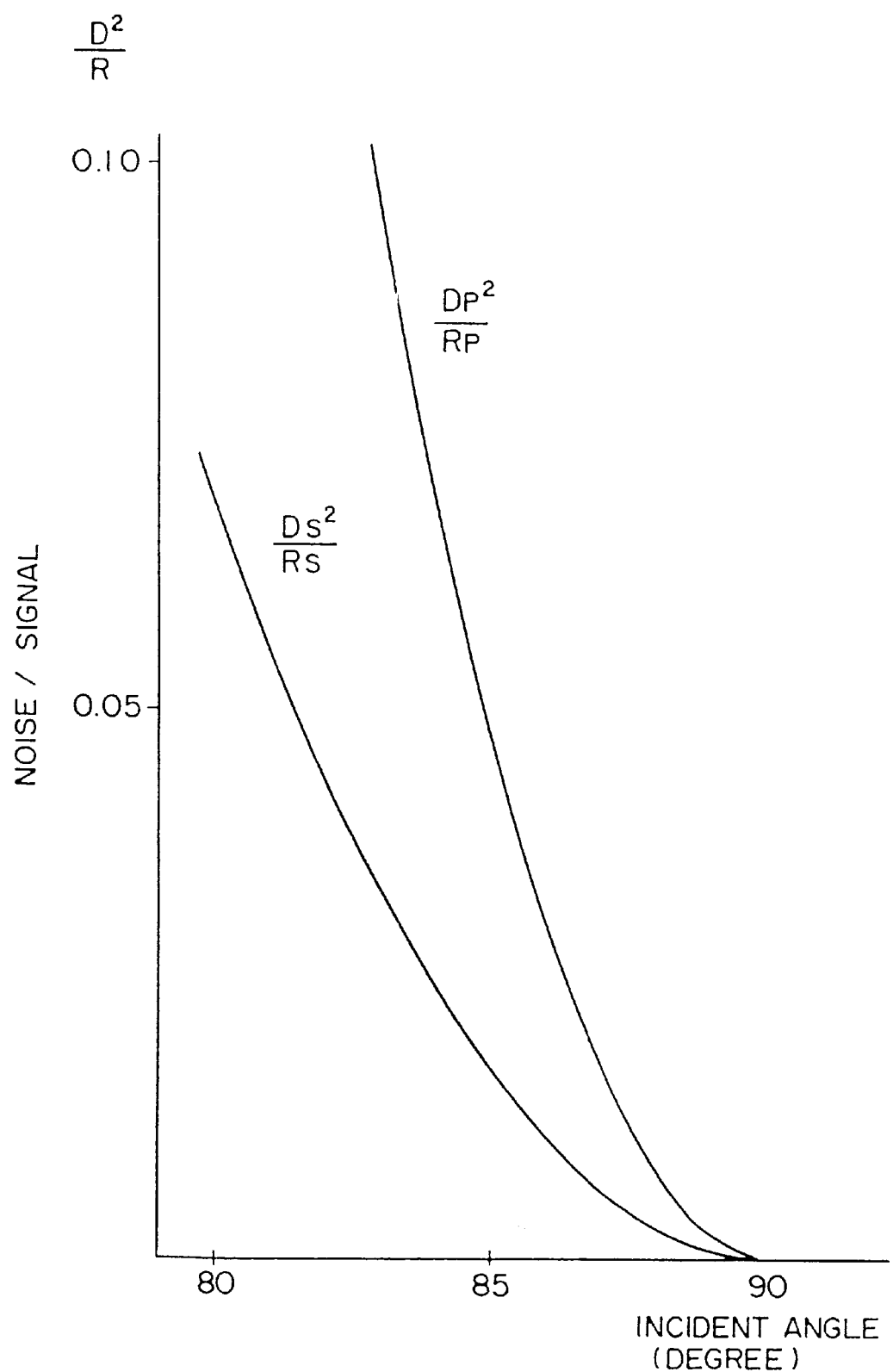
Figure 30:
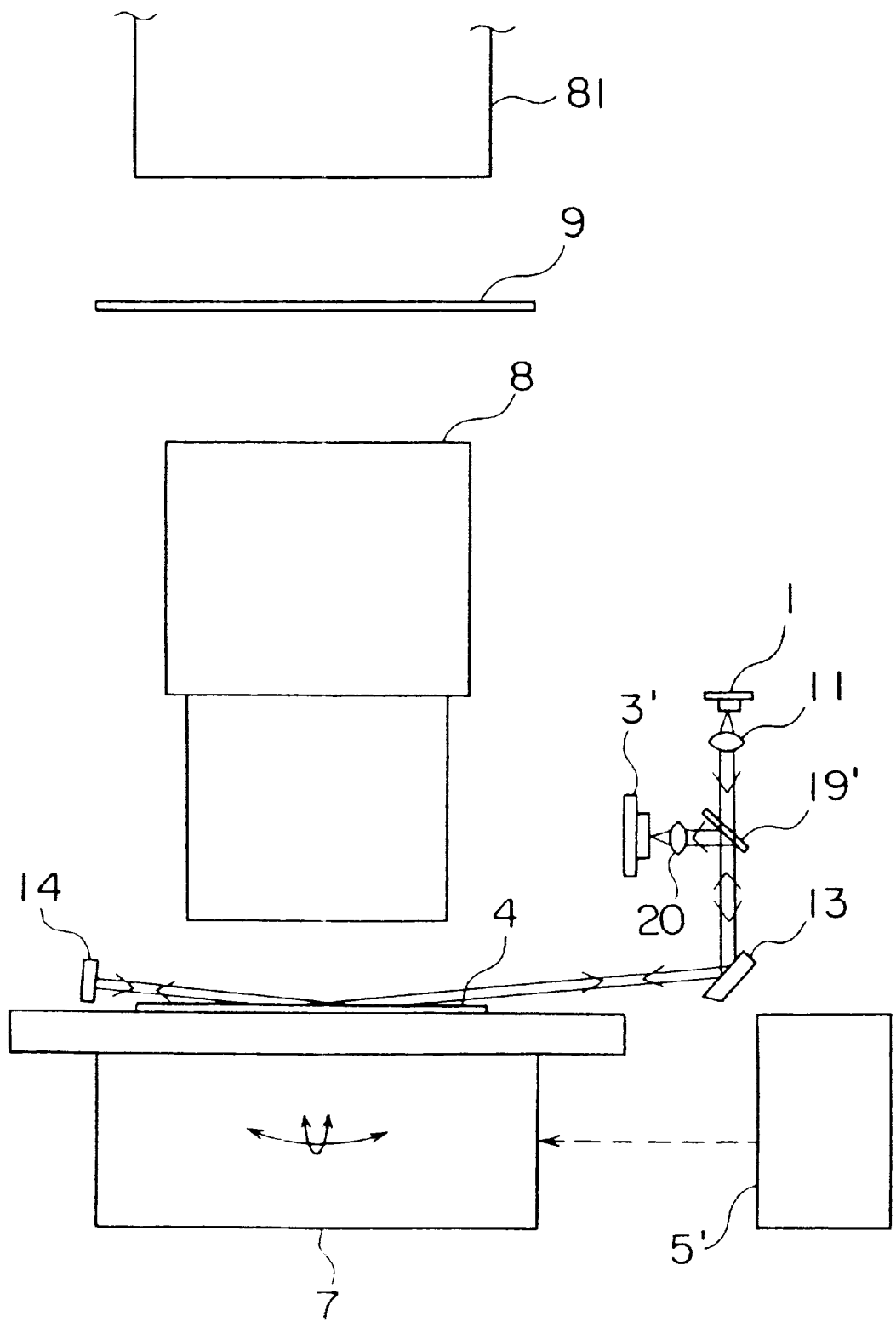
FIG. 30 is a diagram showing a configuration according to another embodiment of the present invention.
Figure 31:
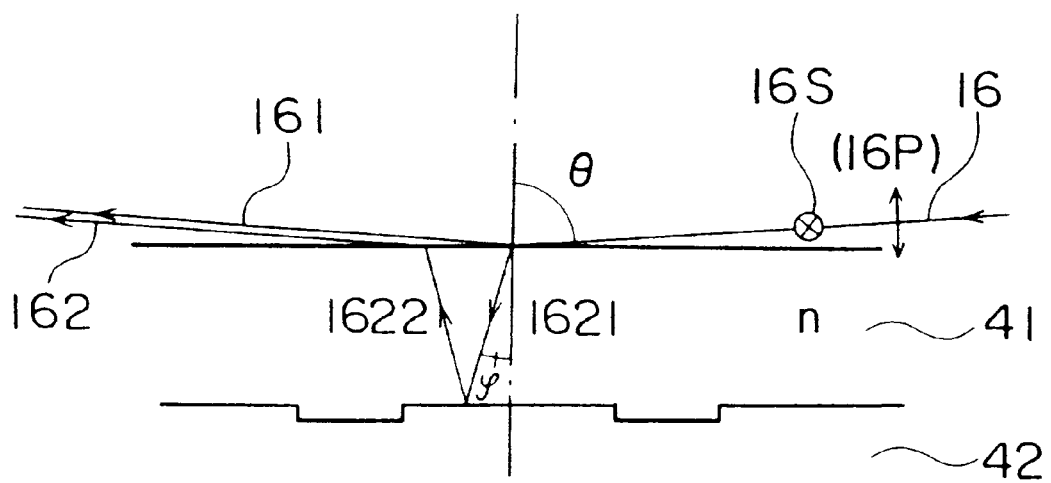
FIG. 31 is a diagram for explaining the embodiment shown in FIG. 30.

FIG. 30 shows an embodiment of the present invention, in which the reference numerals identical to those in FIG. 25 designate corresponding component parts respectively in FIG. 25. The parallel light beams produced from the collimating lens 11 are passed through the beam splitter 19', and enter the photoresist surface of the wafer at an incident angle of 85 degree or more, say, 87 degree. The light regularly reflected enters the plane mirror 14 at a substantially right angle. The light reflected therefrom, on the other hand, is regularly reflected on the photoresist surface again, and is converged on the light position detector 3' by the convergence lens 20 thereby to detect the position of the convergence spot. If the light is applied to the wafer at an incident angle of 89 degree in an S polarization of 16s as shown in FIG. 31, $Ds^2/Rs$ becomes 0.0065, that is, 0.65% as shown in FIG. 7, so that the light entering the photoresist is capable of being substantially ignored. Even if the base layer is as rough as shown in FIG. 31, therefore, it has substantially no effect but the light is reflected in parallel form. As a result the light position detector 3' produces a sharp spot light high in convergence degree. Further, according to the present embodiment, as shown in FIG. 3, the light is reflected in perpendicular direction on the plane mirror 14 and enters the wafer again. If the wafer is tilted by $\alpha$ from 4 to 4', therefore, the light finally returned to the light position detector is inclined by $4\alpha$. In comparison with the embodiment shown in FIG. 25, therefore, it is possible to detect the light position with a double accuracy. As a consequence, the inclination detection superior to the prior art in both sensitivity and light position is made possible.

Figure 32:
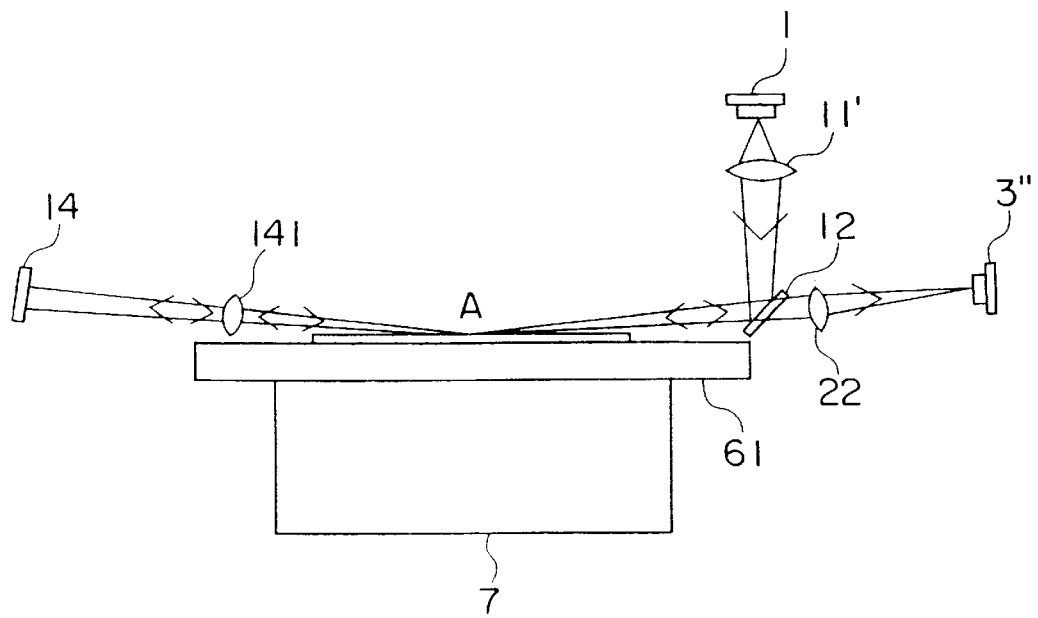
FIG. 32 is a diagram showing a configuration according to still another embodiment of the present invention.
Figure 33:
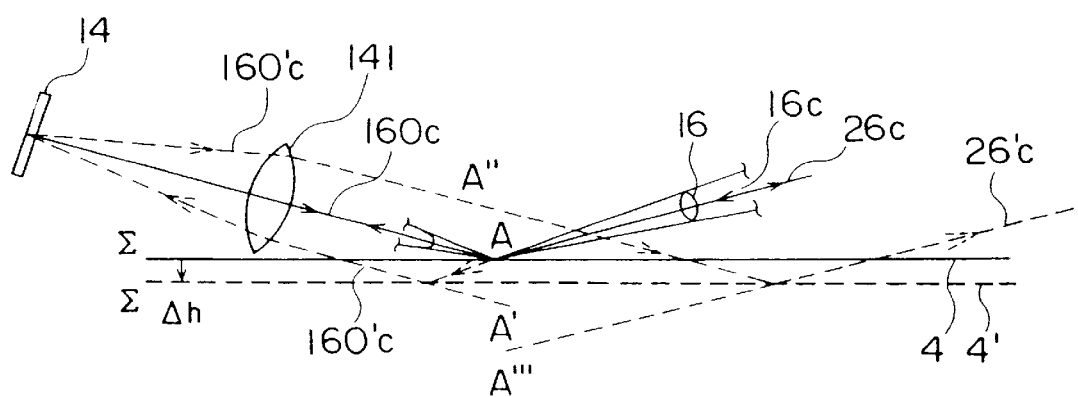
FIG. 33 is a diagram for explaining the embodiment shown in FIG. 32.

FIG. 32 shows an embodiment of the present invention, in which the same reference numerals as those in FIG. 26 designate corresponding component parts in FIG. 26 respectively. The converged beam obtained through the convergence lens 11' is substantially converged at the irradiation point A on the wafer. The incident angle is 85 degree or more. The regularly reflected light is converted into parallel light beams by the collimating lens 141, and enters the plane mirror 14 at substantially the right angle thereto. The reflected light, on the other hand, proceeds through substantially the same light path as the other way, is substantially converged and reflected on the wafer again and, through the beam splitter 12, is converged on the light position detector 3" by the convergence lens 22. FIG. 33 is for explaining the position of the convergence point near the wafer in the case where the wafer surface (reflection surface $\Sigma$) indicated by the solid line is changed to the condition 4' indicated by dotted line (reflection surface $\Sigma$). Now let us consider the case where the light is converged at point A in both ways when the reflection surface assuems $\Sigma$. If the reflection surface is given as $\Sigma'$, the surface $\Sigma'$ becomes a mirror, so that the point A in one way has an image thereof formed at point A'. The light leaving this point A' is converged at A" in the other way by the lens 141 and the plane mirror 14. This convergence point assumes a mirror surface in terms of $\Sigma'$, and a mirror image of A" is formed at point A'''. As a result, the light enters the convergence lens 22 in the same manner as if it has emitted from point A''' in the other way, and is thus converged at the position of the image A''' on the light position detector 3". If the distance between $\Sigma$ and $\Sigma'$, that is, the vertical coverage of the wafer, is given as $\Delta h$, then $$AA'=AA''=2\Delta h \ AA'''=AA'+A'A'''=4\Delta h \qquad (37)$$

The position of illumination in the other way thus shifts over a distance larger than the wafer displacement by a factor of four ($4\Delta h$)(See FIG. 33). As a result, the light is detected by the light detector 3''' with a displacement twice as much as in the embodiment of FIG. 26. It is thus possible to detect the height with a high sensitivity and a high S/N.

Figure 34:
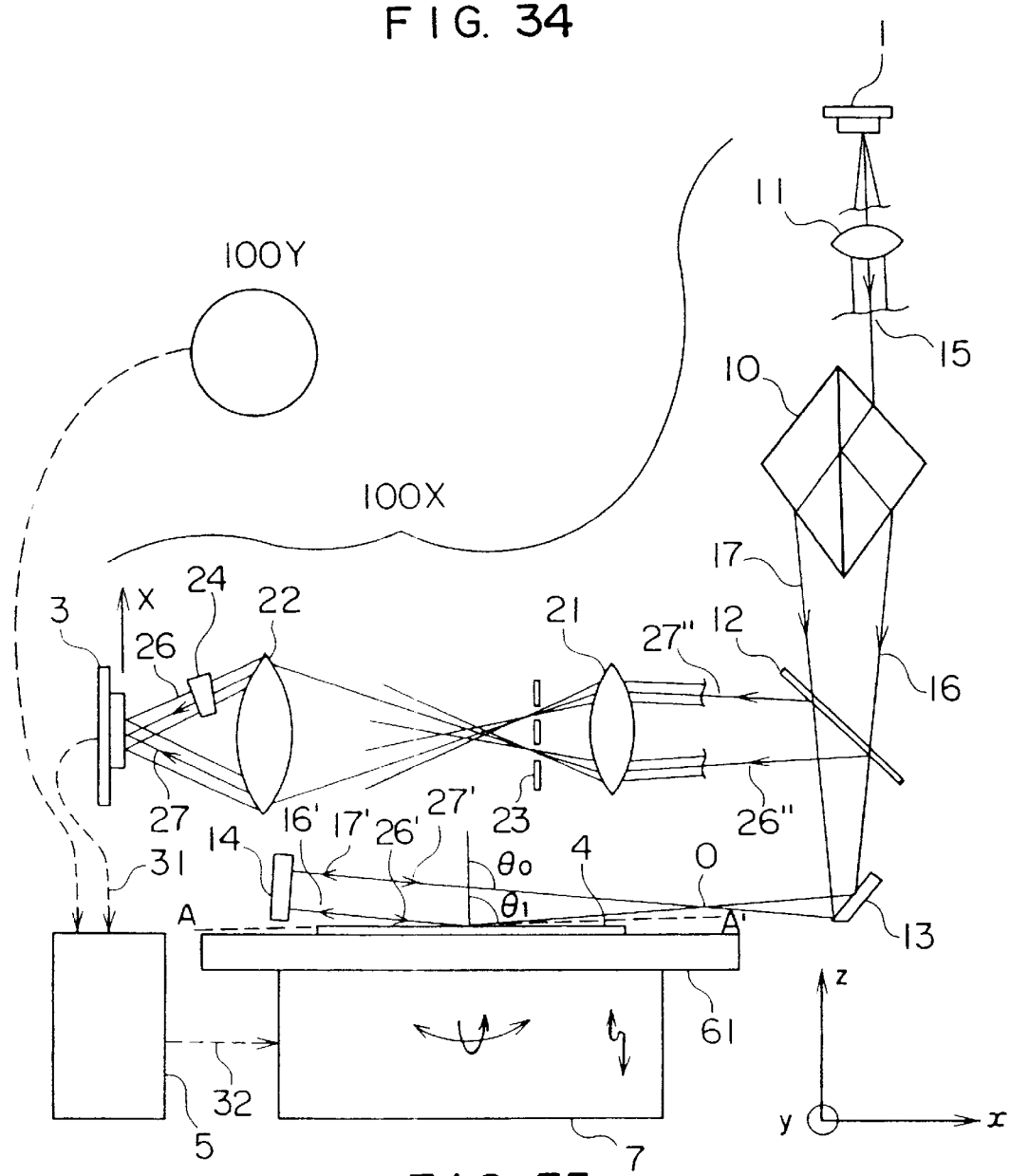
FIG. 34 is a diagram showing a configuration according to a further embodiment of the present invention.
Figure 35:
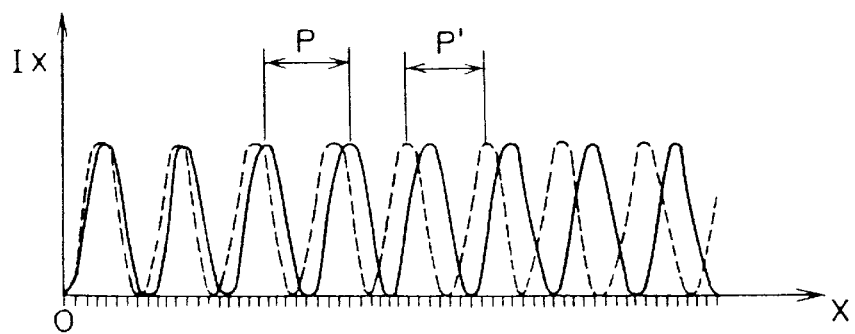
Figure 38:
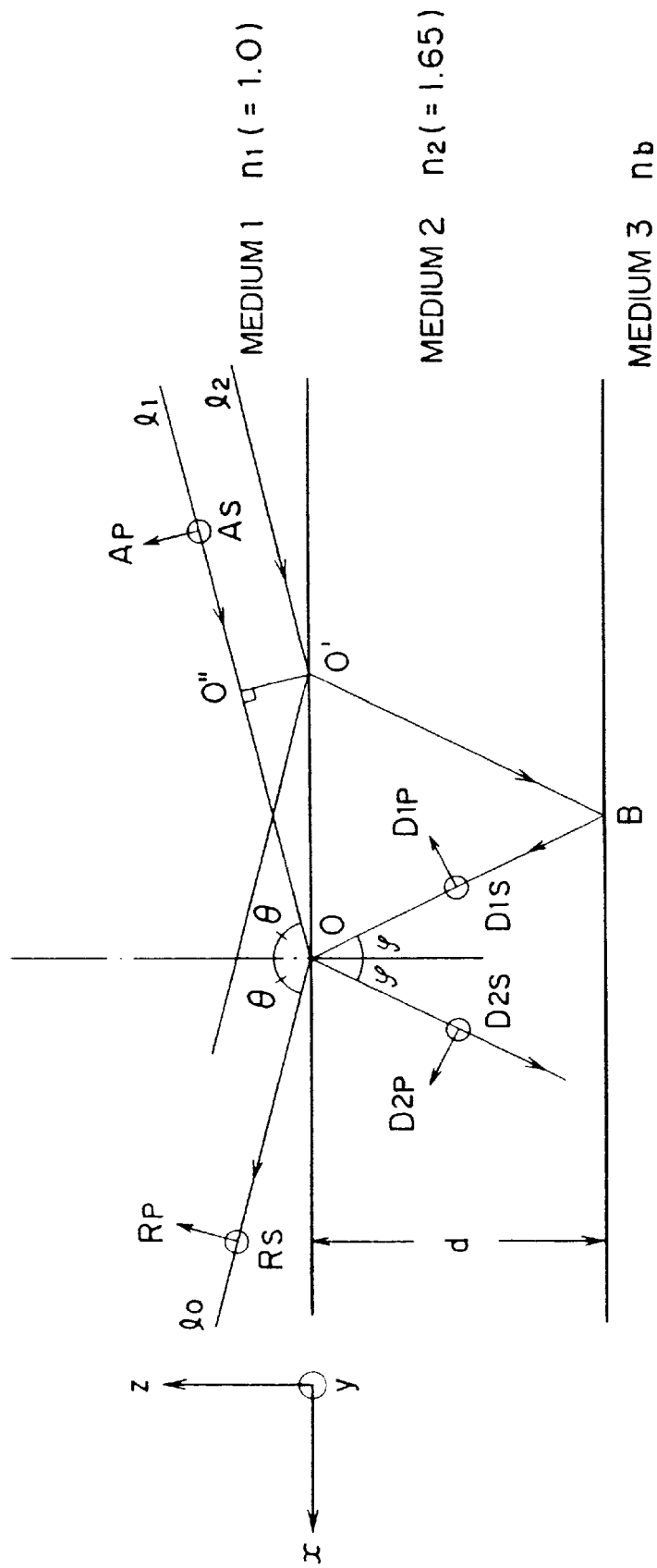
FIG. 38 is a diagram showing the reflection and refraction of light on a surface for explaining the principle of the present invention.

FIG. 34 is a diagram showing an embodiment of the present invention. The reference numerals identical to those in FIG. 25 designate corresponding component parts respectively in FIG. 25. The light that has left the coherent light source 1 such a laser source is converted into parallel light beams by the collimating lens 11 and thus enters the prism 10. The prism 10 is for separating the incident light 15 into two parallel beams 16 and 17. These two parallel beams have a predetermined angle of $\theta_0-\theta_1$ to each other to be superposed on each other at point zero. One parallel beam 16 enters the wafer at an incident angle of $\theta_1$, while the other beam, being a reference light, proceeds without being irradiated on the wafer at angle of $\theta_0$ (>90 degree) to the normal on the wafer. The parallel beam 16 reflected on the wafer enters the plane mirror 14 substantially at right angle thereto, enters the wafer again and, reversely along the one way, is reflected on the beam splitter 12. The light is thus passed through the lenses 21 and 22 to become parallel beam and enters the one-dimensional sensor 3. The reference light beam, on the other hand, enters the plane mirror 14 substantially from the perpendicular direction thereto directly from the point zero, and reversely along the one way, enters the one-dimensional sensor 3 in similar fashion, thus generating an interference fringe with the other beam reflected on the wafer. The other way along which the light reflected on the wafer proceeds has arranged thereon a pinhole 23 and a wedge glass 26. The pinhole 23 is also inserted in the reference light path and has the function of removing the noise light reflected on the back of optical parts. The wedge glass 26, on the other hand, refracts the light reflected on the wafer to form an image of the wafer irradiation position on the one-dimensional sensor, while at the same time causing the image to be superposed on the reference light. An interference fringe of such an intensity as shown by solid line in FIG. 35 is detected along the direction X of sensor array on the one-dimensional sensor. When the wafer is titled by $\Delta\theta$ around the wafer irradiation position (X=0) as shown by dotted line, the detected interference fringe is as shown by dotted line in FIG. 35. Specifically, the intensity, which substantially remains unchanged when X=0, changes from P to P' of the fringe. More specifically, since the intensity of the interference fringe I(X) is expressed by the equation (38), the relationship between the pitch P and the inclination $\Delta\theta$ is given from equation (39) as $$I(X) = a + b\cos\left\{\frac{2\pi}{\lambda}\frac{\sin(\theta_1 + 4\Delta\theta) + \cos\theta_0}{M}x + \frac{8\pi}{\lambda}\cos\theta_1 \cdot \Delta z\right\} \quad (38)$$

$$P = \frac{M\lambda}{\sin(\theta_1 + 4\Delta\theta) + \cos\theta_0} \quad (39)$$

In equation (38), M is the magnification of forming an image of the wafer irradiation position on the one-dimensional sensor. By way of explanation, however, the wedge angle of the wedge glass is assumed to be zero degree (in the absence of the wedge glass).

Also, the second term in the cosine in the equation (38) represents a change in the interference fringe with the wafer surface changed by $\Delta Z$. If the wafer surface changes by $\Delta Z$ as shown in FIG. 36, therefore, the phase shifts with the pitch of the interference fringe unchanged. As a result, according to the present embodiment, the interference fringe obtained by the one-dimensional sensor 3 is sent to the processing circuit 5 where the interference fringe pitch and phase are defined thereby to determine the inclination and height of the wafer surface at the same time. Also, according to the present embodiment, it is possible to assume an incident angle $\theta_1$ of 87 to 89 degree. Therefore, if the S polarization is used for the irradiation light, the inclination and height may be determined substantially without being affected by the multilayered base structure as obvious also from FIG. 7. Further, in the present embodiment, the reference light is passed through substantially the same light path as the wafer irradiation light by using common optical parts except for the reflection on the wafer surface, with the result that a stable measurement is realized without substantially being affected by the air swinging or the like.

Another embodiment of the present invention will be explained below.

FIG. 37 is a diagram showing an embodiment of the present invention which is applied to an exposure apparatus of reduction (compression) projection type. Numeral 81 designates an exposure illumination system. The light emitted from this system is irradiated on the reticle 9, and the light transmitted therethrough has a compressed original image of reticle formed and exposed by a compression lens 8 on the wafer 4 on the wafer stage 7 having a fine adjustment mechanism of z direction and an angle of $\Delta\theta$ (the inclination being around two perpendicularly-crossing axes, explanation that follows will be limited to the case of a single axis). A multiplicity of chips are arranged on the wafer and one to several chips are printed by exposure each time. Since the wafer is not completely flat, the height and inclination of the exposure area of each chip are determined by the method mentioned below immediately before exposure. After thus making a correction by the wafer stage 7, the wafer surface is set in the state of highest resolution, followed by exposure. The wafer surface is coated with a photoresist in the thickness of about 1.5 $\mu$m. In order to detect the height and inclination of the photoresist surface on the wafer accurately, the detection of interference type shown in the embodiment of FIG. 37 is effected. The laser light source 1 produces an He-Ne laser of 0.6328 $\mu$m in wavelength $\lambda_1$, and the laser light source 1' an He-Ne laser beam of 0.6119 $\mu$m in wavelength $\lambda_2$. The beam emitted from each laser light source is turned on and off by the light shutters 111 and 111'. Each laser, after being separated into two parts by beam splitters 18, 18' of a grating or the like, is adjusted on the wavelength selection mirror 19 in such a manner that the light beam of wavelength $\lambda_1$ is transmitted therethrough while the beam of wavelength $\lambda_2$ is reflected therefrom. The beams into which the light is separated by wavelength are adapted to pass along the same light path respectively. The prism 110 functions in such a way as to set the beams of respective wavelengths substantially in parallel. Of the beams thus set in parallel, the beam 16 (16') enters the wafer at an incident angle of 88 degree after being reflected on the mirror 13 as a measurement light. The other beam 17 (17') does not enter the wafer but is superposed on the remaining beam at point A as a reference light beam. The beam that has passed the point A arrives at the CCD sensor 3 through the mirror 23 and the lenses 21, 22. The light-receiving surface of the sensor, which is at a position conjugate with the point A, is adapted to detect the interference fringe between the reference and the measurement light reflected from the wafer. Each detection signal of the interference fringe, inspite of the intensity change indicated by equation (14), is sequentially subjected to A/D conversion into a digital signal at the A/D converter 52 in the processing circuit 5 due to the CCD having a multiplicity of elements arranged in separation. The two wavelengths are measured by sequentially opening and closing the shutters 18, 18'. In FIG. 37, numeral 51 designates an input signal. FIGS. 47A to 47C show an embodiment involving the flow of data processing executed in the processing circuit 5 in FIG. 35. The interference fringe data Fi(Xi) (i takes 1 for the data of wavelength $\lambda_1$, and 2 for the data of wavelength $\lambda_2$) subjected to A/D conversion in the A/D converter 52, as shown by the step 1060, is further subjected to Fourier transformation by a time length of about 1 ms as shown in the step 1061 by the fast Fourier transformation (FFT) circuit 53. The spectrum data Ii ($\omega$j) subjected to Fourier transformation by the fast Fourier transformation circuit 53 has peaks at two points $\omega=\omega_0$ (=0) and $\omega=\omega i$ as shown in FIG. 47C. $\omega_0$ represents a DC bias component, and $\omega i$ a spectrum corresponding to the period of the interference fringe. A local maximum value is presented when $\omega=\omega i$. Since $\omega i$ is a discrete sampling point, however, the true peak exists at a point near the sampling point representing this maximum value. The spectrum $\omega i'$ representing this true local maximum value is capable of being determined from the peripheral data based on $\omega i+1$ and $\omega i-1$ by various well-known methods as shown by 1062 from the data processing means 54. In this way, the ratios between true peak values $I_1(\omega^{1'})$ and $I_2(\omega_2')$ and between the spectrum values $I_1(\omega_0)$ and $I_2(\omega_0)$ at $\omega_0$ obtained for the two wavelengths as shown in the step 1062 by the processing means 54 are compared by the comparator means 55 respectively in the manner shown in the step 1063. Specifically, the greater of $\gamma_1$ and $\gamma_2$ is determined in the equations below.

Figure 39:
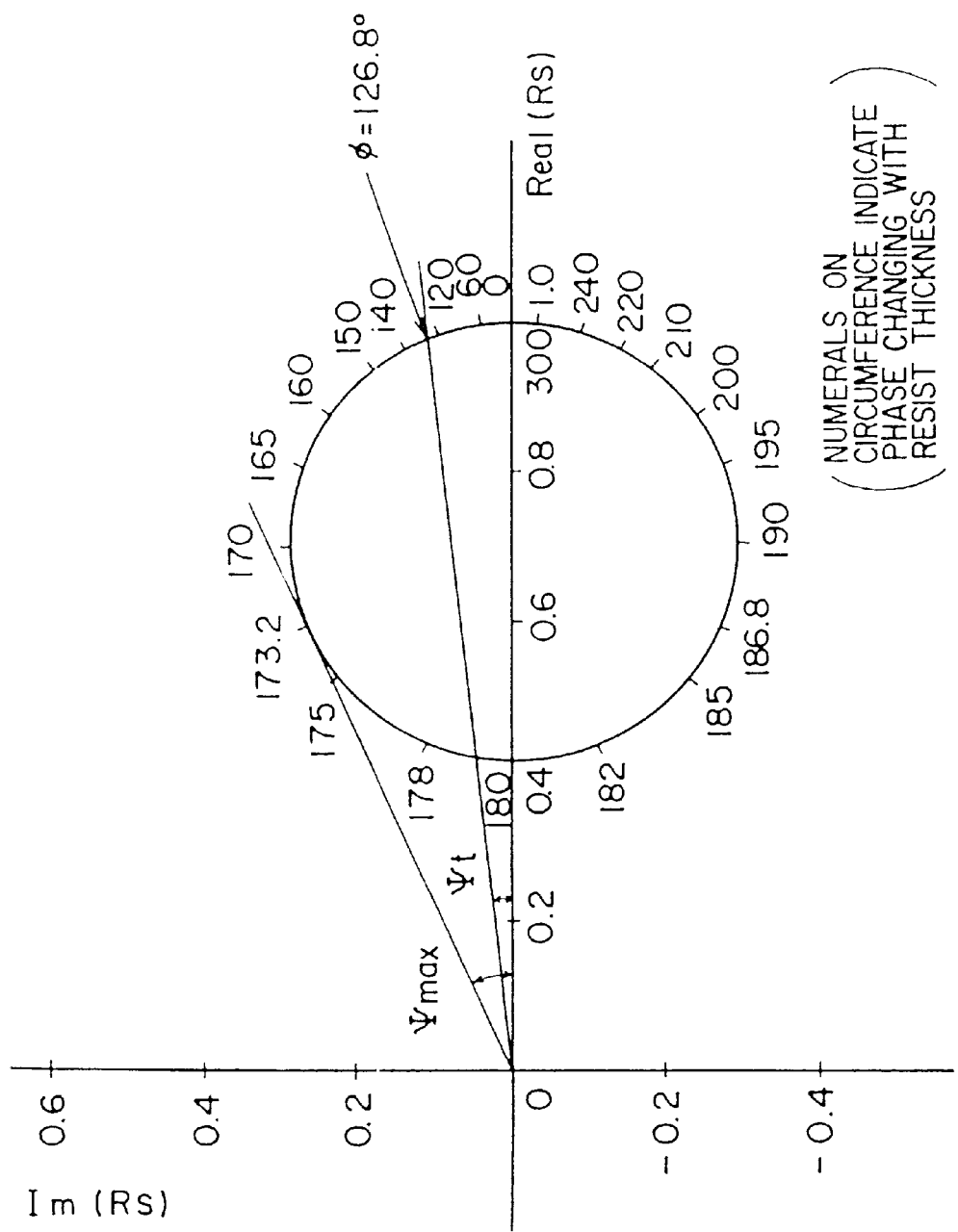
FIG. 39, FIG. 40 and FIG. 41 are diagrams showing a complex amplitude of the reflected light in the case where aluminum makes up a base respectively.
Figure 40:
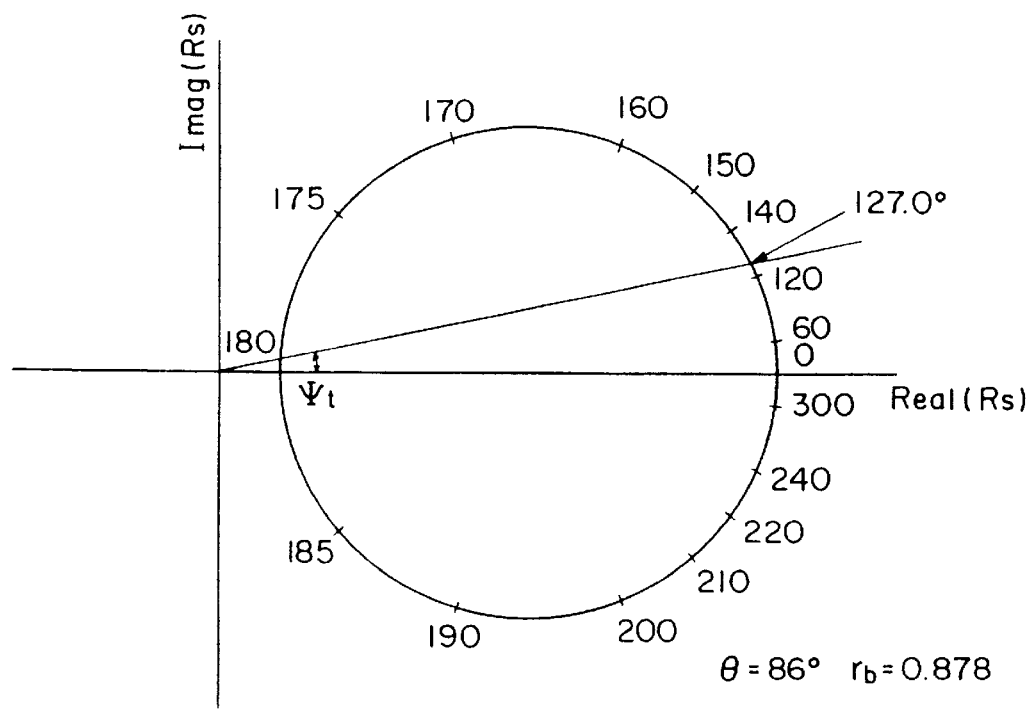
Figure 41:
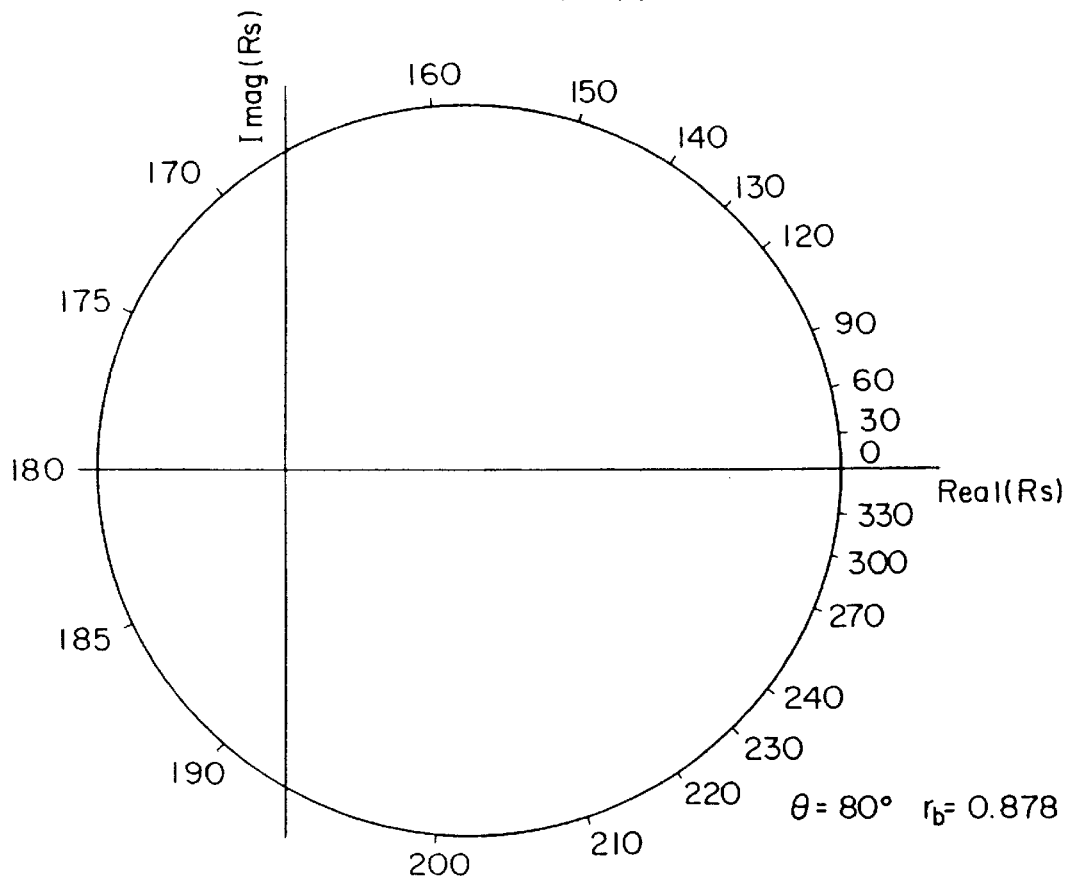
Figure 42:
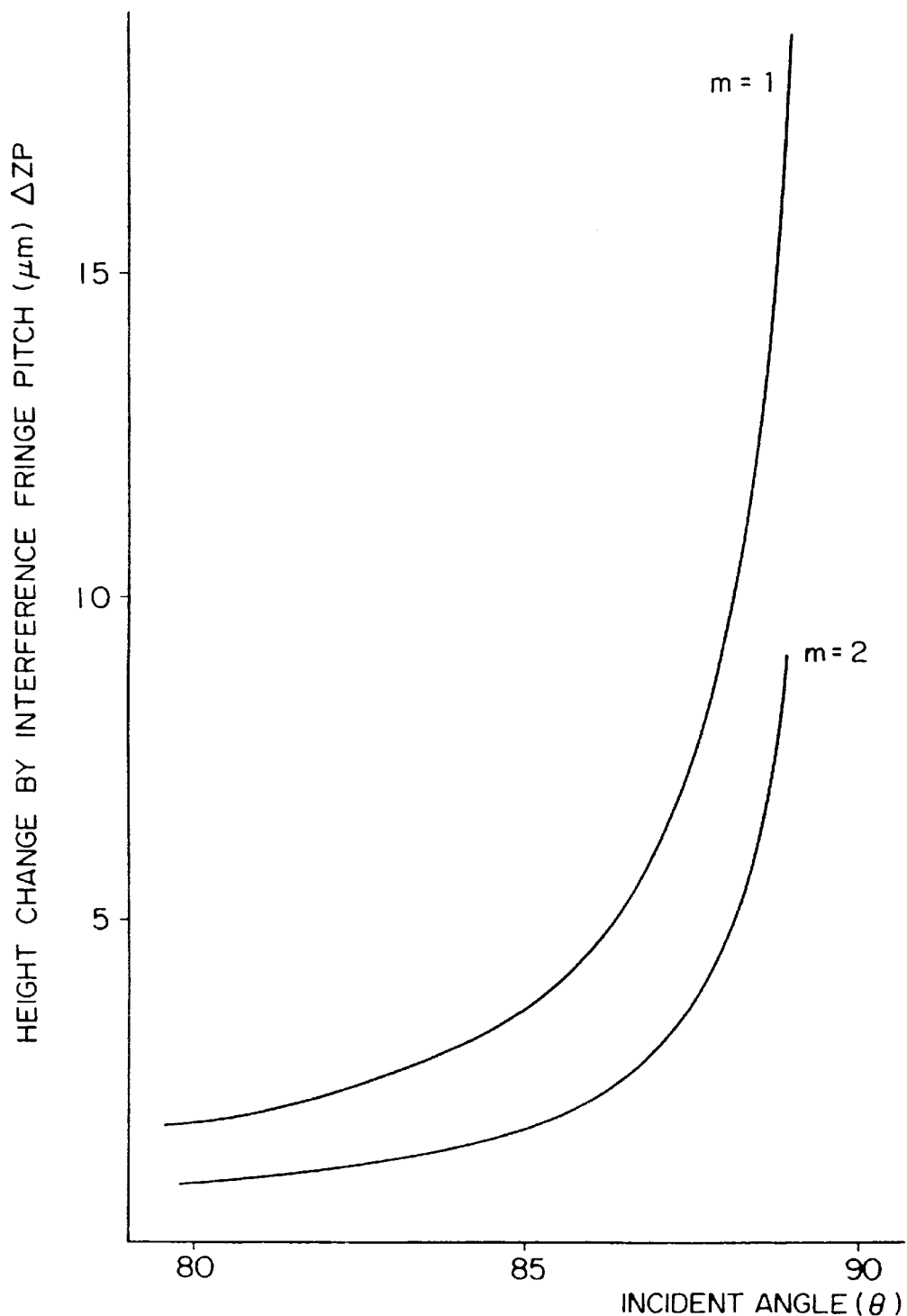
FIG. 42 is a diagram showing changes in incident angle and height change by the interference fringe pitch according to the present invention.
Figure 43:
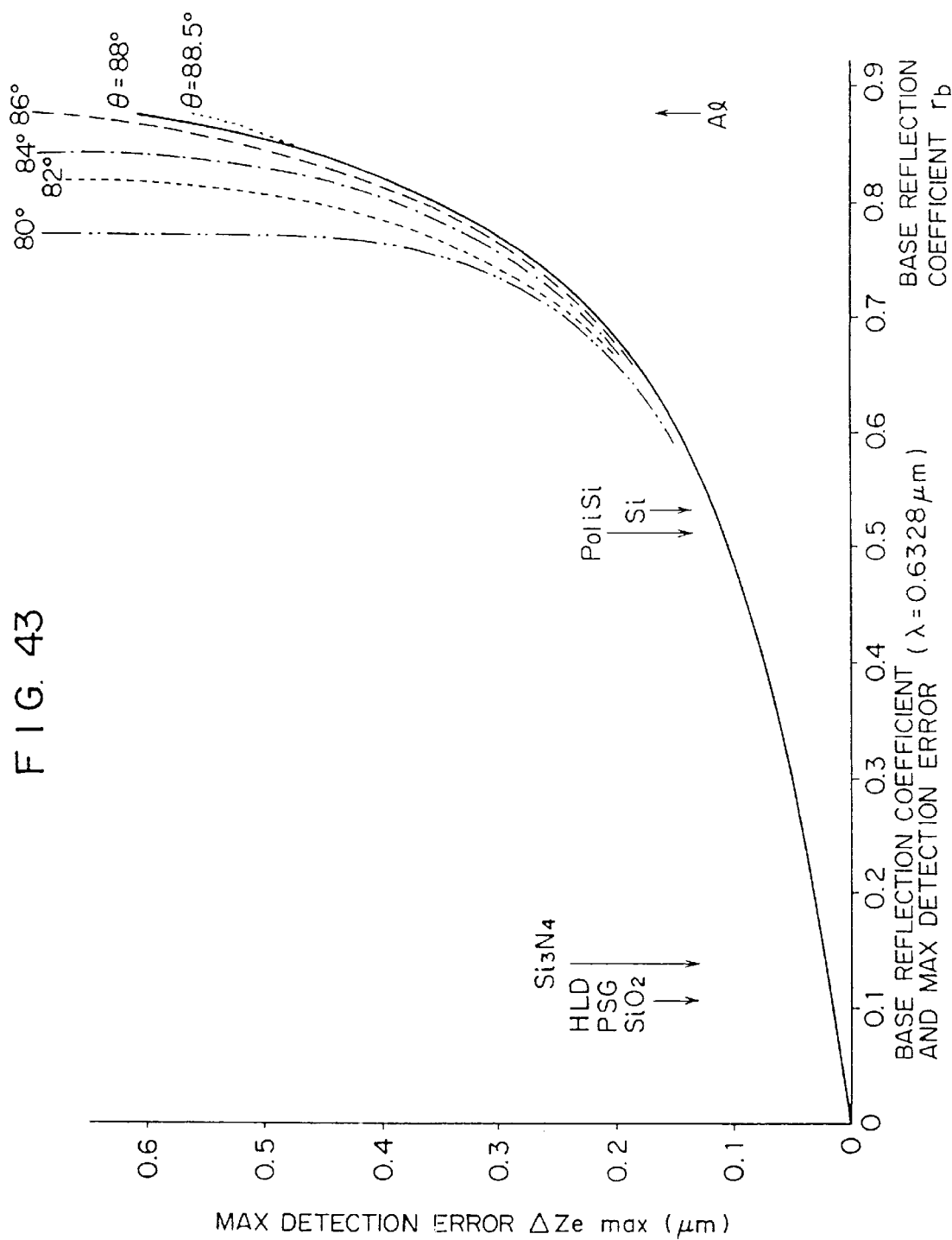
FIG. 43 is a diagram showing the relationship between base reflectance and maximum error.
Figure 46:
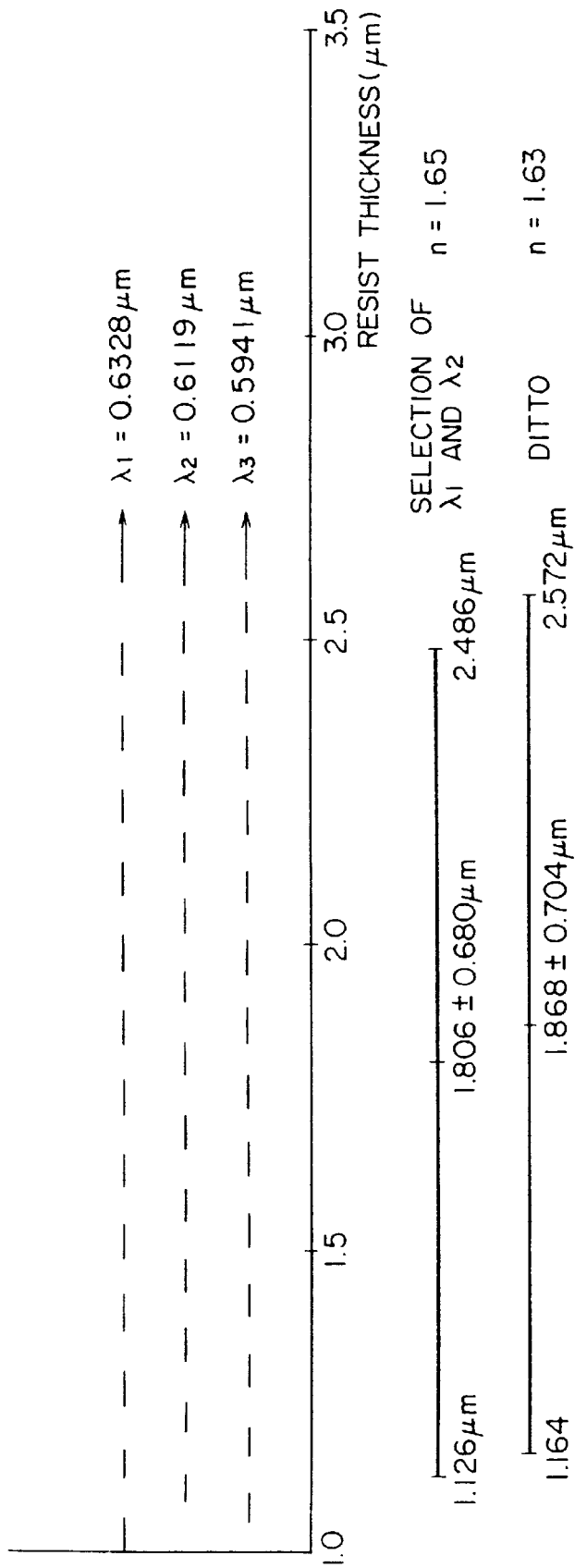
FIG. 46 is a diagram showing a resist thickness causing more than a tolerable detection error with the detection wavelength changed.

$\gamma_1 = I_1(\omega_1')/I_1(\omega_0)$ $\gamma_2 = I_2(\omega_2')/I_2(\omega_0)$ If $\gamma_1 > \gamma_2$, for example, $i_0$ is assuemd to be 2 and the wavelength for $i_0$ is used for detecting the inclination and height. The FFT data has already been obtained for each wavelength. The data processing means, therefore, using the data on $i=i_0$ obtained in the step 1063, determines an interpolation value $Ii_0(\omega i_0')$ (complex number) of the FFT data for $\omega i_0'$ and $\omega i_0'$, and as shown in the step 1064, the phase $\psi$ is determined from the ratio of imaginary to real number of $Ii_0(\omega i_0')$. And as shown in the step 1065, the data processing means 54 determines the pitch of the interference fringe from the true peak position $\omega i_0'$, that is, the degree $\Delta\theta$ of the wafer inclination, and the height $\Delta Z$ of the wafer surface from the phase $\psi$. The inclination $\Delta\theta$ and the height $\Delta Z$ thus obtained are fed back to the wafer stage 7 thereby to control the partial inclination and the height of the wafer 4. If the wavelength $\lambda i_0$ of i (=$i_0$) associated with the larger of $\lambda_1$ and $\lambda_2$ is used in the process, an accurate measurement is made possible for the reason described below with reference to FIGS. 44A to 44C, which have already been referred to above. FIG. 44C shows the amplitude $\lambda$ of the reflected light Rs determined from the graphs of FIGS. 39 and 40 showing the complex amplitude Rs of the reflected light on a complex plane with aluminum used as a base. FIG. 39 indicates fluctuations in the resist thickness (variation in phase $\phi$) of the complex reflectance of the aluminum wafer coated with the resist (incident angle $\theta$=88 degree, and aluminum amplitude reflectance $\gamma b$=0.878). The abscissa in these graphs coincides with that in FIG. 44A. As mentioned above, when $\phi$ reaches a resist thickness corresponding to 120 to 240 degree, the detection error $\Delta Ze$ is increased. Also, for the value $\phi$ in this area, the amplitude $\gamma$ of the reflected light Rs is decreased as shown in FIG. 44C. With the decrease in the amplitude $\gamma$ of Rs, the modulation degree of the interference fringe is decreased, with the result that the peak value $Ii(\omega i')$ of the spectrum corresponding to the fringe period is decreased. If $Ii(\omega i')$ is divided by the DC bias component $Ii(\omega_0)$ for normalization as mentioned above in order to remove the effect of the change in light quantity of the light source, the resultant value ($\gamma_1, \gamma_2$ mentioned above) represents a smaller value in the angle range from 120 to 240 degree. The photoresist thickness associated with the value $\phi$ of 120 to 240 degree for $\lambda_1$ equal to 0.6328 $\mu$m and $\lambda_2$ of 0.6119 $\mu$m is represented by the area defined by line portions in FIG. 46. There is no resist thickness where the line portions for these two wavelengths are superposed on each other in the range from 1.2 $\mu$m to 2.4 $\mu$m. As a result, if the above-mentioned values $\lambda_1$ and $\lambda_2$ for the two wavelengths are obtained by the data processing means 54 in the processing circuit 5, and the measurement is taken by use of the light of the greater wavelength, then the measurement error never fails to exceed 0.1 $\mu$m for this resist thickness range, thus making it possible to detect the inclination and height accurately by the data processing means 54 in the processing circuit 5. FIG. 46 shows the resist thickness generating a detection error above a tolerable value with the detection wavelength changed (resist thickness corresponding to the upper solid line) and the resist thickness area (lower line) assuring the detection accuracy within a tolerable value with the wavelength selected by use of $\lambda_1$ and $\lambda_2$.

In this embodiment, the input signal 51 to the processing circuit 5 in FIG. 37 may be the information on whether the wafer base is made of aluminum or not. With regard to aluminum, the above-mentioned processing is applicable, and with regard to a specimen other than aluminum smaller in the base reflectance, on the other hand, an accurate measurement of the inclination and height is made possible even if the wavelength of either $\lambda_1$ or $\lambda_2$ is fixed. The information thus obtained on the inclination and height is used as a basis for fine control of the wafer stage 7.

Figure 45:
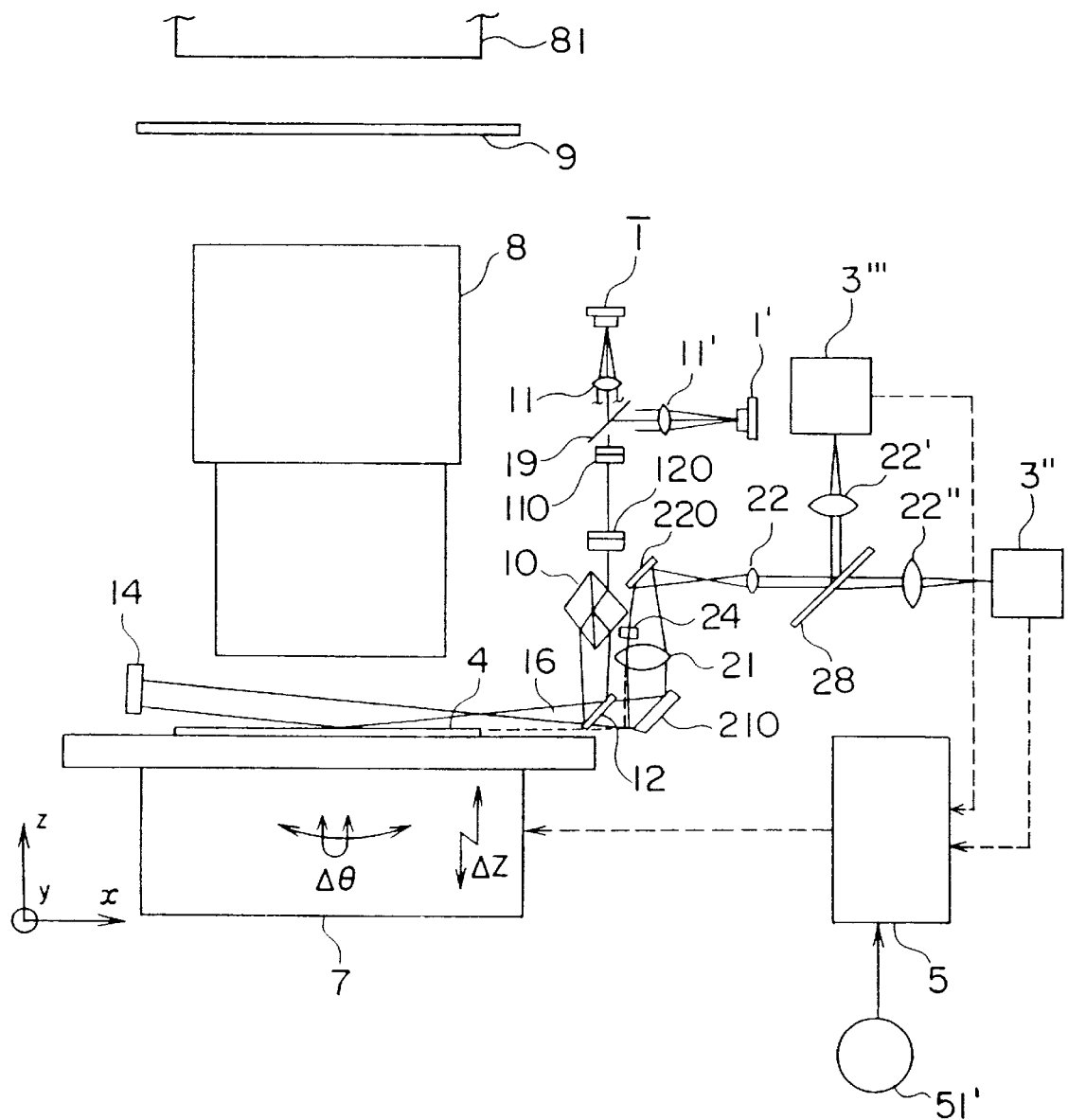
FIG. 45 is a diagram showing an embodiment of the present invention.

FIG. 45 shows an embodiment of the present invention. The component parts designated by the same reference numerals as those in FIG. 37 indicate corresponding component parts respectively in FIG. 37. The light source 1 is a semiconductor laser source having a wavelength $\lambda_1$ of 831 nm, and the ligh source 1' a semiconductor laser source having a wavelength $\lambda_2$ of 810 nm. The beams emitted from the two light sources are converted into parallel beams by the lenses 11 and 11'. The light of wavelength $\lambda_1$ is transmitted through the wavelength selection mirror 19, and the light of wavelength $\lambda_2$ is reflected thereon and is led to the same light path. The cylindrical lense 110 and 120 convert the parallel beams of the semicondcutor lasers into the desired beam sizes. The beam splitter 10 is for separating the beams into a reference light and a measurement light. The measurement light reflected from the half mirror 12 is reflected on the surface of the wafer 4, returned in perpendicular direction on the return mirror 14, and is transmitted again through the half mirror 12 after reflection on the surface of the wafer 4. The reference light beam, on the other hand. is reflected on the half mirror 12, returned in perpendicular direction to the return mirror 14 directly, and is transmitted through the half mirror 12. The two light beams are passed through the mirror 210, the lens 21, the mirror 220 and the lens 22, and having both the wavelength of $\lambda_1$ are transmitted through the wavelenght selection mirror 28, so that an interference fringe is formed by being superposed on the imaging surface of the image pick-up device 3" by the lens 22'. The wedge glass 24 in the light path of the reference light refracts the reference light and is used to assure that the image pick-up surface is in conjugate relation with the vicinity of the surface of the mirror 14. The two light beams are superposed on each other on the imaging surface. In similar fashion, the light beam of wavelength $\lambda_2$ generates the interference fringe of $\lambda_2$ in the image pick-up device 3''' through the lens 22" by way of the wavelength selection mirror 28. The interference fringe data of the two wavelengths are detected and applied to the processing circuit 5 at the same time. The processing circuit 5 is supplied with the information on the material of the base of the wafer to be exposed as well as the resist thickness by the input means 51' such as the key input terminal and magnetic card. These information are measured in advance by separate devices or the like. Upon receipt of these information by the input means 51', the wavelength which is less likely to generate an error is determined by the software in the processing circuit 5 by the method described with reference to FIGS. 43, 44A to 44C and 46, and the inclination and height are detected on the basis of the measurement data of the particular wavelength.

FIG. 48 shows an embodiment of the present invention, in which the same reference numerals as in FIGS. 37 and 45 designate the same component parts as in FIGS. 37 and 45 respectively. The semiconductor laser sources 1', 1" have wavelengths of 831 nm, 810 nm and 750 nm respectively, and have attached thereto Peltier devices 120, 120', 120" respectively for temperature control to maintain a constant temperature and thus stabilzie the oscillation wavelength. The oscillation of each semiconductor laser is controlled by the control circuit 5". The beam emitted from each semiconductor laser is introduced to the same light path by the collimating lenses 11, 11', 11" and the beam splitters 18, 18', 18" respectively thereby to generate a reference light beam 17 and an objective light beam 16 in the same light path. The objective light enters the wafer at an incident angle of 86 degree to detect an interference image through a CCD sensor 3. The semiconductor lasers 1, 1' are oscillated in time series, the interference pattern for each wavelength is taken out sequentially, the spectrum ratios $\lambda_1, \lambda_2$ mentioned above are compared, and the wavelength for the greater one thereof is used. In selecting this wavelength, a shutter (not shown) for masking the reference light may be inserted backward of the prism 110 shown in FIG. 48, so that only the objective light may be detected, and the level thus detected is used.

Since the two wavelengths used for selection are approximate to each other comparatively, a semiconductor laser 1" of 750 nm separate from these wavelengths is used for removing the indefinity of height detection. When the wafer is mounted on the wafer stage designated by 7 from a wafer cassette (not shown), in particular, the variations in the height of the resist surface on the wafer reach as much as about 25 µm due to the variations in wafer thickness or the like. On the other hand, the relationship ΔZp=5.8 µm (m=1) holds from equation (15) when $\lambda_2$=810 µm for the incident angle of 86 degree. Specifically, the same phase value is involved in the case of a height change of an integral multiple of 5.8 µm for the same wavelength, and therefore, the true height is unknown at the time point of mounting the wafer 4 on the wafer stage 7. If the phases associated with the two wavelengths of 750 nm and 831 nm are compared, the change $\Delta Z_{31}$ in wafer height which makes an identical phase relationship between the two wavelengths is given as $$\Delta Z_{31} = \frac{1}{2\cos 86°} \frac{\lambda_1 \lambda_3}{\lambda_1 - \lambda_3} = 55.2 \ (\mu m)$$

In the range where the height is 2 µm, therefore, the height is accurately obtained from the phase relationship between the two wavelengths. In the embodiment of FIG. 48, as described above, the rough detection by the other wavelength and the above-mentioned one wavelength making up two approximate wavelengths used for accurate height detection permits the height and inclination to be determined with high accuracy without substantially being affected by the base over a wide range. By selecting $\lambda_1$ and $\lambda_2$ appropriately as mentioned above, φ may be set between 0 and 120 degree or between 240 and 360 degree. As shown in FIG. 44A, therefore, a detection accuracy of more than 1 µm is possible even with an aluminum base pattern. A measurement with a still higher accuracy is possible. Specifically, if the resist thickness can be measured in advance, the particular value is applied by way of the input terminal 51" of the control circuit 5", thereby determining the error value as shown in FIG. 44A. This value is used as a correction value to correct the control value of the height, thus making possible a detection and control with very high accuracy.

Although the embodiment of FIG. 48 shows $\lambda_3$ only for rough detection, it may be used also for accurate detection or a fourth wavelength may be provided. Also, the present invention is realized by use of the dye laser of the like laser of variable wavelength. Further, the collimating light may be generated from a spot light source of strong power such as mercury lamp, instead of the laser light, to produce a narrow-band spectrum for obtaining a interference fringe.

Apart from the embodiments described above with reference to FIGS. 37, 45 and 48 which are all aimed at focusing for exposure of a compression-type exposure apparatus, the present invention is not confined to such applications but may of course be actively used for objects of controlling the height and inclination of a detection surface from the detection result as well as detection of the surface height and inclination with an accuracy of more than the order of microns in a wide variety of applications.

Another embodiment of the present invention will be specifically explained below.

Figure 49:
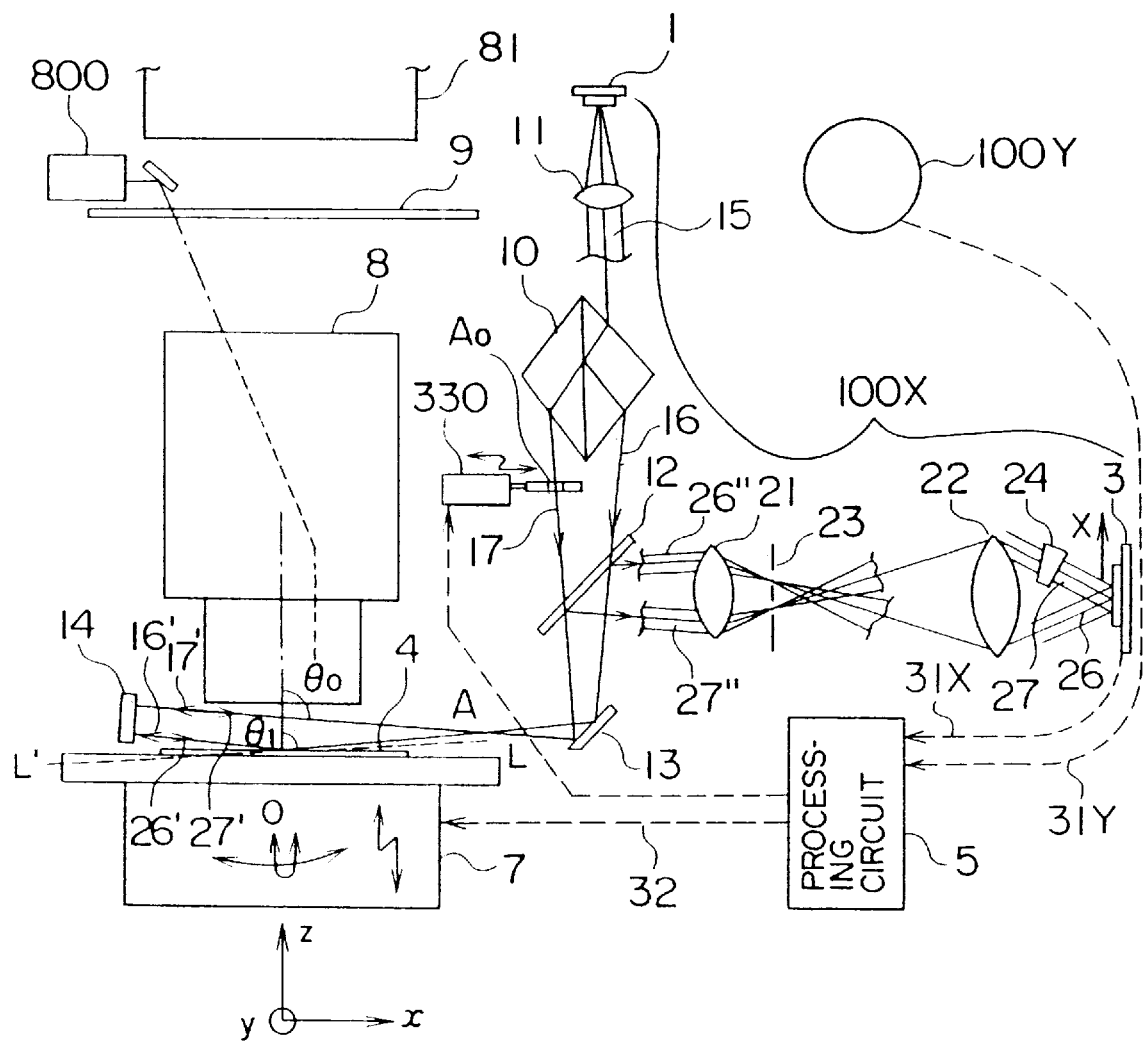
FIG. 49 is a diagram showing a configuration according to an embodiment of the present invention.

FIG. 49 shows an embodiment of the present invention. In this embodiment, the means for detecting the inclination and height according to the present invention is applied to an exposure chip of a semiconductor exposure apparatus. Numeral 9 designates a reticle with a pattern plate plotted thereon as used for exposing a circuit pattern on the wafer 4. This reticle 9 is irradiated with the g or i ray emitted from a mercury lamp (not shown) or far ultraviolet rays emitted from an eximer laser source in the exposure illumination system 81. The light transmitted through the reticle is transmitted through the compression lens 8, whereby an image of the reticle is projected on the surface of resist coated on the wafer 4 fixed on the wafer stage 7. According as the pattern plotted on the.wafer 4 is thinned to the order of submicrons, half microns and further to about 0.3 µm, the depth of focus becomes shallower. When the line width is reduced below 0.5 µm, the product yield would be decreased unless the inclination and height are detected and controlled to the accuracy of less than $\pm 10^{-5}$ rad and ±0.1 µm respectively. In FIG. 49, numeral 100X designates a detection system for determining the horizontality in x direction of the resist surface on the wafer, that is, the height and the inclination with the revolutions around the y axis and the height. A similar detection system 100Y provided for detecting the horizontally along y direction is not shown in FIG. 49. Numeral 1 designates a semiconductor laser or a light source having a high directivity such as a gas laser. The light emitted from this light source is divided into two parts by the beam splitter 10 in a substantially parallel form with a desired expansion. Of the beams thus produced, the one designated by 16 is irradiated on the resist surface of the wafer 4 in S poalrization mode at an incident angle of 85 degree or more to the line perpendicular thereto through the beam splitter 12 and the mirror 13. Although the resist is transparent to this irradiated light, 90% or more of the light is directly reflected without entering the resist and thus enters the return mirror 14 in substantially perpendicular direction due to a large incident angle and the S polarization involved. The light beam 26' thus returned proceeds along the same way as before reflection but in reverse direction, and thus provides the light beam 26" reflected on the beam splitter and proceeding to the detection light path. The other beam 17 separated by the beam splitter 10, on the other hand, is used as a reference light beam. The beam 17 is turned on and off at the desired timings by the shutter (masking means) 330. When the shutter 330 turns on, the reference beam is passed through the beam splitter 12 and the mirror 13 and directly enters the return mirror 14 from the direction perpendicular thereto. The beam 27' thus returned proceeds along the same lgiht path as before reflection but in the reverse way, and thus makes up a light beam 27" reflected on the beam splitter 12 and proceeding toward the detection light path. The above-mentioned two beams 26" and 27" proceeding toward the detection light path are passed through the lenses 21, 22 and the mask plate 23 having a noise-removing pinhole or a minute rectangular opening, and are superposed on each other in substantially parallel fashion. The array sensor has thereon generated an interference fringe as shown by solid line in FIGS. 50 and 51 and the intensity distribution thereof Ix detected thereby. If the parallelism of the wafer 4 would be inferior or the wafer warp as it goes through various processes, the step-and-repeat exposure of the wafer 4 in a single or a plurality of chips would cause the image-forming surface of the compression lens to come to fail to register with the resist surface in inclination or height. In accordance with the detected information of the array sensor 3, therefore, the inclination and height are detected in the processing circuit 5 by the method mentioned below, and by use of this information, the stage control mechanism (such as a piezo or mechanical inching mechanism) installed on the wafer stage 7 is controlled to bring the image into registry with the resist surface for exposure. In FIG. 49, numeral 800 designates an alignment system used for the superposed exposure.

FIGS. 50 and 51 show signals detected by the array sensor 3 in the embodiment of FIG. 49. The signal Ix indicated by solid line in each diagram represents the inclination and height under the optimum exposure. According as the wafer 4 is tilted away from the optimum exposure condition, a striped pitch as shown by dotted line in FIG. 50 changes from P to P'. When the deviation is along height of the wafer from the optimum exposure state, on the other hand, the phase φz undergoes a change as shown by dotted line in FIG. 51. The pitch P and phase φz of the interference fringe caused with the change in inclination and height are given below after substituting n=2 and cos $\alpha_1 \approx 1$ in equation (17).

$$P \simeq \frac{\lambda}{2\sin\alpha_1 + (4\Delta\theta/m)} \quad (40)$$

$$\phi z( = \phi(Z)) \simeq \frac{8\pi\cos\theta}{\lambda}\Delta z + \phi s \quad (41)$$

where $\theta_1$ is the incident angle to the wafer, and φs the initial constant of the phase.

Figure 52:
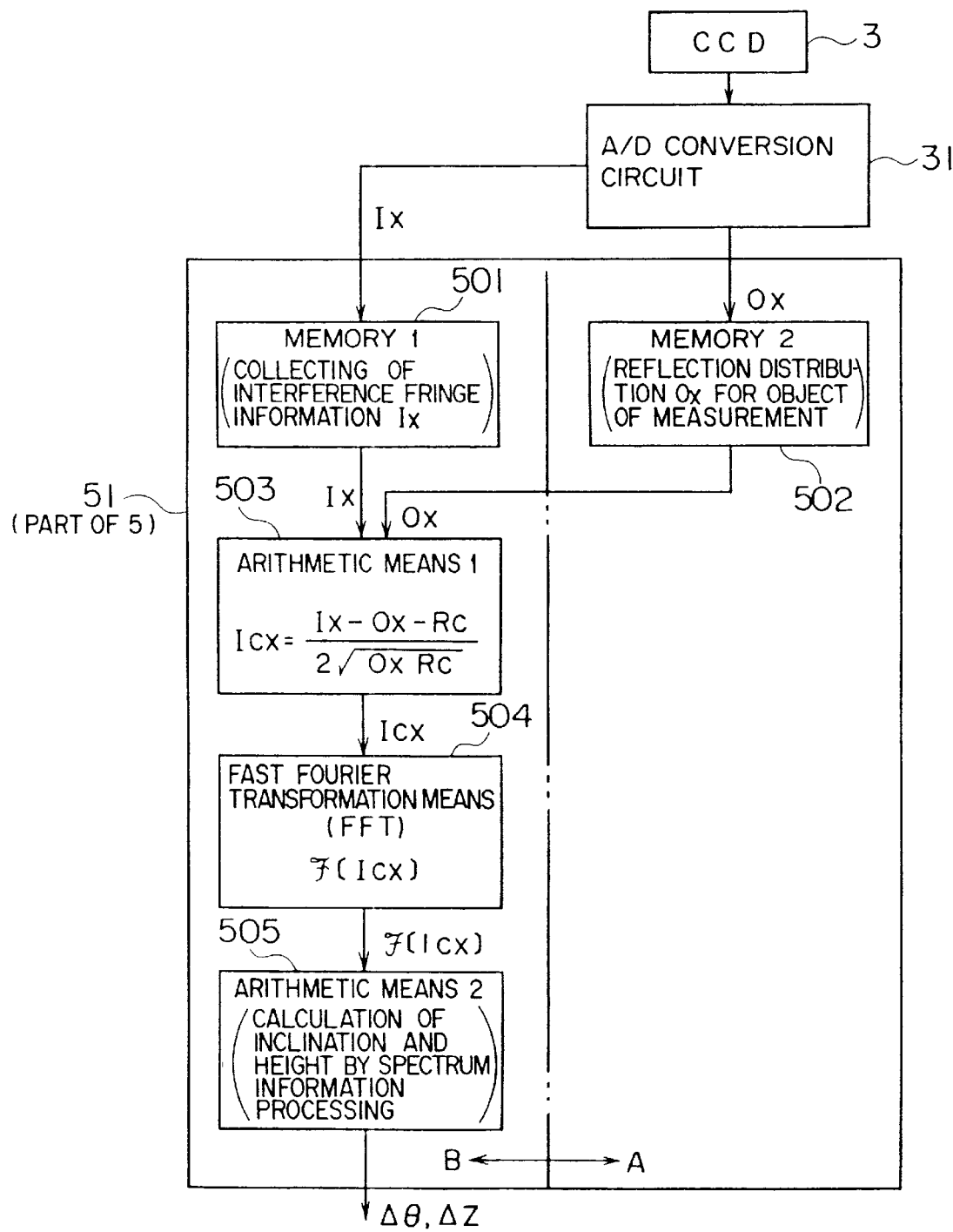
FIG. 52 is a diagram schematically showing a configuration of a part of the processing circuit of FIG. 49.
Figure 53:
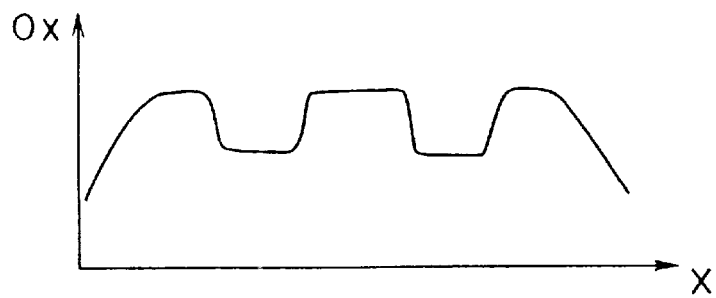
Figure 54:
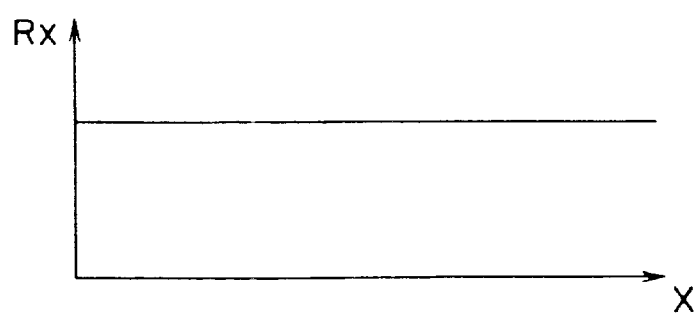
Figure 55:
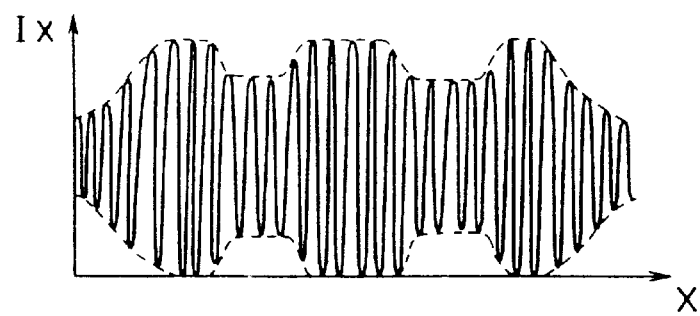
Figure 56:
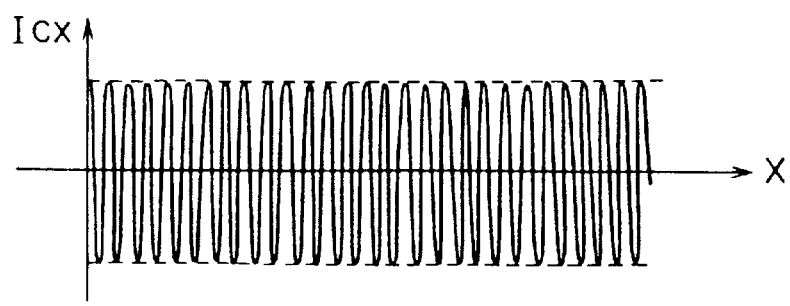

FIG. 52 shows a part 51 of the processing circuit 5 in FIG. 49 according to an embodiment of the present invention. The digital information on the interference fringe-detected by the array sensor 3 in FIG. 49 and A/D converted by the A/D conversion circuit 31 is temporarily stored in the memory 1 of the part 501 in FIG. 52. Prior to the detection of an interference fringe, the wafer 4 is delivered onto the stage 7, and before exposure, the shutter (masking means) 330 in FIG. 49 is closed, so that the reference light 17 is shut out to detect only the reflected light 26 from the wafer 4 by the array sensor 3. This signal Ox, as in the detection of an interference fringe, is subjected to a/D conversion in the A/D conversion circuit 31 and is stored in the memory 2 of the device 502 shown in FIG. 52 in the form of digital information. As described above, if the surface of the resist on the wafer is as rough as shown by an enlarged view of FIG. 58, those portions of the light that have entered at an incident angle of $\theta_1$ (more than 85 degree, say, 88 degree) which contribute to the regularly reflected light make up an uppermost surface of the projected portions, and therefore the beams hatched in the enlarged view of FIG. 58 provide the regularly reflected light. If the area of the uppermost portions of the projections is reduced, the image formed on the array sensor 3 by the light reflected from this rough structure is darkened. The image formed on the array sensor 3 of the projections with small roughness or corresponding to the large-area portions of the uppermost surfaces of the projections, on the other hand, is brightened. As a result, as shown in FIG. 53, the image Ox of the reflected light from the wafer 4 is formed on the array sensor 3. As described above, by closing the shutter 330 in FIG. 49, this Ox is capable of being detected and the resultant information is stored in the part 502 of the memory 2. If the interference fringe is detected by the array sensor 3 before exposure in the process of feeding the wafer 4 by step and repeat, the interference fringe Ix as shown in FIG. 55 may be detected and stored at 501 of the memory 1 in FIG. 52, as far as the distribution of the reference light 17 is uniform as shown in FIG. 54. These two pieces of information Ix and Ox are taken out of the memories 501 and 502 and processed in the manner mentioned below in the part 504 of the arithmetic means 1 thereby to produce the corrected interference waveform Ics.

$$Ics = \frac{Ix - Ox - Rc}{2\sqrt{OxRc}} \quad (42)$$

where the intensity of the reference light is assumed to remain at a substantially constant value Rc. The value Icx thus obtained has already a very small component other than the basic frequency as shown in FIG. 56. As a result, the signal |F[Icx]| obtained by fast Fourier transformation (FFT) by the fast Fourier transformation means 504, as shown by solid line in FIG. 57, assuems a pure spectrum of a basic frequency as compared with the FFT signal |F[Ix]| obtained before correction. This spectrum information may be used to produce the information (Δθ, ΔZ) on inclination and height very accurately by 505 of the arithmetic means 2 in the processing circuit 5 by the method described below.

Figure 61:
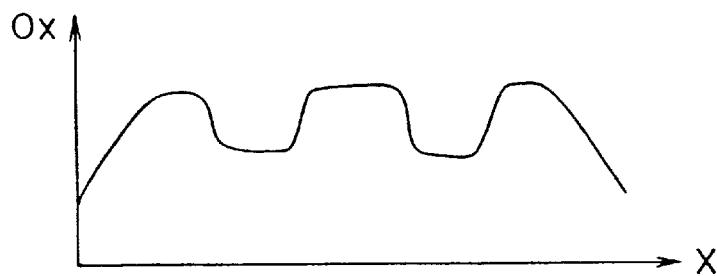
FIG. 61, FIG. 62, FIG. 63 and FIG. 64 are diagrams showing the effect of the present invention respectively.
Figure 62:
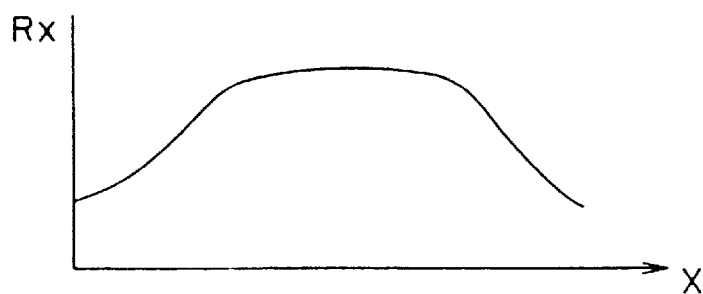
Figure 63:
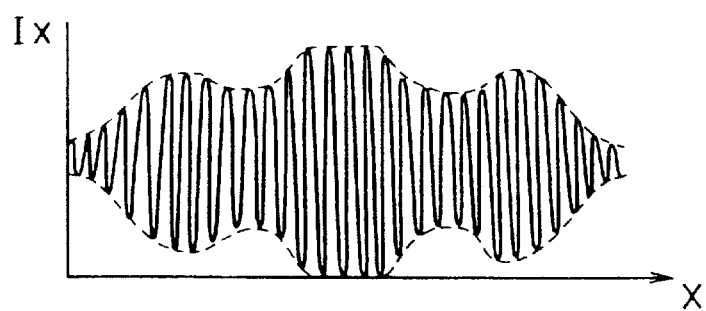

FIG. 60 shows an embodiment of the present invention. The reference numerals identical to those in FIG. 49 designate corresponding component parts respectively in FIG. 49. In FIG. 60, the laser light irradiated in light fluxes substantially parallel to a transmission-type grating 18 is separated into the light 16' irradiated on the wafer 4 and the reference light 17'. Each light beam is masked by a light shutter 330'. Specifically, as long as the shutter 330' is at the position shown in FIG. 60, an interference fringe is detected by the array sensor 3. With the movement of the shutter 330' rightward and the opening $A_O$ being superimposed on the position of $A_R$ in FIG. 60, however, the wafer illumination light 16' is shut off and only the reference light 7' is detected by the array sensor 3. Upon detection of the reference light 17', the signal Rx having somewhat rough distribution shown in FIG. 62 is detected. When the shutter 330' moves leftward with the opening $A_R$ superimposed on the position of $A_O$ in FIG. 60, in contrast, the reference light 17' is masked so that only the light reflected from the wafer is detected by the array sensor 3. This light reflected from the wafer has a distribution Ox as shown in FIG. 61 like in the embodiment of FIG. 49. These distributions Rx and Ox are stored in the 502' of the memory 2' and the 502 of the memory 2 of the inclination/height detection circuit 51' as an output of the A/D conversion circuit 31. By using the information Rx and Ox stored in the 502' of the memory 2' and the 502 of the memory 2 before exposure, the part 503' of the arithmetic means 1' performs the operation shown below by step and repeat procedure before exposure. Ix is stored in 501 of the memory 1 in the same manner as shown in FIG. 52.

$$Icx = \frac{Ix - Ox - Rx}{2\sqrt{OxRx}} \quad (43)$$

Figure 64:
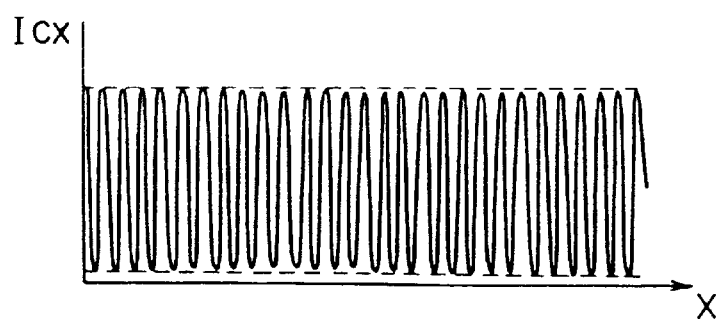

This Icx is compared with the interference detection waveform Ix (stored in the 501 of the memory 1) shown in FIG. 61. Since the fundamental frequency component is principal as shown in FIG. 64, the inclination and height (Δθ, ΔZ) are capable of being accurately determined by the 505 of the arithmetic means 2' and the fast fourier transformation means 504 from the signal Icx as described above. According to the present embodiment, as comapred with the embodiment of FIG. 49, accurate detection is possible even if there remain some irregularities of the distribution of the reference light 17'. It is, therefore, possible to eliminate the optical system components such as the pinhole which otherwise might be needed to secure a uniform distribution of the reference light 17' on the one hand, and the utility rate of the light is improved to such an extent as to permit detection with a light source of a small output on the other hand.

Figure 65:
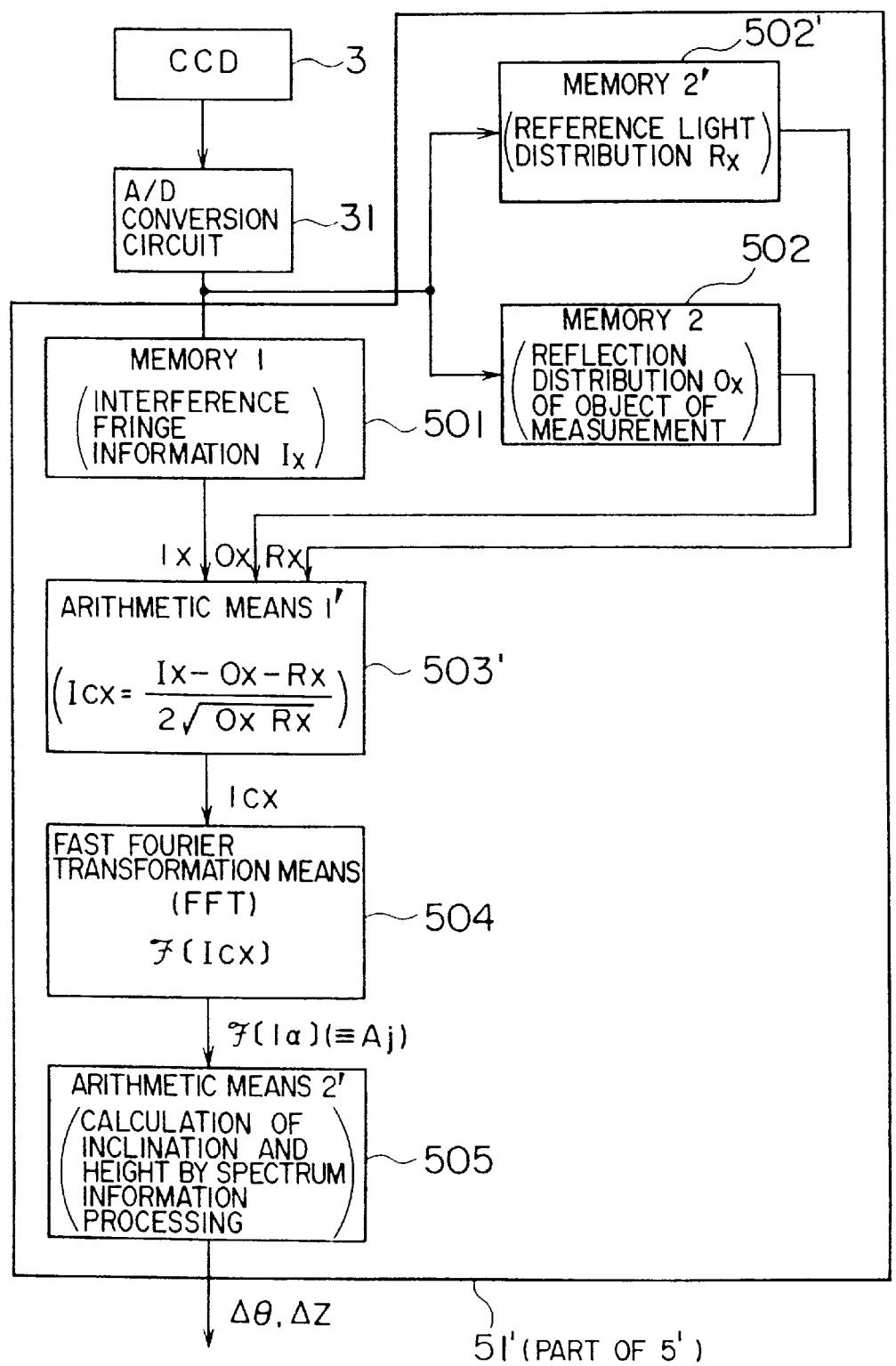
FIG. 65 is a diagram schematically showing a configuration of a part of the processing circuit of FIG. 60.

FIG. 66 is a diagram showing a specific configuration of the component part 505 of the high-accuracy calculation means 2' for determining the pitch (inclination) and phase (height) of the interference fringe by spectral information processing shown in FIGS. 52 and 65. The signal Ixc detected and corrected contains substantially no other components than the fundamental frequency, and therefore the pitch and phase can be determined accurately by the arithmetic operation mentioned below. In the equation below, Ixc is a real number which is subjected to complex Fourier transformation by the complex Fourier transformation means 504 to produce F[I] in the equation below.

$$F[I] = \sum_{k=0}^{N-1} Ixc(k) \exp \frac{i2\pi kj}{N} \tag{44}$$

If this spectrum is designated by Aj, the absolute value |Aj| has a sharp peak at a vectorial position j=jo corresponding to the fundamental frequency component. The pitch P and the phase $\phi z$ are accurately determined by the method mentioned below from the values $A_{jo+1}$, $A_{jo-1}$ at the positions jo+1, jo-1 and the spectrum Aj discretely obtained by calculation at the step 5051. The values of the complex numbers of $A_{jo}$, $A_{jo+1}$, $A_{jo-1}$ are rewritten into imaginary and real numbers as shown below.

$$A_{jo} = Ro + iIo \tag{45}$$

$$A_{jo+1} = R_+ + iI_+ \tag{46}$$

$$A_{jo-1} = R_- + iI_- \tag{47}$$

The value shown below (the inner product of the complex vector) is determined by the inner product calculation step 5052 from the values obtained by the FFT process above.

$$So = Ro^2 + Io^2 (= (\vec{A}_{jo} \cdot \vec{A}_{jo})) \tag{48}$$

$$S_+ = R_o R_+ + I_o I_+ (= (\vec{A}_{jo} \cdot \vec{A}_{jo+1})) \tag{49}$$

$$S_- = R_o R_- + I_o I_- (= (\vec{A}_{jo} \cdot \vec{A}_{jo-1})) \tag{50}$$

The value $\Delta$ below is determined by use of these values.

$$\Delta = \frac{S_+ - S_-}{S_+ - 2S_o + S_-}$$

Using the value $\Delta$ obtained this way, the true spectrum peak $j_R$ is determined by the equation below from the true peak position step 5055.

$$j_R = j_o + \Delta$$

Then, using the value $\Delta$ obtained above, the phase value $\phi z$ as at the true peak position is determined from the equation below by the step 5056.

$$\phi z = \phi jo + \pi \Delta N - \frac{1}{N} \tag{52}$$

where $\phi jo$ is obtained from equation (45) and satisfies the equation below.

$$\exp i\phi jo = (Ro + iIo) / \sqrt{R_o^2 + I_o^2} \tag{53}$$

Using the value $\Delta$ given by equation (51), the phase $\phi z$ at the true peak position is obtained from equation (52).

In the same manner as obtained by equation (18), the pitch P of the interference fringe as related to the number n of reflections on the object of measurement (wafer 4) is determined from the equation (17) as shown below.

$$P = \frac{\lambda}{2\sin\alpha_1 + (2n/m)\Delta\theta} \tag{54}$$

(Equation (40) represents the case where n=2)

On the other hand, the pitch P (the number of sampling points in realnumber per pitch of the interference signal applied as an input for FFT) is given by $$P = N/j_R \tag{55}$$

and therefore, from equations (54) and (51)

$$\Delta\theta = C_0 \times (j_R - j_S)/n \tag{56}$$

where $C_0 = \lambda m/(2N)$ (Constant) $j_S = 2N \sin \alpha_1/\lambda$ (Constant)

The stage inclination control amount $\Delta\theta$ is thus determined by the stage inclination control amount calculation step 5057. This value $\Delta\theta$ provides a stage inclination control amount.

From the phase value $\phi z$ at the true peak position, on the other hand, the equation below is obtained in the same manner as when the equation (41) is obtained using the initial constant of phase (the phase associated with $\Delta Z = 0$, that is, at the initial coincident focal point).

$$\Delta Z = \lambda(\phi z - \phi s)/(4n\pi \cos \theta_1)$$

Therefore, (n=2 in equation (41))

$$\Delta Z = Cz(\phi z - \phi s)/n$$

where $Cz = \lambda/(4\pi \cos \theta_1)$ (Constant) The vertical stage control amount $\Delta Z$ is determined by the vertical stage control amount calculation step 5058. This value $\Delta Z$ provides a stage height control amount. As described above, as in the detection along x axis at 100X, the stage inclination control amount $\Delta\theta$ and the stage height control amount $\Delta Z$ are determined by 100Y along $\gamma$ axis. The values $\Delta\theta$ and $\Delta Z$ along x and $\gamma$ axes are assumed to be $\Delta\theta x$, $\Delta Zx$, $\Delta\theta y$, $\Delta Zy$ respectively. As to $\Delta Z$, two values are available, and only one of them is used, or by using the average value $\Delta Z = (\Delta Zx + \Delta Zy)/2$, the two directions perpendicular to the optical axis and the direction along the optical axis of the wafer stage 7 are controlled by the three values $\Delta\theta x$, $\Delta\theta y$, $\Delta Z$ (or $\Delta Zx$ or $\Delta Zy$). It is thus possible for the focal plane of the exposure optical system (with constant inclination and height) to coincide with the surface of the wafer 4, thereby making it possible to expose the circuit pattern formed on the reticle 9 on the wafer 4 as a circuit pattern high in resolution by the compression exposure lens 8. In addition, this calculation for detection is possible at high speed (in the order of several ms), and therefore, if the calculation is effected each time the chip is fed in step on the wafer 4 for exposure, the whole wafer surface is exposed with high resolution and high throughput at the same time.

Although the embodiment mentioned above uses the Fourier transformation as a method of determining the pitch and inclination from a corrected interference fringe, the invention is not limited to Fourier transformation, but it is possible as an alternative to determine the pitch and inclination by a method of determining the pitch and phase from the position cut away at the center of amplitude of a sinusoidal wave. Also, the method of detecting the inclination and height according to the present invention is not confined to the semiconductor exposure apparatus described above, but is applicable with especially great effect to the case in which the distribution of the light reflected from the object of detection is irregular.

Figure 67:
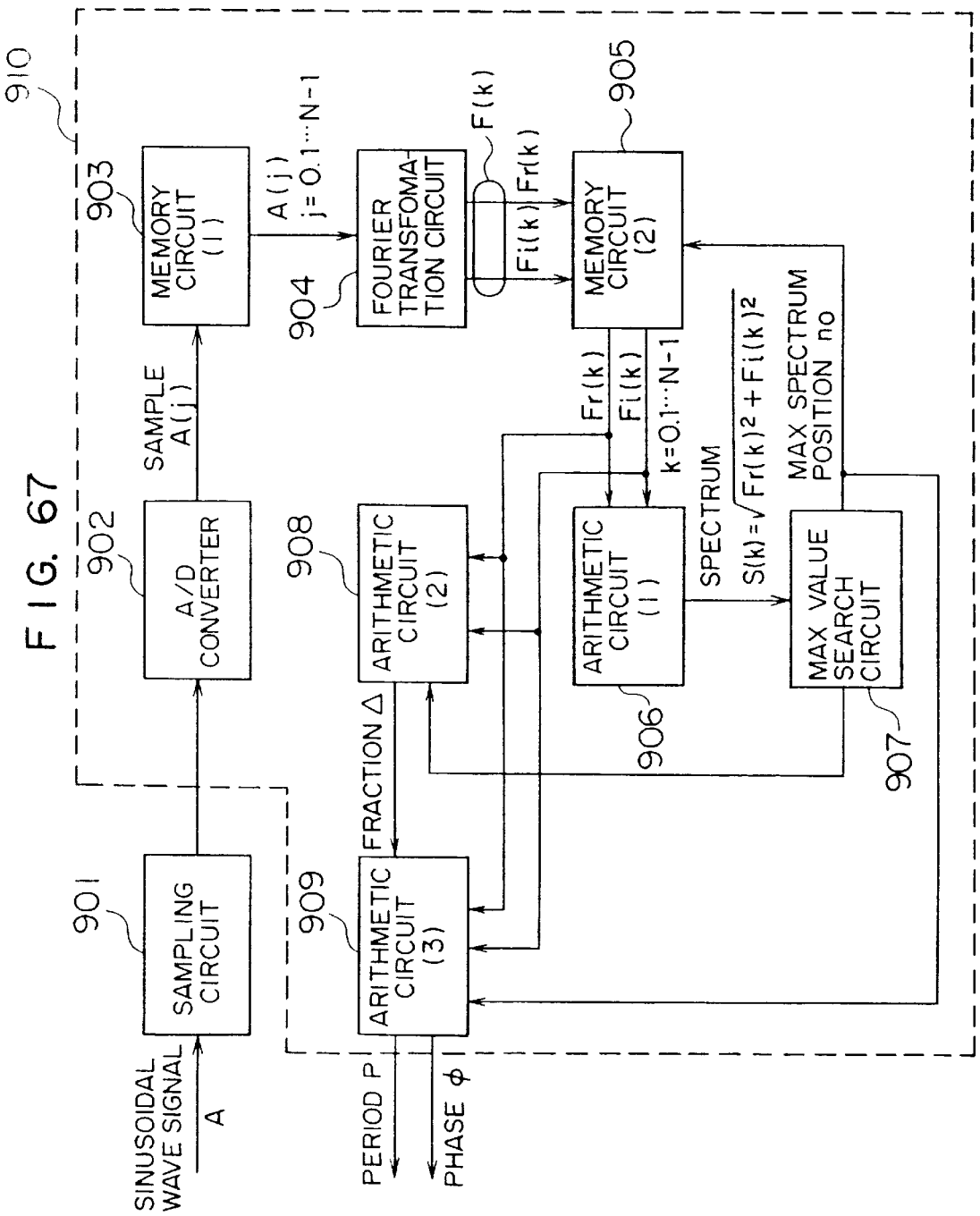
FIG. 67 is a block diagram showing a method and an apparatus for detecting the period and phase of a sinusoidal wave according to an embodiment of the present invention.

Another embodiment of the present invention will be explained with reference to FIGS. 67 and 68. In FIG. 67, numeral 901 designates a sampling circuit for sampling the sinusoidal wave signal A, numeral 902 an A/D converter for A/D converting the signal sampled, numeral 903 a first memory circuit for storing the sample data A(j) subjected to A/D conversion, numeral 904 a Fourier transformation circuit for executing the discrete Fourier transformation by producing the sample data A(j) (j=0, 1, . . . , N-1) stored, numeral 905 a second memory circuit for storing the real number section Fr(k) and the imaginary number section Fi(k) of the Fourier transformation vector F(k), numeral 906 a first arithmetic circuit (1) for calculating the spectrum height S(k) from the real number section Fr(k) and the imaginary number section Fi(k) of the Fourier transformation vector F(k) stored, and numeral 907 a maximum value search circuit for determining the position no of the maximum spectrum associated with the maximum value of the spectrum calculated and shown below.

$$S(k) = \sqrt{(Fr(k))^2 + (Fi(k))^2}$$

Numeral 908 designates a second arithmetic circuit for calculating the fraction $\Delta$ in the position $n_0+\Delta$ of the virtual maximum spectrum, numeral 909 a third arithmetic circuit (3) for determining and producing the period P and phase $\phi$ of the sinusoidal wave signal A from the real number section Fr(k) and the imaginary number section Fi(k) of the Fourier transformation vector F(k) and the fraction $\Delta$, and numeral 910 a general block group including blocks 902 to 909 except for the sampling circuit 901.

Now, the operation of the circuit shown in FIG. 67 will be explained. The sinusoidal wave signal A applied as an input is sampled at the sampling circuit 901 and applied to the A/D converter 902 for conversion into a sample data A(j). Assuming that the period (number of samples per period) of the sinusoidal wave signal A is P and the phase thereof $\phi$, the sample data A(j) is indicated by the equation (25) shown above.

$$A(j) = a + b\cos\left(\frac{2\pi}{P}j + \phi\right) \quad (25)$$
$$(j = 0, 1, 2, \ldots, N-1)$$

where j is the sampling number, and A(j) with j as a time axis represents the sampled data in time series. All the sampled data A(j) are stored in the first memory circuit (1)903. In the next step, the Fourier transformation circuit 904 obtains the sample data A(j) from the memory circuit 903 and executes the discrete Fourier transformation according to the equation (20) described above.

$$F(k) = \sum_{j=0}^{N-1} A(j)\exp\cdot(-i2\pi jk/N) \quad (20)$$
$$= \sum_{j=0}^{N-1} A(j)\left(\cos 2\pi \frac{jk}{N} + i\sin 2\pi \frac{jk}{N}\right)$$

The technique of fast Fourier transformation (FFT) is well known as a discrete Fourier transformation. The result F(k) of the discrete Fourier transformation is expressed as a vector consisting of the real number Fr(k) and the imaginary number Fi(k) as shown above in equation (21). The real number section Fr(k) and the imaginary number section Fi(k) of the discrete Fourier transformation vector F(K) are stored in the second memory circuit (2)905.

Figure 71:
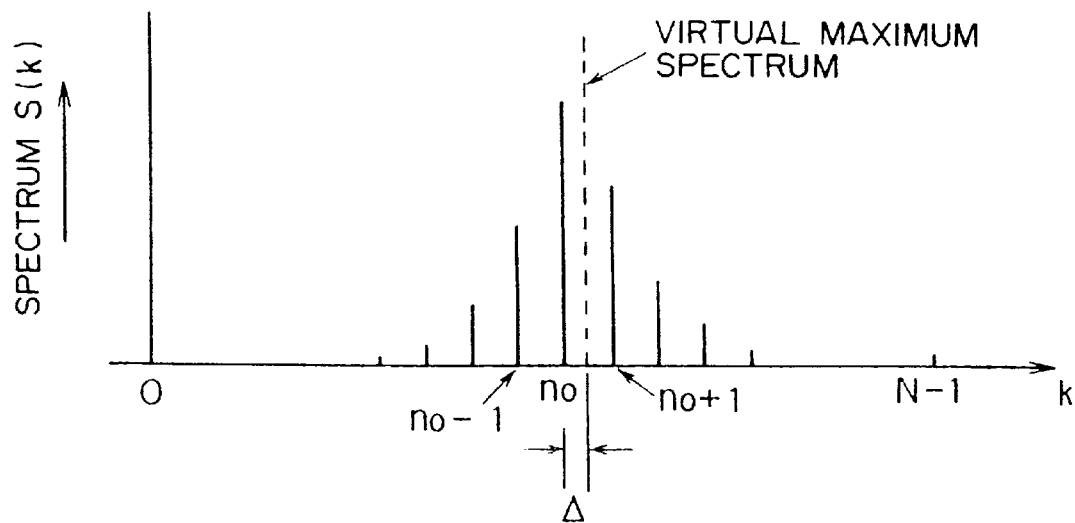
Figure 72:
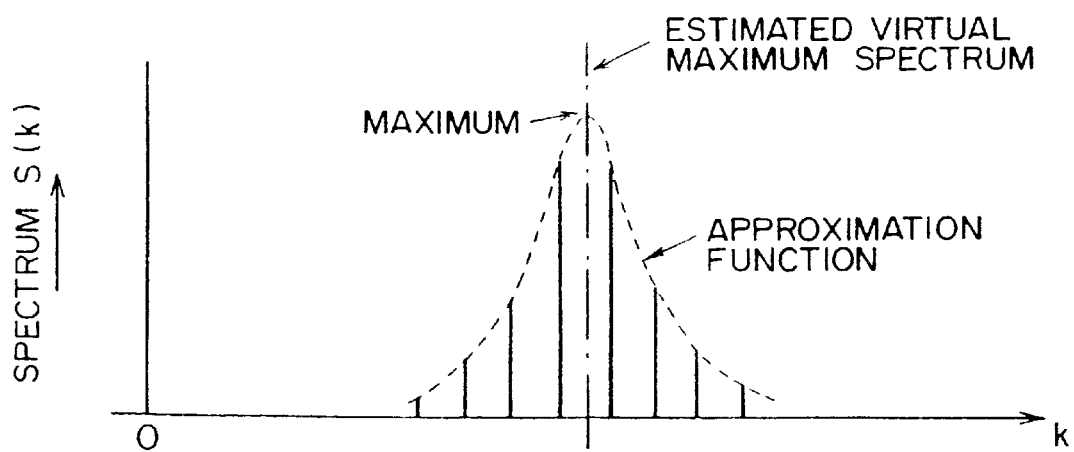
FIG. 72 is a diagram showing another example of spectrum for detecting the position of a virtual maximum spectrum.

In the case of discrete Fourier transformation, the variable k represents the information on the period P, which may be calculated by performing the arithmetic operation of P=N/k in equation (23) mentioned above. Specifically, the spectrum height S(k) is determined by all the variables k from the real number section Fr(k) and the imaginary number section Fi(k) of the Fourier transformation vector F(k), and the period P by equation (23) from the position k (=$n_0$) of the maximum spectrum thereof. The resultant value is the period most approxiamte to P. An example of the condition of this spectrum S(k) is shown in FIG. 71. Since the maximum spectrum is likely to be associated with the position k=0 of the DC component a in equation (25), the position k=$n_0$ of the maximum spectrum is required to be determined for other than k=0.

The first arithmetic circuit (1) 906 is for determining the spectrum S(k) by equation (22) from the real number section Fr(k) and the imaginary number section Fi(k) stored in the memory circuit 905. The maximum value search circuit 907 searches for the maximum value from the spectrum S(k) for other than k=0, and determines and produces the position k=$n_0$ of the maximum spectrum. This search for maximum value is realized by setting a variable k and an address corresponding to each other in the memory circuit 905 having Fr(k) and Fi(k) of the vector F(k) stored therein. The position $n_0$ of the maximum spectrum determined by the maximum value search circuit 907 is applied to the memory circuit 905, whereby the real and imaginary number sections of the next position $n_0$ of the maximum spectrum shown in equation (30) and the positions ($n_0$-1) and ($n_0$+1) adjacent thereto are extruded from the memory 905.

Real number section of F($n_0$-1): Fr($n_0$-1)=R"
Imaginary number section of F($n_0$-1): Fi($n_0$-1)=I"
Real number section of F($n_0$): Fr($n_0$)=R
Imaginary number section of F($n_0$): Fi($n_0$)=I
Real number section of F($n_0$+1): Fr($n_0$+1)=R'
Imaginary number section of F($n_0$+1): Fi($n_0$+1)=I'

The real number sections R", R, R' and the imaginary number sections I", I, I' of the vectors representing the maximum spectrum F($n_0$) and the adjacent spectra F($n_0$-1), F($n_0$+1) are first applied to the second arithmetic circuit (2)908 thereby to calculate the deviation (fraction) $\Delta$ from the maximum spectrum position k=$n_0$ indicated in FIG. 71 as defined in equation (26) above by equation (31) or (32), to the position of the virtual maximum spectrum k=$n_0$+$\Delta$. Once the fraction $\Delta$ is determined, the virtual maximum spectrum position k=$n_0$+$\Delta$ is defined. Therefore, the third arithmetic circuit (3)909 determines the period P of the sinusoidal wave signal A from the equation (30) as described above. Further, the fraction $\Delta$ and the real number sections R", R, R' and the imaginary number sections I", I, I' of the vectors extracted above are used to calculate the equation (35). Thus the phase φ of the sinusoidal wave signal A is determined to produce the period P and the phase φ thereof.

It was explained above that the fraction Δ may be calculated by equation (31) or (32) from the real number sections R", R, R' or imaginary number sections I", I, I' of the Fourier transformation vectors. Since the equations (31) and (32) are derived approximately from the development of the discrete Fourier transformation of the equation (20), however, the fractions Δ determined from these two equations fail to coincide with each other in most cases. If a more accurate fraction Δ is to be determined, therefore, it is recommended that a decision function be incorporated in the arithmetic circuit 909 in order that one of the two fractions Δ determined from equations (31) and (32) by the arithmetic circuit 908 may be selected. An example of the decision function of the arithmetic circuit 909 will be described below. Specifically, two phases φ are determined by the arithmetic circuit 909 from equation (35) in accordance with the two fractions Δ. Once two fractions Δ and two phases φ are thus determined, the vectors of the maximum spectrum and adjacent spectra may be determined by inverse operation using the equation (30), it being understood that the position k=$n_0$ of the maximum spectrum and the number N of samples are known. Equation (30) is an approximate equation and therefore the accuracy thereof is defined by the comparison between the vector extracted from the memory circuit 905 by the output of the maximum value search circuit 907, that is, the vector obtained by actual Fourier transformation and the vector obtained by inverse operation of the equation (30). This comparison may use, for instance, the ratio between the vectors of $F(n_0)$ and $F(n_0+1)$. In this way, the vectors mentioned above determined by actual Fourier transformation are rewritten into Real number section of $F(n_0)$: Rf
Imaginary number section of $F(n_0)$: If
Real number section of $F(n_0+1)$: Rf'
Imaginary number section of $F(n_0+1)$: If'

With reference to these values and R, I, R', I' calculated from equation (11), Dr and Di are calculated as shown below.

$$Dr = \left| \frac{R_f}{R'_f} - \frac{R}{R'} \right|$$

$$Di = \left| \frac{I_f}{I'_f} - \frac{I}{I'} \right|$$

where if Dr<Di, for example, the calculation formula of R", R, R' is higher in accuracy than that of I", I, I' in equation (11). In such a case, therefore, the fraction Δ may be determined by use of equation (31). If Dr<Di, by contrast, the equation (32) should be used to determine the fraction Δ. It is needless to say that either fraction Δ may be used if Dr=Di. Also, instead of the vectors $F(n_0)$, $F(n_0+1)$ for decision, the vectors $F(n_0)$, $F(n_0-1)$ or $F(n_0+1)$, $F(n_0-1)$ may be used for similar decision.

As an alternative to the configuration of the embodiment mentioned above in which the sinusoidal wave signal A is sampled in the sampling circuit 2, this configuration may be replaced with equal effect by a device such as an image sensor or the like system for handling an interference fringe or the like in optical detection means which is capable of producing a sampling signal by itself. Also, the software processing permitting for Fourier transformation, the configuration in the stages including and subsequent to the memory circuit 903 may of course be replaced by the computer.

Figure 68:
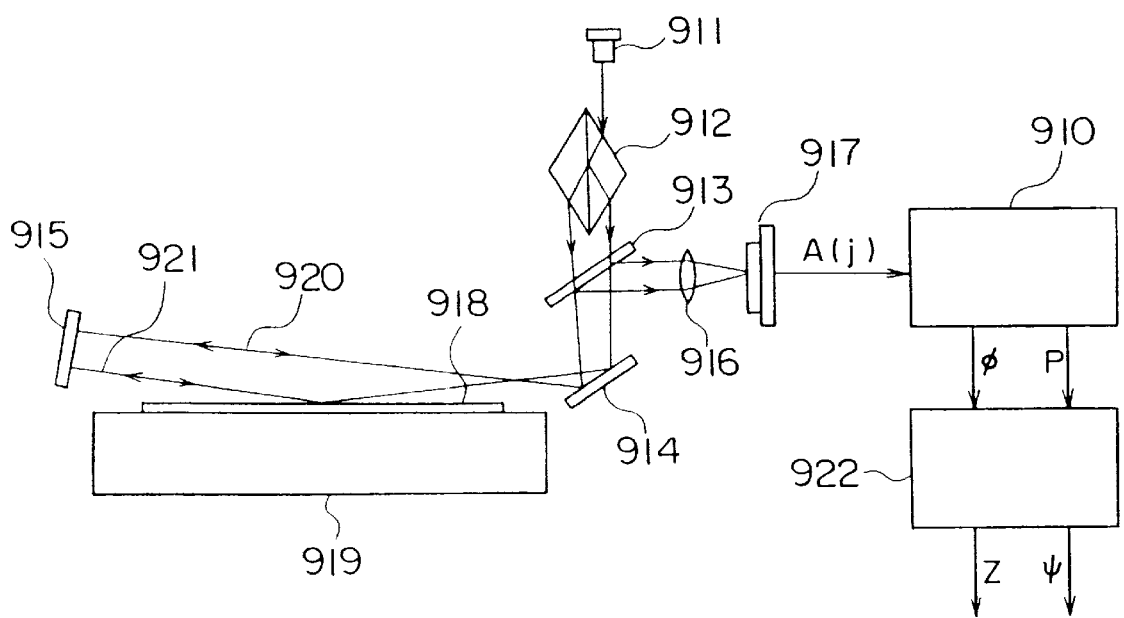
FIG. 68 is a block diagram showing an apparatus for measuring the inclination and height of a surface according to an embodiment using a method and apparatus for detecting the period and phase of a sinusoidal wave according to an embodiment of the present invention.
Figure 69:
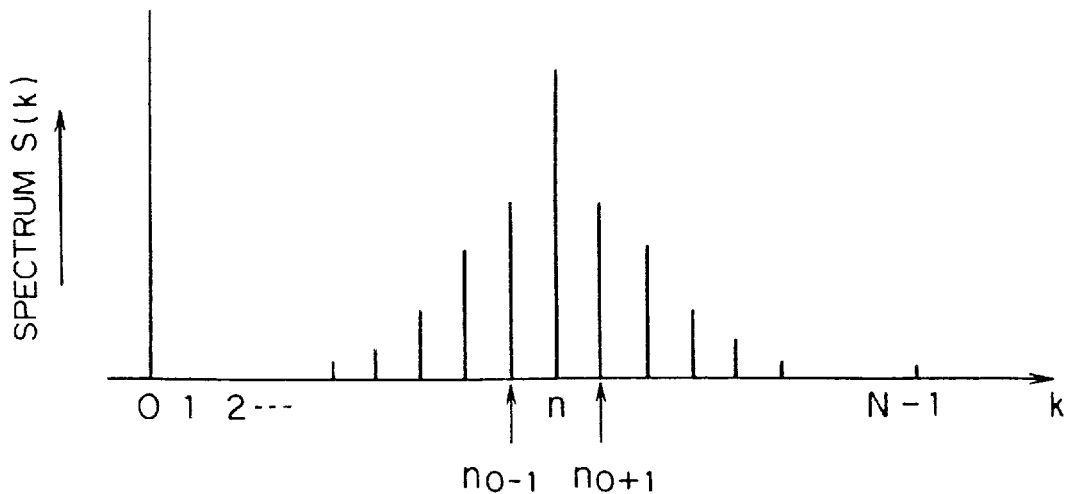
FIG. 69 is a diagram showing an example of spectrum after discrete Fourier transformation of a periodic wave.
Figure 70:
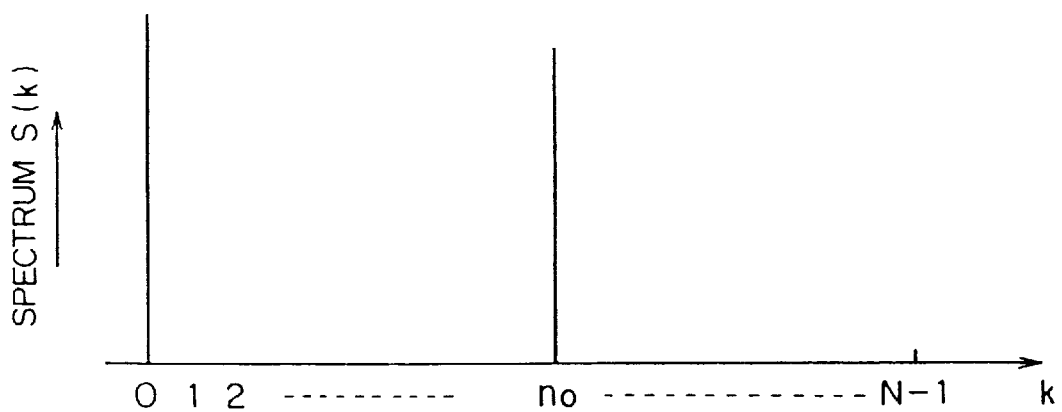
FIG. 70 and FIG. 71 are diagrams showing two examples of spectrum after discrete Fourier transformation of a periodic wave.

FIG. 68 is a block diagram showing an embodiment of the surface inclination and height measuring apparatus using a method and apparatus for detecting the period and phase of a sinusoidal wave according to the present invention. In FIG. 68, numeral 910 designates a block for producing the period P and the phase φ of the same sinusoidal wave as the one designated by the reference numeral 910 in FIG. 67, numeral 911 a light source, numeral 912 a prism, numeral 913 a half mirror, numerals 914, 915 mirrors, numeral 916 a lens, numeral 917 a photo detector for producing a photoelectric conversion output A(j), numeral 918 an object, numeral 919 a rest on which the object is to be placed, numeral 920 a reference beam, numeral 921 a regularly reflected light from the object 918, and numeral 922 an arithmetic circuit for producing information on the inclination ψ, and the height z of the surface of the object 918.

Now, the operation of the circuit shown in FIG. 68 will be explained. A light source having an interference characteristic and directivity like laser is used as the light source 911. The light emitted from the light source 11 is separated into two beams by the prism 912. One of the beams is passed through the half mirror 913 and reflected on the mirror 914 to become a reference light beam. The light reflected on the mirror 915 in substantially the rectangular direction thereto is returned to the mirror 914. The other beam is passed through the half mirror 913 and, after being reflected from the mirror 914, is reflected on the object 918 placed on the rest 919. The light 921 reflected regularly from the object 918 enters the mirror 915 in the direction substantially perpendicular thereto, and after being reflected again on the object 918, returns to the mirror 915. There occurs an interference fringe in the mirror 922 between the reference light 920 and the light 921 reguairly reflected from the object 918. This interference fringe is reflected on the half mirror 913, and has an image thereof formed on the photo detector 917 through the lens 916. A one-dimensional sensor or the like with pixels arranged along the interference fringe may be used as the photo detector 917. In this embodiment, such a one-dimensional sensor is assumed to make up the photo detector 917. The one-dimensional sensor detects the interference fringe and produces an interference fringe signal A(j) as a photoelectric conversion output.

Let θ' be the angle that the incident light entering the object 918 forms with the horizontal surface, ψ the angle of inclination of the surface of the object 918, and z the surface height. The interference fringe detected by the one-dimensional sensor 917 is roughly expressed by the equation below.

$$A(x) = a' + b'\cos\left\{\frac{2\pi(2\sin\theta' + 4\sin\phi)}{\lambda}x + \frac{8\pi z \sin\theta'}{\lambda}\right\} \quad (57)$$

where x is the direction of arrangement of pixels of the one-dimensional sensor 917 and λ the wavelength. As obvious from equation (57), the surface inclination ψ of the object 918 has an effect on the period of the interference fringe A(x) and the surface height z changes the phase. Assuming that the pixel pitch of the one-dimensional sensor 917 is given as L, a discrete interference fringe signal A(j), j=0, ±1, ±2, ±3, . . . so on indicated by the equation below appears as a photoelectric conversion output.

$$A(j) = a' + b'\cos\left\{\frac{2\pi(2\sin\theta' + 4\sin\psi)L}{\lambda}j + \frac{8\pi z \sin\theta'}{\lambda}\right\} \quad (58)$$

where j is a sampling point corresponding to pixels in the one-dimensional sensor 917. Setting the equation (58) in correspondence with the general formula of sinusoidal wave in equation (25), $$\text{Period:} \quad P = \frac{\lambda}{(2\sin\theta' + 4\sin\psi)L} \quad (59)$$

$$\text{Phase:} \quad \phi = \frac{8\pi z \sin\theta'}{\lambda} \quad (60)$$

If the interference fringe signal A(j) in the sampling state of the one-dimensional sensor 917 is applied to the block 917 except for the sampling circuit 901 of the means for detecting the period and phase of a sinusoidal wave shown in FIG. 67, therefore, the information on the period P and the phase φ of the sinusoidal wave shown in equations (59) and (60) are obtained in the output of the block 910. In equations (59) and (60), the angle θ, wavelength λ and the pitch L are known, and therefore the information on the period P and the phase φ of equations (59) and (60) are applied to the arithmetic circuit 922 to calculate the equation below by the arithmetic circuit 922. Then the surface inclination ψ and height z of the object 918 are determined and produced.

$$\psi = \sin^{-1}\frac{1}{4}\left(\frac{\lambda}{LP} - 2\sin\theta'\right) \quad (61)$$

$$z = \frac{\lambda\phi}{8\pi\sin\theta'} \quad (62)$$

As a result, the information on the surface inclination ψ and height z based on the equations (61) and (62) produced from the arithmetic circuit 922, though not shown in FIG. 68, are applied to a servo circuit to drive the rest 919, thus making it possible to correct the surface inclination and height of the object 918.

According to the embodiment described above, the period and phase of a sinusoidal wave are determined with high accuracy, and by use of this information, the accurate information on the surface inclination and height are obtained from an optical interference fringe. With the size of the LSI pattern ever decreasing, the demand is growing high for the depth of focus due to exposure of a higher resolution to be reduced to less than ±1 μm. In view of this, the apparatus shown in FIG. 68 is applied to a projection-type exposure apparatus for reduction and projection on a wafer of a circuit pattern formed on a reticle using a reduction projection lens by subjecting the wafer to the step-and-repeat process, so that a high-accuracy information on the inclination and height of a partial surface of the wafer is secured for each exposure unit while at the same time controlling the inclination and height of the wafer on the basis of the particular information thereby to position the wafer surface accurately at the image-forming point (image surface) of the reduction-projection lens for each exposure unit. As a result, a fine circuit pattern may be subjected to the exposure by reduction projection on the wafer with high resolution. In the case where the apparatus shown in FIG. 68 is applied to the exposure apparatus of reduction projection (compression projection) type, the object 918 corresponds to the wafer and the rest 919 to the wafer stage, with a reduction-projection lens located on the wafer. The mechanism for controlling the wafer inclination and height is well known.

INDUSTRIAL APPLICABILITY

As described above, in the method and apparatus for projection exposure according to the present invention, the inclination and height of an object to be exposed having a large exposure area are detected, whereby exposure over the whole exposure area is made possible with high resolution. The present invention is useful for fabrication of a large-area minute element, especially, a large-area semiconductor device (such as a liquid display apparatus or a large-area LSI).

What is claimed is:

1. A method for detecting at least an inclination of an optically multilayered object with respect to a predetermined plane, comprising the steps of:

irradiating light on the optically multilayered object with an incident angle of not less than about 82 degrees;

detecting at least light reflected from the optically multilayered object; and obtaining information of the inclination of the optically multilayered object with respect to the predetermined plane from the detected light;

wherein the irradiated light is a linearly polarized light.

2. A method according to claim 1, wherein the information of the inclination of the optically multilayered object with respect to the predetermined plane is obtained from position information of the detected light on a detector.

3. A method according to claim 1, wherein the light reflected from the optically multilayered object is reflected on a fixed plane mirror disposed at an angle substantially perpendicular to the optically multilayered object and is irradiated again on the optically multilayered object, the step of detecting including taking out only regularly reflected portions of the light reflected from the optically multilayered object as detected light for enabling the obtaining of information of at least of the inclination of the optically multilayered object with respect to the predetermined plane.

4. A method according to claim 1, further comprising the step of obtaining information of the height of the optically multilayered object from the detected light.

5. A method according to claim 1, wherein the linearly polarized irradiated light comprises at least one of an S-polarized and P-polarized light component.

6. A method according to claim 5, wherein the linearly polarized irradiated light comprises an S-polarized light component.

7. A method according to claim 1, wherein the optically multilayered object has fine patterns of less than 0.5 μm in width.

8. An apparatus for detecting at least an inclination of an optically multilayered object with respect to a predetermined plane comprising:

a light source;

irradiation means for irradiating light emitted from the light source on a surface of the optically multilayered object with an incident angle of not less than about 82 degrees;

detecting means for detecting at least light reflected regularly from the optically multilayered object; and means for obtaining information at least of the inclination of the optically multilayered object with respect to the predetermined plane in accordance with an output of the detecting means.

9. An apparatus according to claim 8, wherein the means for obtaining information includes a processing circuit.

10. An apparatus according to claim 8, wherein the means for obtaining information provides information of the height of the optically multilayered object.

11. An apparatus according to claim 8, wherein at least one of the light source and the irradiation means includes at least one of S-polarization means and P-polarization means for at least one of S-polarizing and P-polarizing the light irradiated on the surface of the optically multilayered object.

12. An apparatus according to claim 11, wherein at least one of the light source and the irradiation means includes S-polarization means for S-polarizing the light irradiated on the surface of the optically multilayered object.

13. An apparatus according to claim 8, wherein the optically multilayered object has fine patterns of less than 0.5 µm in width.

14. An apparatus for detecting at least an inclination of an optically multilayered object with respect to a predetermined plane, comprising:

a light source;

irradiation means for irradiating light emitted from the light source onto a surface of the optically multilayered object with an incident angle of not less than 85 degrees;

reflection irradiation means disposed at an angle substantially perpendicular to the optically multilayered object so as to cause light reflected from the optically multilayered object to be again irradiated on the optically multilayered object;

detection means for detecting regularly reflected light of the again irradiated light from the optically multilayered object; and information means including a processing circuit responsive to a signal from the detection means for at least obtaining information of the inclination of the optically multilayered object with respect to the predetermined plane.

15. An apparatus according to claim 14, wherein the information means is responsive to the signal from the detection means for obtaining information of the height of the optically multilayered object.

16. An apparatus according to claim 14, wherein at least one of the light source and the irradiation means includes at least one of S-polarization means and P-polarization means for at least one of S-polarizing and P-polarizing the light irradiated on the surface of the optically multilayered object.

17. An apparatus according to claim 16, wherein at least one of the light source and the irradiation means includes S-polarization means for S-polarizing the light irradiated on the surface of the optically multilayered object.

18. An apparatus according to claim 14, wherein the optically multilayered object has fine patterns of less than 0.5 µm in width.

19. A projection exposure apparatus comprising:

a mask providing an original image;

an illumination optical system for irradiating exposure illumination light onto the mask;

a projection optical system for forming an image of light passed through the mask at an image-forming position on an object of exposure as a mask image;

irradiation means for irradiating other light onto the object of exposure at a selected one of the image-forming position and a position proximate to the image-forming position at an incident angle of at least about 82 degrees;

detection means for detecting light regularly reflected from the object of exposure; and processing means including a processing circuit responsive to a signal from the detection means for obtaining information at least of the inclination of the object of exposure with respect to a predetermined plane.

20. An apparatus according to claim 19, wherein the processing means includes means for obtaining information of the height of the object of exposure.

21. An apparatus according to claim 19, wherein the irradiation means includes at least one S-polarization means and P-polarization means for S-polarizing the other light irradiated onto the object of exposure.

22. An apparatus according to claim 21, wherein the irradiation means includes S-polarization means for S-polarizing the other light irradiated onto the object of exposure.

23. An apparatus according to claim 19, wherein the object of exposure has fine patterns of less than 0.5 µm in width.

* * * * *